(12) United States Patent
Yamazaki et al.

(10) Patent No.: US 6,884,668 B2
(45) Date of Patent: Apr. 26, 2005

(54) SEMICONDUCTOR DEVICE AND MANUFACTURING METHOD THEREFOR

(75) Inventors: Shunpei Yamazaki, Tokyo (JP); Atsuo Isobe, Kanagawa (JP); Tamae Takano, Kanagawa (JP); Hidekazu Miyairi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/370,055

(22) Filed: Feb. 21, 2003

(65) Prior Publication Data

US 2004/0016967 A1 Jan. 29, 2004

(30) Foreign Application Priority Data

Feb. 22, 2002 (JP) ........................................ 2002-046911
Mar. 15, 2002 (JP) ........................................ 2002-072661

(51) Int. Cl.[7] .......................... H01L 21/00; H01L 29/04
(52) U.S. Cl. ........................ 438/166; 438/151; 438/152; 438/157; 438/164; 257/64; 257/66; 257/72
(58) Field of Search .................... 438/149, 151–154, 438/157, 166, 164, 189; 257/64, 66, 72, 347

(56) References Cited

U.S. PATENT DOCUMENTS

| | | | |
|---|---|---|---|
| 5,643,826 | A | 7/1997 | Ohtani et al. |
| 2003/0141505 | A1 | 7/2003 | Isobe et al. |
| 2003/0141521 | A1 | 7/2003 | Isobe et al. |
| 2003/0181043 | A1 | 9/2003 | Tanada et al. |
| 2003/0183854 | A1 | 10/2003 | Kato et al. |
| 2003/0183875 | A1 | 10/2003 | Isobe et al. |
| 2003/0186490 | A1 | 10/2003 | Kato et al. |
| 2003/0209710 | A1 | 11/2003 | Yamazaki et al. |
| 2003/0218169 | A1 * | 11/2003 | Isobe et al. ................... 257/59 |
| 2003/0218170 | A1 | 11/2003 | Yamazaki et al. |
| 2003/0218171 | A1 | 11/2003 | Isobe et al. |
| 2003/0218177 | A1 | 11/2003 | Yamazaki |
| 2003/0219935 | A1 | 11/2003 | Miyairi et al. |
| 2003/0230749 | A1 | 12/2003 | Isobe et al. |
| 2003/0230750 | A1 | 12/2003 | Koyama et al. |
| 2004/0016958 | A1 | 1/2004 | Kato et al. |
| 2004/0026696 | A1 | 2/2004 | Yamazaki et al. |
| 2004/0072411 | A1 | 4/2004 | Azami et al. |

FOREIGN PATENT DOCUMENTS

| | | |
|---|---|---|
| JP | 07-130652 | 5/1995 |
| JP | 08-078329 | 3/1996 |

OTHER PUBLICATIONS

M.W. Geis et al., *Grapho–Epitaxy of Silicon on Fused Silica Using Surface Micropatterns and Laser Crystallization*, J. Vac. Sci. Technol., 16(6), Nov./Dec. 1979, pp. 1640–1643.
M.W. Geis et al., *Crystalline Silicon on Insulators by Graphoepitaxy*, IEEE, 1979, pp. 210–212.

* cited by examiner

*Primary Examiner*—Donghee Kang
(74) *Attorney, Agent, or Firm*—Eric J. Robinson; Robinson Intellectual Property Law Office, P.C.

(57) ABSTRACT

To provide devices relating to a manufacturing method for a semiconductor device using a laser crystallization method, which is capable of reducing a cost involved in a design change, preventing a grain boundary from developing in a channel formation region of a TFT, and preventing a remarkable reduction in mobility of the TFT, a decrease in an ON current, and an increase in an OFF current due to the grain boundary and to a semiconductor device formed by using the manufacturing method. In a semiconductor device according to the present invention, among a plurality of TFTs formed on a base film, some TFTs are electrically connected to form logic elements. The plurality of logic elements are used to form a circuit. The base film has a plurality of projective portions having a rectangular or stripe shape. Island-like semiconductor films included in each of the plurality of TFTs are formed between the plurality of projective portions and also, are crystallized by a laser light scanned in a longitudinal direction of the projective portions.

28 Claims, 42 Drawing Sheets

8002 8001

SEMICONDUCTOR DEVICE AND MANUFACTURING METHOD THEREFOR

BACKGROUND OF THE INVENTION

1. Field of the Invention

The present invention relates to a semiconductor device that uses a crystalline semiconductor film obtained through crystal growth on an insulating surface by using a laser light and uses a field effect transistor, more particularly, a thin film transistor and to a manufacturing method therefor.

2. Description of the Related Art

Conventionally, a semiconductor display device as an example of semiconductor devices has a drive circuit formed on a silicon substrate, which is connected to a pixel portion on a glass substrate via an FPC and the like. However, ICs are connected to the glass substrate on which the pixel portion is formed via the FPC and the like, there arises a problem in that a connected portion is weak against any physical impact. In particular, as the number of pins of the FPC increases, there is growing tendency for the connected portion to exhibit a poor property against the physical impact.

Then, techniques of integrating a drive circuit and a controller of the semiconductor display device with the pixel portion on the same glass substrate (system on glass) have been put into active research and development. The realization of the system on glass makes it possible to avoid the aforementioned problem by reducing the number of pins of the FPC as well as to reduce a size of the semiconductor display device itself.

For example, in a case of an active matrix liquid crystal display device as an example of the semiconductor display devices, a scanning line drive circuit and a signal line drive circuit are formed on the same glass substrate, the scanning line drive circuit being used for sequentially selecting one or more pixels among the plural pixels formed in the pixel portion and the signal line drive circuit being used for inputting signals (video signals) having image information to the selected pixels. This makes it possible to enhance resistance to the physical impact in the liquid crystal display device and to reduce the size of the liquid crystal display device itself.

Further, in recent years, integral formation of the controller, which has been conventionally formed on the silicon substrate, on the glass substrate, is being attempted in addition to the drive circuit. If both of the controller and the drive circuit can be integrally formed on the glass substrate on which the pixel portion is formed, the size of the semiconductor display device can be remarkably reduced and the resistance to the physical impact can be further enhanced.

However, the controller has a function of generating signals for determining timings at which the drive circuit or pixel portion operates, that of processing the video signals within a predetermined standard supplied from an external video source in accordance with specifications of the drive circuit or pixel portion, and the like. Therefore, the controller itself should be designed newly each time the standard and the specification of the semiconductor display device or driving methods therefor change.

For example, in the case where there is a demand for manufacturing various types of trial products while the design for the controller is changed or the design therefor should be changed for each client, when the controller is integrally formed on the glass substrate with the drive circuit and the pixel portion, all masks including those for the pixel portion and the drive circuit must be changed for each case. This makes it difficult to suppress a manufacturing cost of the semiconductor display device.

Particularly in recent years, the semiconductor display devices have been used in display portions of various electronic devices, which accelerates the tendency toward high-mix low-volume production. Therefore, if the controller is integrally formed on the glass substrate, the design change of the controller involves the increase in cost as described above, which is expected to lead to a serious problem.

SUMMARY OF THE INVENTION

The present invention has been made in view of the above-mentioned problems and a first object of the present invention is to provide devices relating to a manufacturing method for a semiconductor device including an application specific semiconductor integrated circuit, which is capable of reducing a cost involved in a design change and to a semiconductor device formed by using the manufacturing method.

Further, for substrates used in semiconductor devices, a glass substrate is regarded as promising in comparison with a single crystal silicon substrate in terms of the cost. A glass substrate is inferior in heat resistance and is easily subjected to thermal deformation. Therefore, in the case where a crystalline TFT is formed on the glass substrate, in order to avoid thermal deformation of the glass substrate, the use of laser annealing for crystallization of a semiconductor film is extremely effective. Laser annealing has characteristics such as remarkable reduction of processing time compared to an annealing method utilizing radiant heating or conductive heating. In addition, a semiconductor or a semiconductor film is selectively and locally heated so that a substrate is scarcely thermally damaged.

Note that the term "laser annealing method" herein indicates a technique of recrystallizing a damaged layer formed on a semiconductor substrate or on a semiconductor film, and a technique of crystallizing a semiconductor film formed on a substrate. This also includes a technique that is applied to leveling or improvement of a surface quality of the semiconductor substrate or the semiconductor film. Applicable laser oscillation apparatuses include: gas laser oscillation apparatuses represented by an excimer laser; and solid laser oscillation apparatuses represented by a YAG laser. It is known that such an apparatus performs laser light irradiation to thereby heat a surface layer of the semiconductor in an extremely short period of time of about several tens of nanoseconds to several tens of microseconds for crystallization.

In general, the crystalline semiconductor films formed by using the laser annealing method are formed of an aggregation of plural crystal grains. The crystal grains develop randomly in position and size thereof. Thus, it is difficult to form the crystalline semiconductor film while designating the position and the size of the crystal grains. As a result, in an active layer formed by patterning the crystalline semiconductor film into an island-like shape, an interface (grain boundary) of the crystal grains may exist.

Note that the term grain boundary, which is also called a crystal grain boundary, refers to one of lattice defects categorized as a plane defect. The plane defect includes not only the grain boundary but also a twin plane, a stacking fault, or the like. In this specification, the plane defects having electrical activity and dangling bonds, i.e., the grain boundary and the stacking fault are collectively called the grain boundary.

Differing from the inside of the crystal grain, the grain boundary includes a number of recombination centers and trapping centers due to an amorphous structure, crystal defect, or the like. When carriers are trapped in the trapping center, a potential of the grain boundary increases, which serves as a barrier against the carriers. As a result, it is known that the carriers are decreased in current transporting characteristics. Thus, for example, in the case where the TFT is formed as a semiconductor device, when the grain boundary exists in the active layer, particularly in a channel formation region, it significantly affects the characteristics of the TFT as follows. That is, mobility of the TFT is remarkably decreased, an ON current is decreased, an OFF current is increased due to the current flowing through the grain boundary, and the like. Also in the plural TFTs manufactured on the assumption that the same characteristics can be obtained, the characteristics may vary depending on whether or not the grain boundary is included in the active layer thereof.

When the laser light is irradiated onto the semiconductor film, the crystal grains are obtained randomly in terms of position and size on the grounds listed below. That is, it takes a certain amount of time for the nucleation of solid phase to develop in the completely melted semiconductor film in a liquid form due to the laser light irradiation. Then, a number of crystal nuclei are generated with time in the completely melted region and crystal growth occurs from each of the crystal nuclei. The crystal nuclei are generated in random positions and thus, distributed in a nonuniform manner. The crystal growth terminates at a position where the crystal grains are abutted against each other, so that the crystal grains develop randomly in position and size.

The transistor used in a drive circuit and a controller is required to operate at high speed. As described above, however, it is difficult to form the single crystal silicon film having no grain boundary by the laser annealing method. The TFT using as the active layer the crystalline semiconductor film crystallized by the laser annealing method, which has characteristics equivalent to those of a MOS transistor formed on the single crystal silicon substrate has not been realized so far.

In view of the above-mentioned problems, a second object of the present invention is to provide a manufacturing method for a semiconductor device using a laser crystallization method, which can prevent a grain boundary from developing in a channel formation region of a TFT and avoid a remarkable reduction in mobility of the TFT due to the grain boundary, a decrease in an ON current, and an increase in an OFF current and to provide a semiconductor device manufactured by using the manufacturing method.

The inventors of the present invention have found that a semiconductor film is formed on an insulating film having unevennesses and irradiated with a laser light, so that in a portion of the crystallized semiconductor film formed above a projective portion of the insulating film, the grain boundaries are selectively formed.

FIGS. 42A and 42B show TEM sectional images in a direction vertical to a scanning direction of the laser light when an amorphous semiconductor film formed on the insulating film having the unevennesses with a thickness of 200 nm is irradiated with a continuous wave laser light such that a scanning rate is set to 5 cm/sec. FIG. 42B schematically shows the TEM sectional image of FIG. 42A. In FIG. 42B, reference numerals 8001 and 8002 denote projective portions formed on the insulating film. Further, a crystallized semiconductor film 8104 has grain boundaries 8103 in the portions on the projective portions 8101 and 8102.

As shown in FIG. 42B, in the portions on the projective portions 8101 and 8102, the grain boundaries 8103 are formed. The inventors of the present invention have considered that the semiconductor film is temporarily melted due to the laser light irradiation, so that the semiconductor film formed on the insulating film moves its volume toward the bottom of the depressive portion. Thus, the semiconductor film formed above the projective portion is thinned and is hardly resistant to the applied stress to thereby cause the grain boundaries. In the semiconductor film thus crystallized, the grain boundaries are selectively formed in the portion on the projective portion, whereas the grain boundaries are hardly formed in the portions formed on the depressive portions (indicated by the dotted line) 8101 and 8102. Note that the depressive portion refers to a recessed region where the projective portion is not formed.

FIG. 26 shows a TEM image of a sample as viewed from above in the case where an amorphous semiconductor film having a thickness of 150 nm formed on the base film having unevennesses is irradiated with the continuous wave laser light having an output energy of 5.5 W along the longitudinal direction of the projective portion such that the scanning rate is set to 50 cm/sec. Also for simplicity in description, FIG. 27 shows schematically the TEM image of FIG. 26.

The width of a projective portion 8001 is 0.5 µm, the width of a depressive portion is 0.5 µm, and the thickness of the projective portion is 250 nm. In FIGS. 26 and 27, the region denoted by reference numeral 8001 of the semiconductor film corresponds to a portion placed above the projective portion and a region denoted by reference numeral 8002 thereof corresponds to a portion placed above the depressive portion. As shown in FIG. 27, a grain boundary 8003 is formed in the semiconductor film above the projective portion 8001.

FIG. 28 shows a TEM image of a sample formed under the same conditions as those of the sample of FIG. 26 after Secco etching in section in a direction vertical to the scanning direction of the laser light. The base film having the unevennesses is formed of three insulating films which are layered as follows: on a first insulating film made of silicon nitride, a stripe-shaped second insulating film made of silicon oxide is formed and a third insulating film made of silicon oxide is formed so as to cover the first and second insulating films.

Note that Secco etching is performed at room temperature for 75 seconds using an aqueous solution obtained by mixing $K_2Cr_2O_7$ and HF.

As shown in FIG. 28, a grain boundary 8005 generated above the projective portion 8004 is extended by Secco etching and the position thereof is observed more clearly. Note that white portions observed in the projective portions 8004 indicate that the silicon oxide film is etched through the grain boundary of the semiconductor film by Secco etching. Also the laser light irradiation makes the surface of the semiconductor film 8006 leveled.

In view of the above, the inventors of the present invention have considered that the semiconductor film is temporarily melted due to the laser light irradiation, so that the semiconductor film formed above the insulating film moves its volume toward the bottom of the depressive portion. Thus, the semiconductor film formed above the projective portion is reduced in thickness and is incapable of withstanding the stress, which may be a factor of causing the grain boundary above the projective portion.

Also, FIGS. 29A to 29F show simulation results regarding a temperature distribution change with time in the semiconductor film when the semiconductor film formed on the insulating film having unevennesses is irradiated with the laser light. In the graphs, the lower unevennesses indicate a base film 8008 formed of an oxide film. Also an upper line 8009 indicates an interface between the silicon and an air space, which corresponds to a portion irradiated with the laser light. The oxide film and the silicon film both have a thickness of 20 nm and an interval between the projective portion and the depressive portion is 1 μm. Conditions of the laser light irradiation are set as follows: a peak energy density based on Gaussian distribution is 45000 W/cm$^2$; and σ=7×10$^{-5}$ sec.

FIG. 29A shows temperature distribution immediately after the laser light irradiation and the subsequent figures, i.e., FIGS. 29B to 29F each show temperature distribution measured each time 2.5 microseconds elapse.

An intensely colored region is assumed to exhibit the highest temperature. It can be observed that as the state is changed as shown in FIGS. 29A to 29F in this order, the intensely colored portion is made smaller. In particular, as for the temperature of the silicon 8009, it is apparent that as the time elapses, the portion above the depressive portion of the base film 8008 decreases its temperature earlier than the portion above the projective portion does.

FIG. 30 shows simulation results regarding a temperature change with time according to positions of the semiconductor film when the semiconductor film formed on the base film having the unevennesses is irradiated with the laser light.

In the graph of FIG. 30, the axis of ordinate indicates a temperature (K) of the semiconductor film and the axis of abscissa indicates the time (second). The solid line indicates a temperature of the semiconductor film formed above the projective portion and the dashed line indicates a temperature of the semiconductor film formed above the depressive portion. As apparent from the simulation shown in FIG. 30, temperature drop is temporarily stopped in association with phase transition at 1600 K, but after the phase transition, as indicated by the dashed line, the temperature drop in the semiconductor film above the depressive portion starts earlier as compared with the semiconductor film above the projective portion and the phase transition occurs earlier.

Supposedly, this is because after the semiconductor film has been melted by the laser light irradiation, when the heat generated in the semiconductor film is radiated toward the insulating film, the heat radiation is performed efficiently in a larger-area portion contacting the insulating film. Accordingly, the heat radiation toward the insulating film is performed more efficiently in the portion where the surfaces of the semiconductor film and the insulating film which are in contact with each other are leveled than in a portion where they are intersected with each other. Also, the heat radiation is performed more efficiently in a portion with lager heat capacity of the insulating film. For example, the insulating film within a given range has the larger volume and thus larger heat capacity in the vicinity of the depressive portion than in the vicinity of the projective portion. Thus, the released heat hardly fills the portion and the heat radiation is performed efficiently. As a result, the crystal nuclei develop more easily and earlier in the vicinity of the depressive portion than in the vicinity of the projective portion.

Then, as the time elapses, the crystal growth proceeds from the crystal nuclei generated in the vicinity of the depressive portion to the portion above the projective portion. It has been considered that the crystal growth proceeding from the vicinity of the depressive portion encounters that proceeding from the vicinity of the depressive portion adjacent thereto on the projective portion in the vicinity of the midpoint therebetween and this is a factor of causing the grain boundary above the projective portion.

In any case, in such a crystallized semiconductor film, the grain boundary is selectively formed in portion above the projective portion, whereas it is hardly formed in the portion above the depressive portions (regions denoted by the dotted line).

Thus, the inventors of the present invention have considered the following. That is, the portion having relatively less grain boundaries formed on the depressive portion in the semiconductor film crystallized by the laser light is used as the active layer of the TFT and the plural TFTs are laid out on the substrate to design the circuit in the form of ASIC (application specific integrated circuit) to thereby manufacture the semiconductor device.

Specifically, on the insulating film having the unevennesses of a stripe or rectangular shape, the semiconductor film is formed and is irradiated with the continuous wave laser light. Note that the scanning direction of the laser light is not always required to extend along the longitudinal direction of the unevennesses of the insulating film. At this time, the continuous wave laser light is most preferably used, but the pulse wave laser light can be used. Note that the projective portion can take various shapes. For example, the sectional shape of the projective portion in the direction vertical to the scanning direction of the laser light may be rectangle, triangle, or trapezoid. Due to the laser light irradiation, the semiconductor film formed above the projective portion moves its volume toward the portion above the depressive portion, so that the applied stress concentrates on the semiconductor film above the projective portion and the grain boundary is hardly formed in the semiconductor film above the depressive portion.

Next, the portion formed above the projective portion of the base film with poor crystallinity is removed, so that the semiconductor film above the depressive portion with satisfactory crystallinity is used as the active layer to form the plural TFTs. At this time, the semiconductor film above the depressive portion may be partially in contact with the projective portion and may not be in contact therewith.

The semiconductor film formed above the depressive portion is actively used as the active layer of the TFT, which makes it possible to prevent the grain boundary from developing in the channel formation region of the TFT and to avoid the remarkable reduction in the mobility of the TFT, the decrease in the ON current, and the increase in the OFF current due to the grain boundary. In addition, the variation of the characteristics of the TFT can be suppressed.

Also, in the case where the contact holes are formed in the insulating film formed on the semiconductor film on the level base film, if the masks for the contact holes are shifted, the base film formed below the semiconductor film may be etched to thereby cause the electrode formed in contact with the semiconductor film to be cut off in some cases. In the present invention, by forming the semiconductor film, particularly, the portions serving as the source region and the drain region thereof in contact with the projective portion, the base film formed below the semiconductor film is not etched and the projective portion is partially etched. Thus, the wirings coming into contact with the source region or drain region can be prevented from being cut off. As a result, it is, unnecessary to make large the portions serving as the source region and the drain region only for the purpose of forming the contact holes within the active layer. Therefore, the decrease in integration density for ensuring the contacts can be prevented.

Note that in the semiconductor film formed above the depressive portion of the insulating film, the grain boundary is relatively difficult to develop and thus, the semiconductor film has satisfactory crystallinity. However, this does not mean that the semiconductor film does not have any grain boundary at all. Even if the grain boundary exists, as compared with the semiconductor film formed above the projective portion of the insulating film, the following are conceivable: the grain size is large and the crystallinity is relatively superior. Thus, at the stage where the shape of the insulating film is designed, the position in which the grain boundary is formed in the semiconductor film can be expected to some degree. That is, according to the present invention, the position in which the grain boundary is formed can be selectively determined, thereby realizing the layout of the active layers so as to include as less grain boundaries as possible in the active layer, more desirably in the channel formation region.

Note that in the vicinity of the edges of the laser beam of the laser light, the energy density is generally lower than the central portion thereof and thus, the crystallinity is inferior to the central portion in many cases. Therefore, when the laser light is scanned, it is desirable to perform scanning so that the edges of the laser light trajectory do not overlap with the portion serving as the channel formation region of the TFT later.

Thus, the data (pattern information) on a shape of the insulating film or semiconductor film as viewed from above the substrate which is obtained at the stage of design is stored in a storing means. Then, the pattern information and the width in the direction vertical to the scanning direction of the laser beam of the laser light may be used to determine the scanning path of the laser light such that at least the portion serving as the channel formation region of the TFT is not overlapped with the edges of the laser light trajectory. Then, the marker is used as reference to perform positioning on the substrate and the laser light is irradiated to the semiconductor film formed on the substrate according to the scanning path thus determined.

With the above structure, instead of irradiating the laser light to the entire substrate, it is possible to scan the laser light on at least the indispensable portion alone. Accordingly, it is possible to dispense with the time period required for irradiating the laser light to the unnecessary portion and to shorten the time period for the laser light irradiation as well as increase the processing speed of the substrate. Also, the substrate can be prevented from being damaged due to the laser light irradiation onto the unnecessary portion.

Further, the markers for determining the irradiation position of the laser light can be formed by directly etching the substrate using the laser light or the like. Alternatively, the markers may be formed in a part of the insulating film simultaneously with the formation of the insulating film having the unevennesses. Also, the shape of the insulating film or semiconductor film actually formed may be read by using an image pickup element such as a CCD and is stored as data in a first storing means. Then, the pattern information of the insulating film or semiconductor film obtained at the stage of design is stored in a second storing means and the data stored in the first storing means may be collated with the pattern information stored in the second storing means to thereby perform positioning on the substrate.

Also, in general, the energy density of the laser light is not completely uniform and its value varies according to the position in the laser beam. In the present invention, it is necessary to irradiate the laser light with the given energy density to at least the portion serving as the channel formation region, more preferably, to the entire planer surface of the depressive portion. Accordingly, in the present invention, the laser beam with the energy density distribution is required to be used, by which the region with the uniform energy density is completely overlapped with at least the portion serving as the channel formation region, more preferably, the entire planer surface of the depressive portion when the laser light is scanned. In order to satisfy the above conditions of the energy density, it is conceivable that the laser beam desirably takes the rectangular or linear shape or the like.

Further the portion of the laser beam with low energy density may be shielded through the slits. By using the slits, the laser light with the relatively uniform energy density can be irradiated to the entire planer surface of the depressive portion to thereby perform the crystallization uniformly. Also, by providing the slits, the width of the laser beam can be partially changed according to the pattern information of the insulating film or semiconductor film. Thus, the restriction on the layout of the channel formation region and further the active layer of the TFTs can be suppressed. Here, the width of the laser beam refers to the length of the laser light in a direction vertical to the scanning direction.

Also, the laser lights oscillated from the plural laser oscillating apparatuses may be synthesized into one laser beam, which may be used for the laser crystallization. With the above structure, the portions with the low energy density of the laser lights can be complemented.

Further, after the semiconductor film is formed, the laser light irradiation is performed without exposing the film to the atmosphere (for example, in the gas atmosphere using the specified gas such as rare gas, nitrogen, or oxygen, or in a reduced pressure atmosphere), so that the semiconductor film may be crystallized. With the above structure, a pollutant in a clean room at a molecular level, for example, boron etc. included inside the filter for increasing a cleanliness of the air can be prevented from mixing into the semiconductor film upon the crystallization using the laser light.

Also, the plural TFTs are laid out irrespective of the circuit specification. Three terminals of a source, a drain, and a gate which are included in each of the plural TFTs are electrically connected as appropriate through the wirings formed in the layer where the plural TFTs are formed or the layer different therefrom to form the circuit of the desired specification. At this time, it is unnecessary to use all the TFTs formed on the substrate and some TFTs may remain unused according to the circuit specification.

It is necessary to provide the plural TFTs in a number large enough to realize the design of the desired circuit for each size and polarity thereof. As the number of TFTs increases for each size and polarity thereof, the design range becomes wider. Thus, the circuits of various specifications can be manufactured. In contrast, when the number of TFTs increases excessively, the number of TFTs unused in the circuits is also increased, so that it is difficult to reduce the size of the semiconductor display device. Accordingly, the number of TFTs to be formed on the substrate for the circuit, and the size and the polarity thereof may be appropriately set by the designer while taking into account the balance therebetween.

Also, in some of the TFTs, the active layers and the gates are previously connected into one unit (basic cell) and the plural basic cells may be formed. The sources, the drains, and the gates of the TFTs in the basic cell are connected with one another through the wirings to form various logic elements from the basic cell. Thus, the logic elements may be combined to design the desired circuit.

Also, in addition to the above structures, the various logic elements formed by connecting the active layers and the gates in some TFTs are prepared in advance on the substrate. The terminals of the logic elements may be appropriately connected through the wirings formed in the layer where the TFTs included in the logic elements are formed or in the layer different therefrom to form the circuit of the desired specification.

With the above structure, when the circuit specification is changed, only the design of the wirings connecting the previously prepared TFTs or logic elements may be changed. Thus, at least two masks of a mask for patterning the wirings and a mask for contact holes of the wirings may only be changed. Accordingly, the cost involved in the design change of the circuit can be suppressed as well as the circuits of various specifications can be formed.

Also, in the case where although the specifications of a pixel portion and a drive circuit of the semiconductor display device are determined, the specification of the controller corresponding to those of the pixel portion and the drive circuit has not been determined yet, it is possible to previously manufacture portions corresponding to the TFTs or circuit elements except the wirings. Thereafter, according to a specification of a controller ordered from a client, the wirings connecting the TFTs or the circuit elements are designed to be manufactured, so that the controller of the desired specification can be manufactured. Thus, at a stage where the specification of the controller is not determined, it is possible to start manufacturing the semiconductor display device. Therefore, a TAT (turn around time) that is a time period started with the reception of the order from the client and ended with a delivery of the product to the client can be reduced. As a result, the service to the client can be improved.

Note that the present invention is not limited to the designing method for the controller, but is also applicable to designs of the drive circuits including a signal line drive circuit and a scanning line drive circuit and other circuits of various types.

DETAILED DESCRIPTION OF THE PREFERRED EMBODIMENTS

Hereinafter, a manufacturing method for a semiconductor device of the present invention will be described.

Figure 1A:
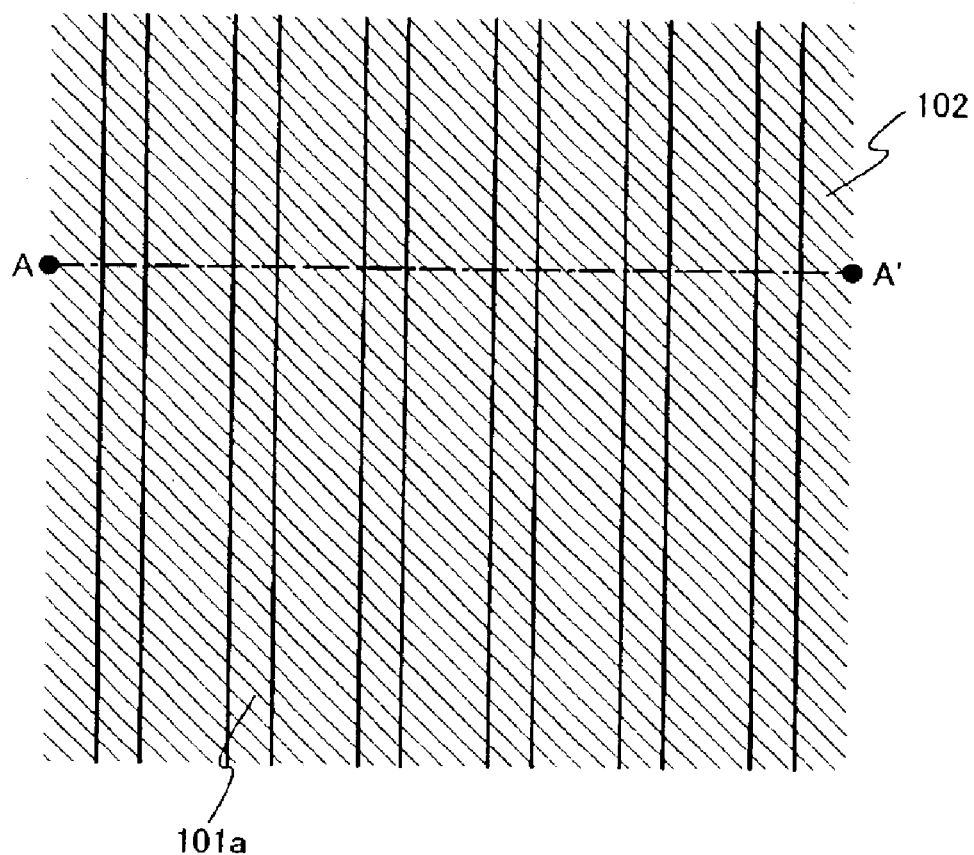
FIGS. 1A and 1B show a manufacturing process of a semiconductor device according to the present invention.
Figure 1B:
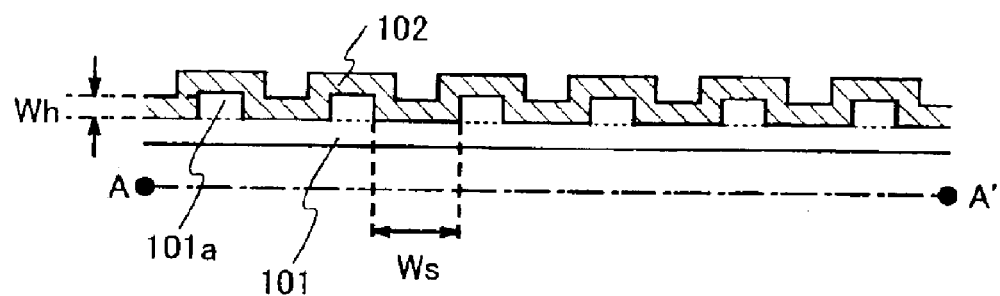
Figure 32A:
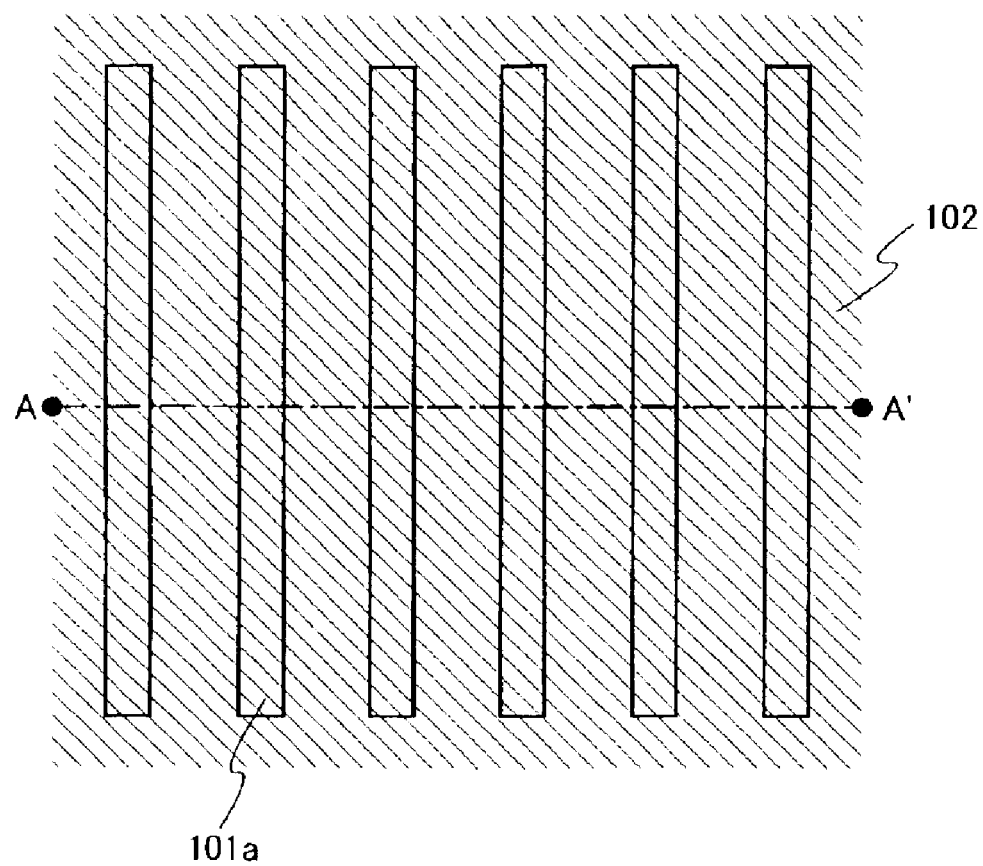
FIGS. 32A and 32B show a manufacturing process of a semiconductor device according to the present invention.
Figure 32B:
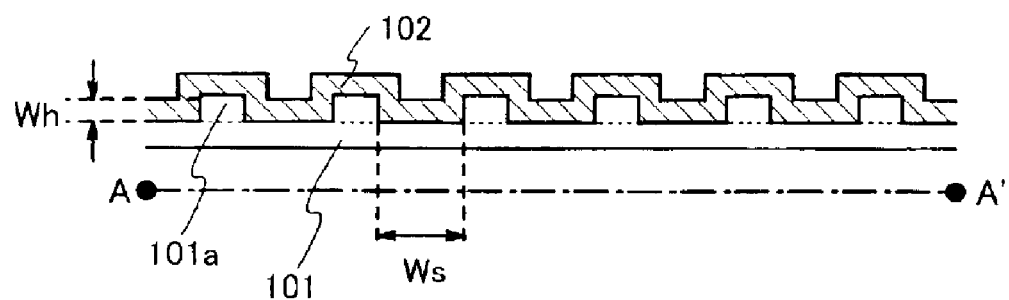

First, as shown in FIG. 1A or FIG. 32A, a base film 101 having projective portions 101a of a rectangular or stripe shape is formed on a substrate. FIG. 1B is a sectional view taken along the line A–A' of FIG. 1A. FIG. 32B is a sectional view taken along the line A–A' of FIG. 32A.

The substrate (not shown) may be made of any material as long as it has a heat resistance to a processing temperature in subsequent steps. For example, a quartz substrate, a silicon substrate, a glass substrate such as barium borosilicate grass or aluminoborosilicate glass, a metal substrate, or a substrate obtained by forming an insulating film on a surface of a stainless steel substrate can be used. Also, a plastic substrate having a heat resistance high enough for the substrate to withstand the processing temperature may be used.

In this embodiment mode, a silicon oxide film is used as the base film 101. Note that a material for the base film 101 is not limited to this but may be any material as long as it can withstand heat treatment in subsequent steps as well as prevent alkaline metal affecting characteristics of TFTs from mixing into a semiconductor film formed later. Then, the base film may be formed of an insulating film on which unevennesses can be formed. Note that a detailed description will be made of how the unevennesses are formed at the subsequent stage. Also, the base film may be formed of an insulating film other than the films described above and of an insulating film having not a single layer structure but a laminate structure obtained by laminating two or more insulating films.

Next, a semiconductor film 102 is formed so as to cover the insulating film 101. The semiconductor film 102 may be formed by a known method (sputtering method, LPCVD method, plasma CVC method, or the like). Here, the semiconductor film may be an amorphous semiconductor film, a microcrystalline semiconductor film, or a crystalline semiconductor film. Also, not only silicon but also silicon germanium may be used. Further, after the base film 101 is formed, the semiconductor film is continuously formed without being exposed to the atmosphere, which can prevent the impurities from mixing between the semiconductor film and the base film.

Further, if the width between the projective portions is excessively small or large, the effects of the present invention cannot be obtained. Also, the height of the projective portion is excessively large, which increases the possibility that the semiconductor film formed later may be cut off in the vicinity of edge portions of the projective portions. Also, the excessively low projective portion cannot realize the effects of the present invention. The designer can set the sectional shape and the size of the projective portion 101a as appropriate while taking into account the balance with the semiconductor film thickness. A width Ws between the projective portions is preferably set to 0.01 to 2 $\mu$m, more preferably, about 0.1 to 1 $\mu$m. Also, a height Wh of the projective portion is preferably set to 0.01 to 3 $\mu$m, more preferably, about 0.1 to 2 $\mu$m. Alternatively, the height of the projective portion is made small and the height Wh may be set to 0.01 to 1 $\mu$m, more preferably, about 0.05 to 0.2 $\mu$m.

Figure 2A:
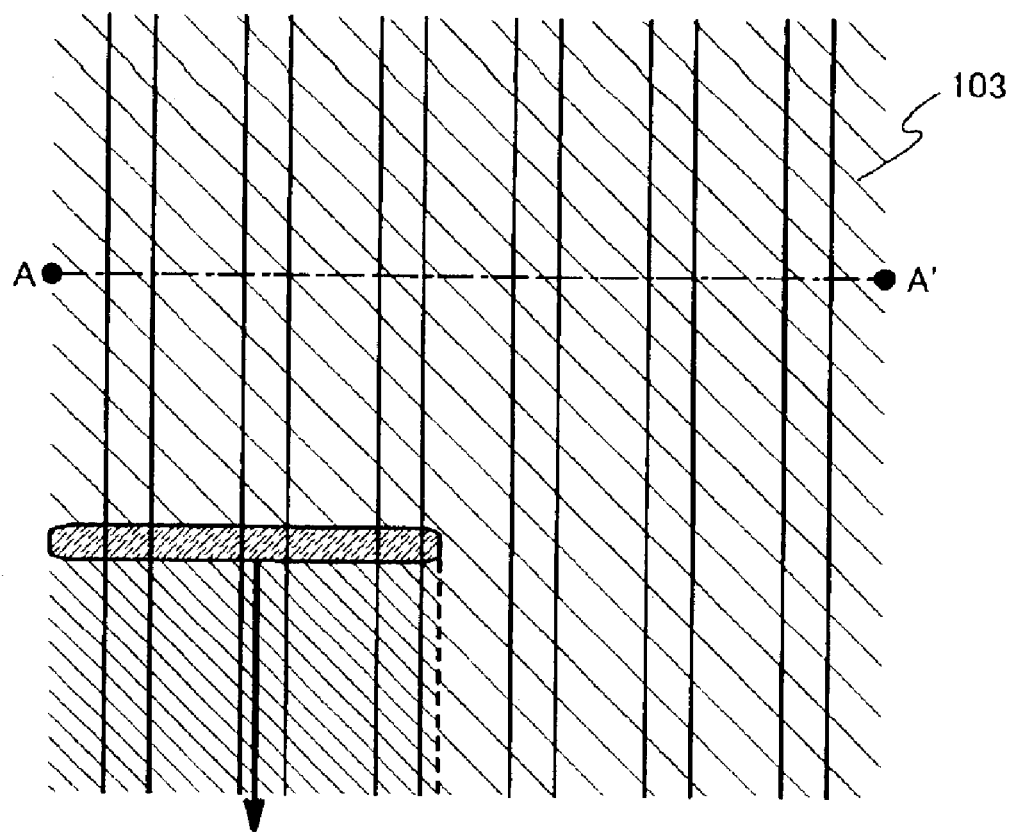
FIGS. 2A and 2B show a manufacturing process of a semiconductor device according to the present invention.
Figure 2B:
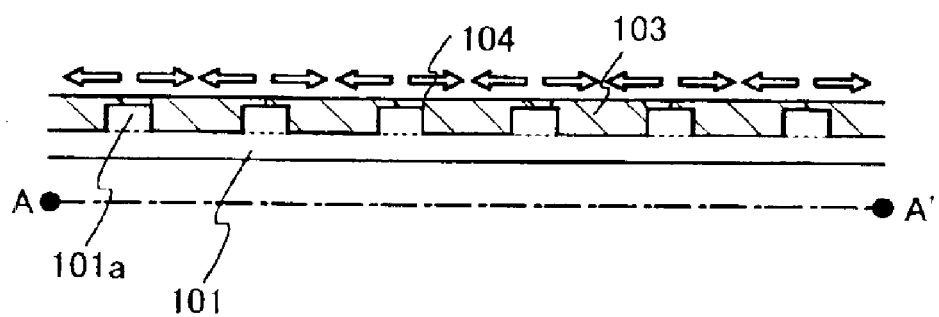
Figure 33A:
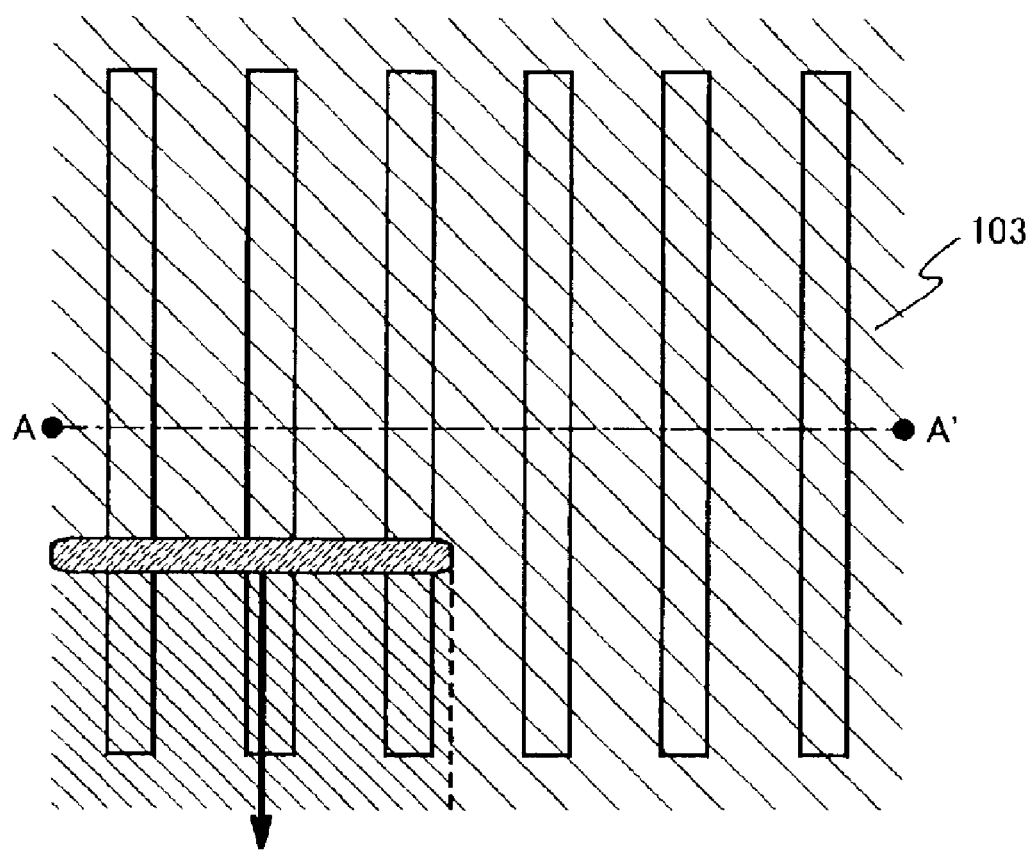
FIGS. 33A and 33B show a manufacturing process of a semiconductor device according to the present invention.
Figure 33B:
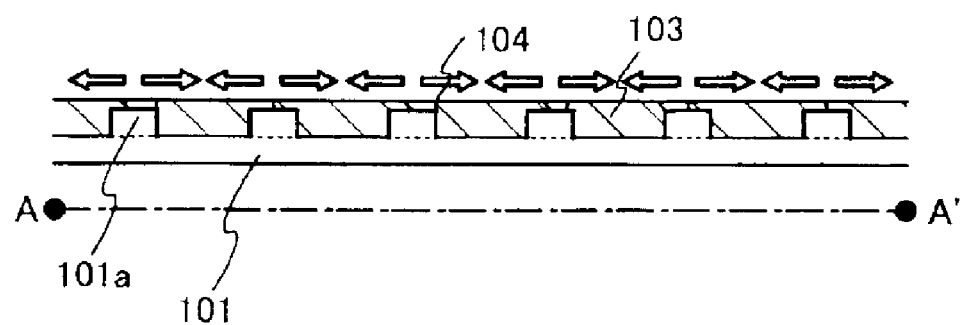

Next, as shown in FIG. 2A or FIG. 33A, a laser light is irradiated onto the semiconductor film 102. FIG. 2A shows the step subsequent to that shown in FIG. 1A and FIG. 33A shows the step subsequent to that shown in FIG. 32A. Note that FIG. 2B is a sectional view taken along the dashed line A–A' of FIG. 2A and FIG. 33B is a sectional view taken along the dashed line A–A' of FIG. 33A.

At this time, a scanning direction of the laser light is aligned with a direction in which carriers move in a channel formation region formed later. In this embodiment mode, as indicated by arrows in FIG. 2A or FIG. 33A, the laser light irradiation is performed with the scanning direction aligned with a longitudinal direction of the rectangular projective portion 101a. Through the laser light irradiation, the semiconductor film 102 is temporarily melted and the volume thereof is moved from a portion on the projective portion to the depressive portion as indicated by outline arrows in FIG. 2B or FIG. 33B. Then, a semiconductor film 103 having the leveled surface and the increased crystallinity is formed. An energy density of the laser light becomes low in the vicinity of edges of the laser beam. Thus, the grain size is small in the vicinity of the edges and protruded portions (ridges) appear along the grain boundary of the crystal. Therefore, the laser light irradiation is performed such that the edges of laser beam trajectory of the laser light are not overlapped with a portion serving as the channel formation region or that positioned above the depressive portion of the semiconductor film 102.

In the present invention, well-known lasers may be used. Although it is preferable that the laser light is a continuous wave laser light, it is conceivable that the effects of the present invention will be achieved to some extent with a pulse wave also. For the laser, a gas laser and a solid laser may be used. Examples of gas lasers include an excimer laser, an Ar laser, and a Kr laser, while examples of solid lasers include a YAG laser, a $YVO_4$ laser, a YLF laser, a $YAIO_3$ laser, a glass laser, a ruby laser, an alexandrite laser, a Tisapphire laser, and a $Y_2O_3$ laser. The applicable solid laser is one that uses a crystal such as YAG, $YVO_4$, YLF, or $YAIO_3$ doped with Cr, Nd, Er, Ho, Ce, Co, Ti, Yb, or Tm. The fundamental wave of the laser varies depending on the material used in doping, but a laser light having the fundamental wave of around 1 $\mu$m us obtained. The harmonic with respect to the fundamental wave may be obtained by using a non-linear optical element.

Furthermore, an infrared laser light emitted from a solid laser is converted into a green laser light by a nonlinear optical element and thereafter, a ultraviolet laser light obtained through another nonlinear optical element can be also used.

The semiconductor film 103 moves its volume due to the laser light irradiation. Thus, the thickness thereof is made large in the portion above the depressive portion, whereas it is made small in the portion above the projective portion 101a. As a result, the grain boundary 104 is easily generated above the projective portion due to the stress. In contrast, the semiconductor film achieves a state with satisfactory crystallinity above the depressive portion. Note that this does not mean that the semiconductor film 103 has always no grain boundaries above the depressive portion. However, even if the grain boundary exists, the grain size is large and thus, the relatively superior crystallinity is obtained.

Note that, upon the crystallization of the semiconductor film, the steps of irradiating the laser light and crystallizing the semiconductor film using a catalyst can be combined. In the case of using a catalytic element, the techniques disclosed in JP 07-130652 A and JP 08-78329 A can be used.

Figure 3A:
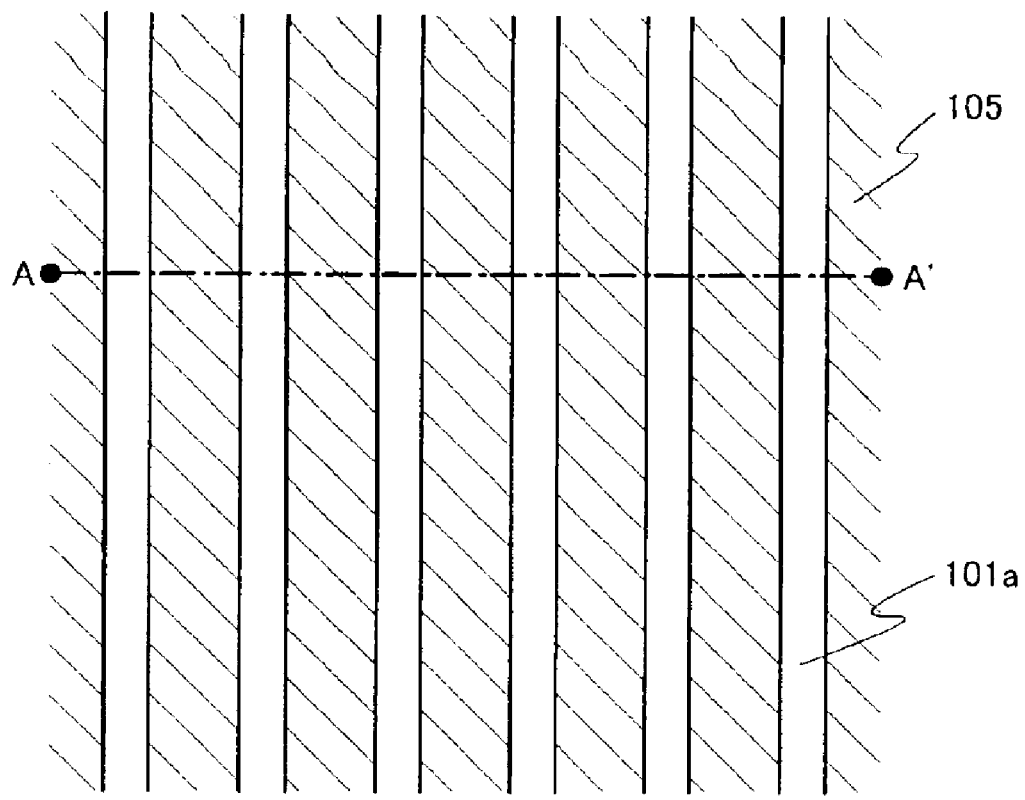
FIGS. 3A and 3B show a manufacturing process of a semiconductor device according to the present invention.
Figure 3B:
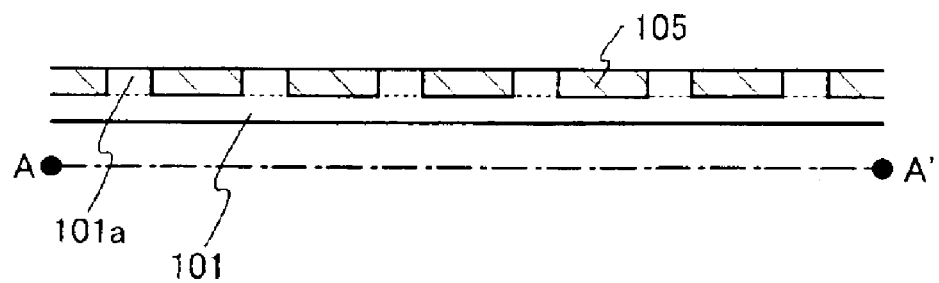
Figure 34A:
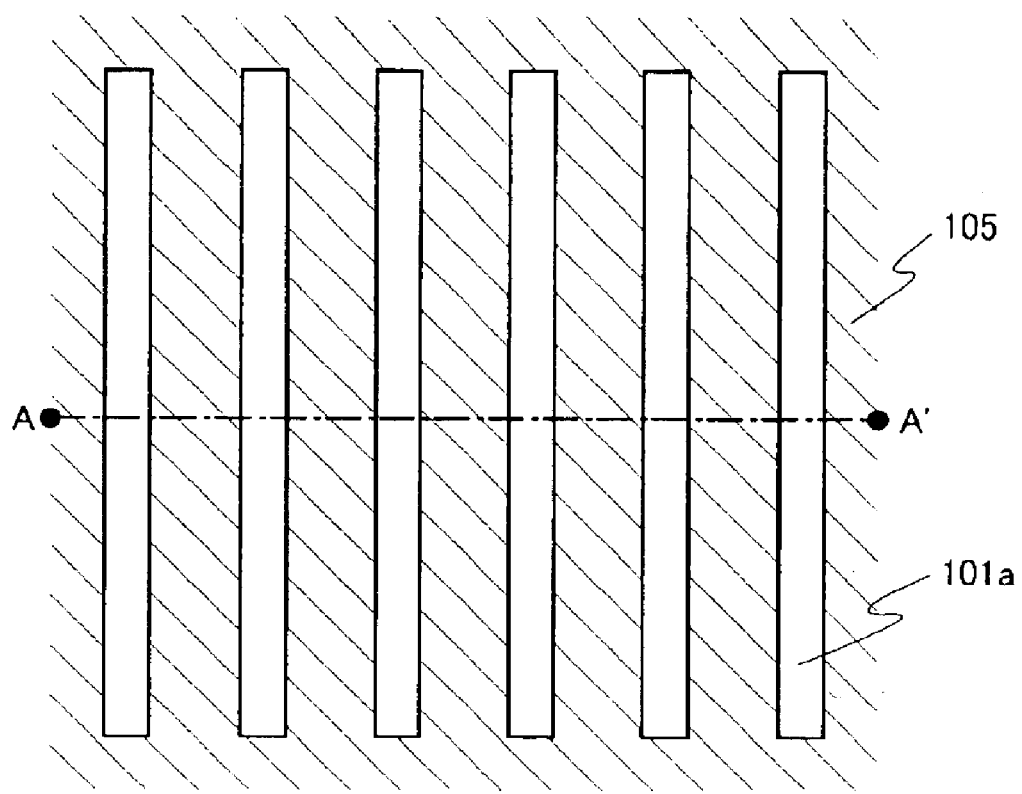
FIGS. 34A and 34B show a manufacturing process of a semiconductor device according to the present invention.
Figure 34B:
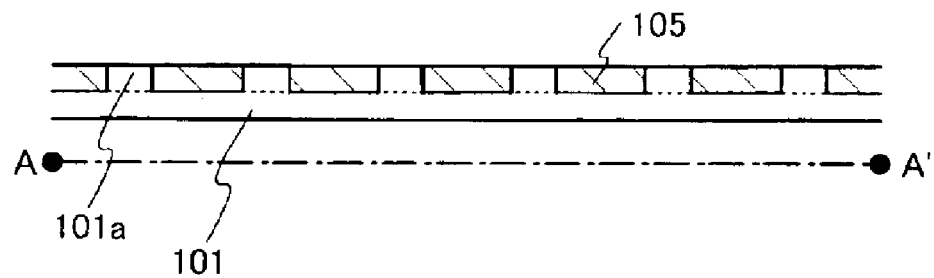

Next, as shown in FIG. 3A or FIG. 34A, the surface of the semiconductor film 103 is being etched to expose the upper surface of the projective portion 101a of the base film 101. FIG. 3A shows the step subsequent to that shown in FIG. 2A and FIG. 34A shows the step subsequent to that shown in FIG. 33A. Note that FIG. 3B is a sectional view taken along the dashed line A–A' of FIG. 3A and FIG. 34B is a sectional view taken along the dashed line A–A' of FIG. 34A. Through the above steps, the semiconductor film 105 existing in the projective portion of the base film 101 is formed. The removal of the semiconductor film 103 from the upper surface can be conducted using any method, e.g., an etching method or a CMP method.

Through this removal from the upper surface, the portion on the projective portion 101a in which the grain boundary exists is removed and the semiconductor film having a satisfactory crystallinity and serving as the channel formation region later remains on the depressive portion between the projective portions 101a.

Figure 4A:
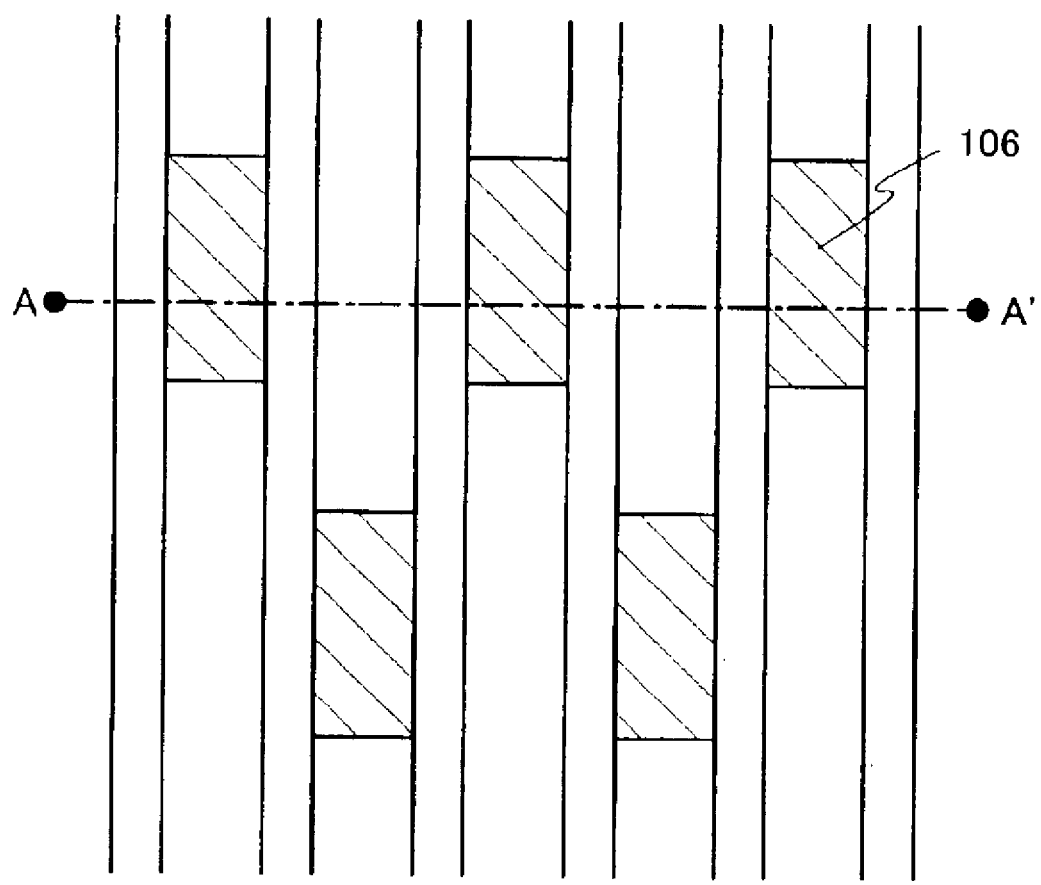
FIGS. 4A and 4B show a manufacturing process of a semiconductor device according to the present invention.
Figure 4B:
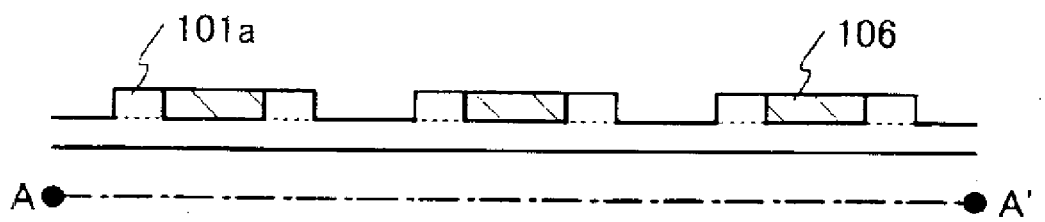
Figure 35A:
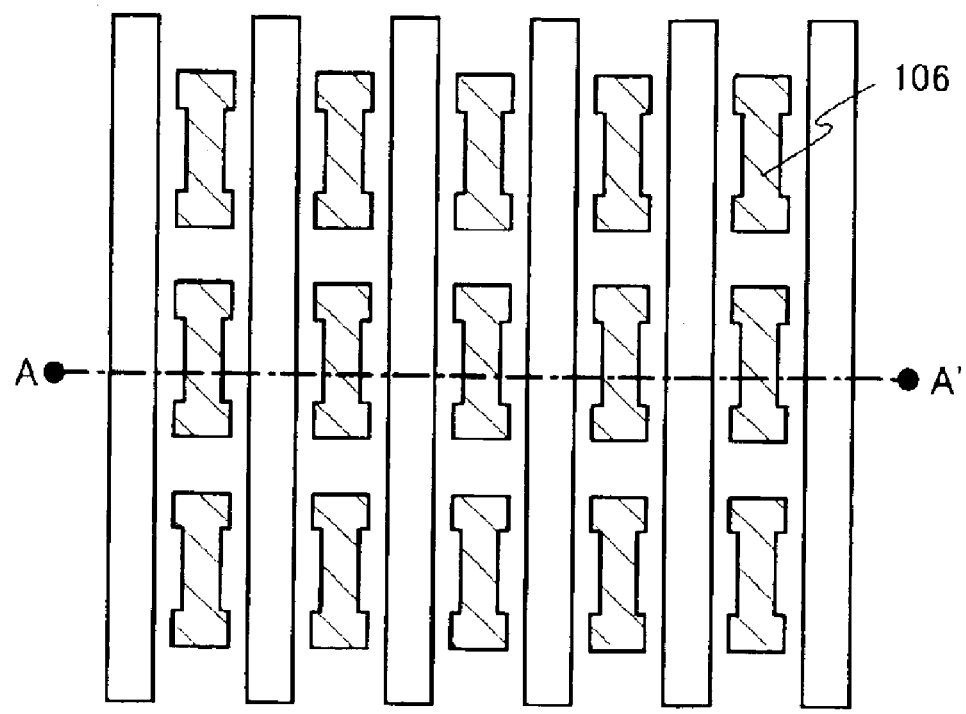
FIGS. 35A and 35B show a manufacturing process of a semiconductor device according to the present invention.
Figure 35B:
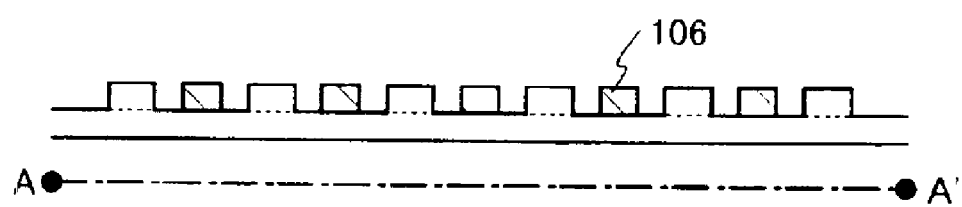

Next, as shown in FIG. 4A or FIGS. 35A and 35B, the semiconductor film 105 is patterned to form an island-like semiconductor film 106 as an active layer. FIG. 4A shows the step subsequent to that shown in FIG. 3A and FIG. 35A shows the step subsequent to that shown in FIG. 34A. Note that FIG. 4B is a sectional view taken along the dashed line A–A' of FIG. 4A and FIG. 35B is a sectional view taken along the dashed line A–A' of FIG. 35A. The island-like semiconductor film 106 partially exists on the depressive portion formed between the projective portions 101a. Further, in FIGS. 35A and 35B, the semiconductor film 106 is partially brought into contact with the projective portion 101a. It is desirable to determine the layout of the projective portions 101a considering the channel length and width of the channel formation region of the TFT so that it is formed using the portion located above the depressive portion of the semiconductor film 105. Note that portions serving as source/drain regions are also formed using the semiconductor film located above the depressive portion and thus, resistance thereof can be reduced.

Note that in FIGS. 4A and 4B, although each island-semiconductor film 106 is not overlapped with the projective portion 101a, the present invention is not limited to this structure. The island-semiconductor films 106 may be partially overlapped with the projective portions 101a. Further, a so-called multi-channel type TFT can be also adopted which includes the plural channel formation regions separated from one another, and the source regions and the drain regions with the plural channel formation regions being all interposed therebetween. Further, in this TFT, all of the plural channel formation regions are not overlapped with the projective portions 101a and the source regions and the drain regions are partially overlapped with the projective portions.

The island-like semiconductor film obtained through a series of steps described above is used as an active layer to form the TFT. There are given various manufacturing steps and specific structures of the TFT having the plural channel formation regions separated from each other. As a typical example thereof, a step of adding an impurity to the island-like semiconductor film to form the source region and the drain region, a step of forming a gate insulating film, and a step of forming a gate electrode are performed.

Note that, in this embodiment mode, subsequent to the step of removing the surface of the semiconductor film crystallized by the laser light irradiation to such a degree as to expose the projective portion, the step of forming the island-like semiconductor film by patterning is performed. However, the present invention is not limited to this structure. Subsequent to the step of forming the island-like semiconductor film by patterning, the step of removing the surface of the island-like semiconductor film to such a degree as to expose the projective portion may be performed.

In the present invention, the semiconductor film located above the depressive portion of the insulating film is actively used as an active layer of the TFT, which makes it possible to prevent the formation of the grain boundary in the channel formation region of the TFT as well as the remarkable reduction in the mobility of the TFT, the decrease in an ON current, and the increase in an OFF current due to the grain boundary. Further, the variation in the characteristics of the TFT can be suppressed.

Figure 5A:
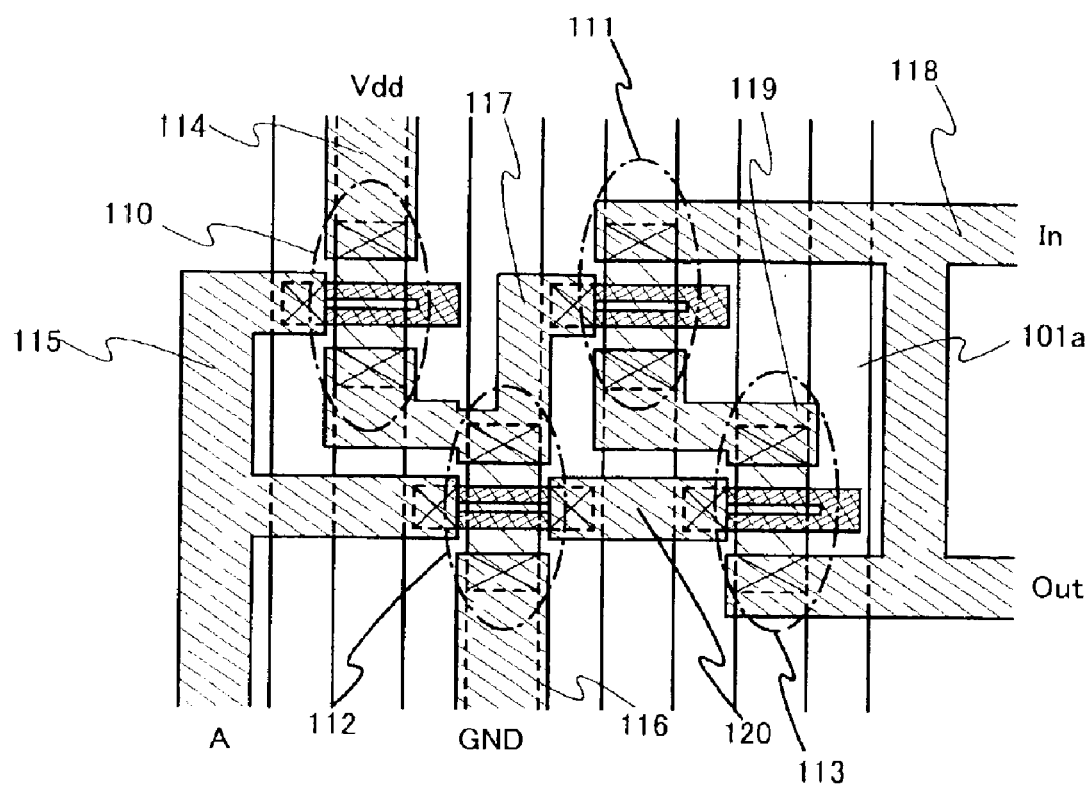
FIGS. 5A and 5B are a top view of an inverter and a transmission gate manufactured by a manufacturing method according to the present invention and a circuit diagram thereof, respectively.
Figure 5B:
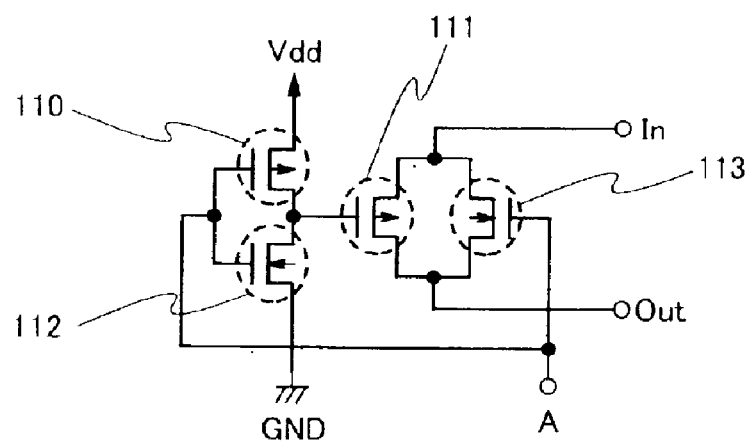

Then, after manufacturing the TFT, wirings for electrically connecting among the gate electrodes, the source regions, and the drain regions of the TFTs are formed in accordance with the specification of the target circuit. FIGS. 5A and 5B illustrate a case of forming an inverter and a transmission gate using the TFTs.

Figure 36:
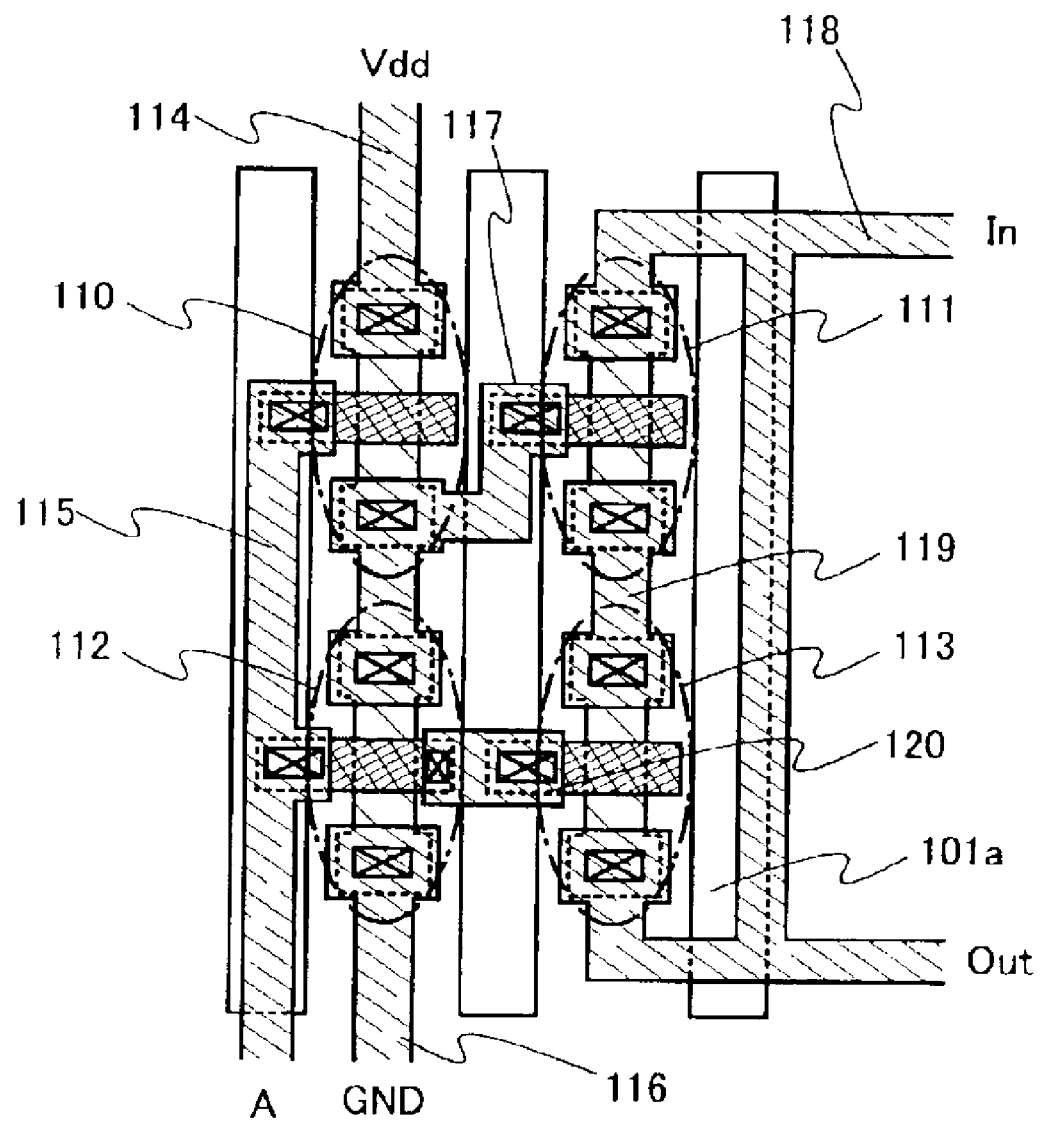
FIG. 36 is a top view and a circuit diagram of an inverter and a transmission gate formed by using a manufacturing method according to the present invention.

FIG. 5A and FIG. 36 are top views of the inverter and the transmission gate formed according to the manufacturing method of the present invention and FIG. 5B is a circuit diagram thereof. By using the island-like semiconductor film obtained through a series of steps in the manufacturing method described above, p-channel TFTs 110 and 111 and n-channel TFTs 112 and 113 are formed. These TFTs 110 to 113 each include at least the active layer, the gate insulating film, and the gate electrode. In each active layer, at least the channel formation region, and the source region and the drain region sandwiching the channel formation region are provided.

Note that, an LDD region or offset region may be formed between an impurity region serving as the source/drain region and the channel formation region.

Each TFT has the active layer above the depressive portion and each active layer locates between the projective portions 101a and is not overlapped with the projective portions 101a. Wirings 115 to 120 are used to connect among the source regions, the drain regions, and the gate electrodes of the TFTs, thereby forming the circuit as shown in the circuit diagram of FIG. 5B. Specifically, the p-channel TFT 110 and the n-channel TFT 112 constitute the inverter. Also, the p-channel TFT 111 and the n-channel TFT 113 constitute the transmission gate. In synchronism with a signal inputted to a terminal A, a signal inputted from a terminal In undergoes sampling to be outputted from a terminal Out.

With the above structure, when the circuit specification is changed, it is only required to change the layout of the wirings for connecting the previously prepared TFTs or logic elements. In the case of FIGS. 5A and 5B, for example, at least two masks including a mask for patterning the wirings and a mask for contact holes of the wirings may be changed. Thus, the cost involved in the design change of the circuit can be suppressed and the circuits of the various specifications can be manufactured.

Note that it is needless to say that the present invention is not limited to the above circuit. Also, in FIG. 5A, the wirings 115 to 120 are formed in the same layer, but the present invention is not limited to this. The wirings for connecting the TFTs may be formed in the different layers. By forming the wirings in the different layers, the complicated connection is possible and a variety of circuits can be achieved using the same number of TFTs as in the above case. Note that the TFTs may be connected through the wirings (plugs) formed by damascene process etc.

Further, in the above steps, after the semiconductor film subjected to the laser light irradiation or crystallization is etched to such a degree as to expose the projective portion of the base film, it is heated at 500 to 600° C. for about 1 to 60 minutes, so that the stress developed in the semiconductor film can be relaxed.

The manufacturing method of the present invention is used to enable the formation, for example, of a CPU using an LSI, and a memory element (e.g., SRAM), a counter circuit, a division circuit logic, etc. of various logic circuits. The present invention is applicable to the various semiconductor devices.

(Embodiment)

Hereinafter, embodiments of the present invention will be described.

(Embodiment 1)

In this embodiment, a description will be given of a case in which the island-semiconductor film is partially etched in the embodiment mode.

Figure 6A:
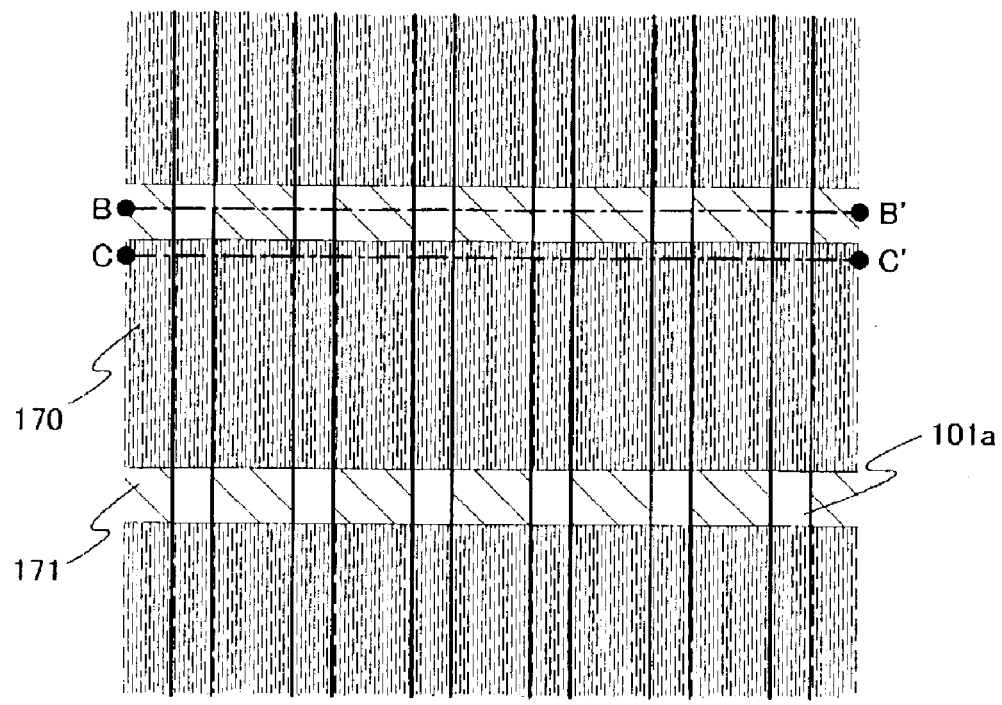
FIGS. 6A to 6C show a manufacturing process of a semiconductor device according to the present invention.
Figure 6B:
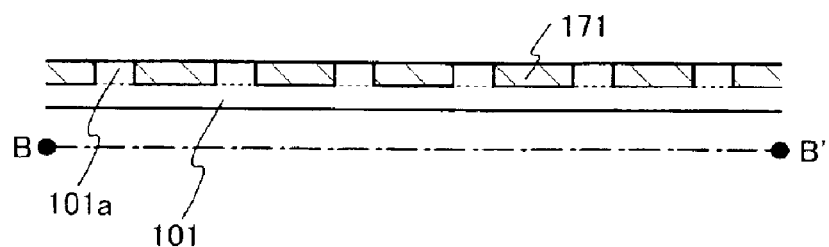
Figure 6C:
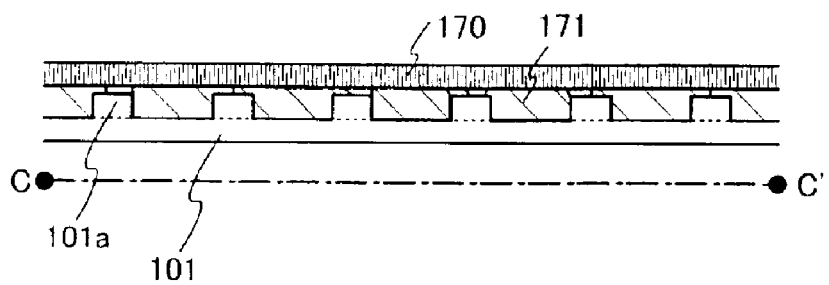

First, the film is formed following the steps in the embodiment mode up to the state of FIGS. 2A and 2B. Then, as shown in FIG. 6A, a mask 170 is used to cover all the film other than the portion serving as the channel formation region of the TFT in the subsequent steps. In this state, the surface of the semiconductor film 103 is being etched to expose the upper surface of the projective portion 101a of the base film 101. Note that FIG. 6B is a sectional view taken along the dashed line B–B' of FIG. 6A and FIG. 6C is a sectional view taken along the dashed line C–C' of FIG. 6A. Through the above steps, a semiconductor film 171 exiting in the depressive portion of the base film 101 is formed. The removal of the semiconductor film 103 from the upper surface may be formed by any method and in this embodiment, etching is used for the removal.

Through this removal from the upper surface, the portion on the projective portion 101a in which the grain boundary exists is removed in a portion covered with no mask. The semiconductor film serving as the channel formation region later and having a satisfactory crystallinity remains above the depressive portion between the projective portions 101a.

Figure 7A:
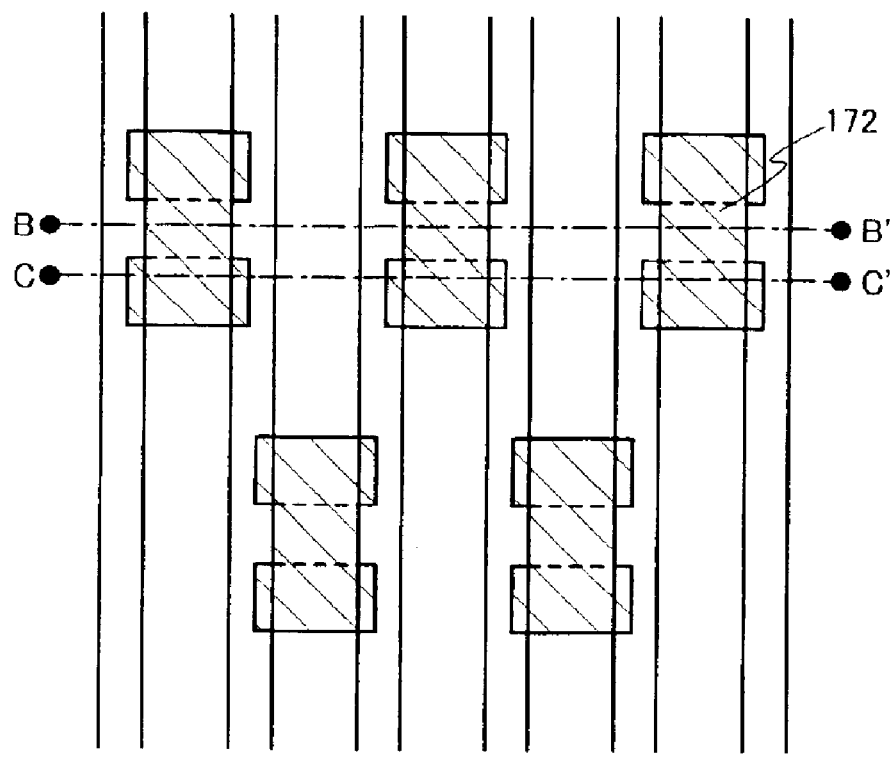
FIGS. 7A to 7C show a manufacturing process of a semiconductor device according to the present invention.
Figure 7B:
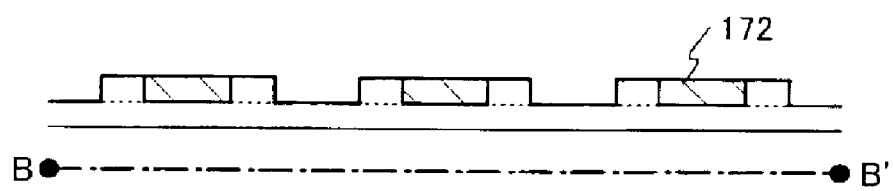
Figure 7C:
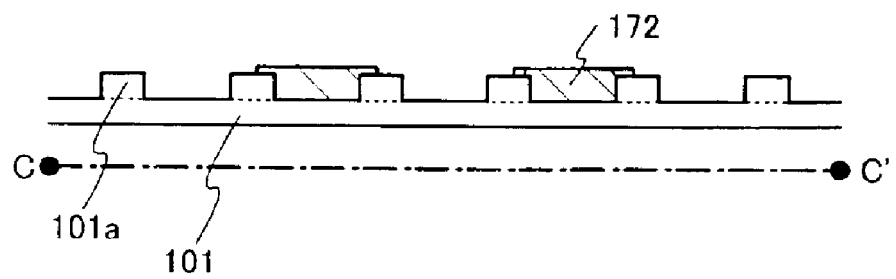

After the film is formed up to the state of FIGS. 6A to 6C, the semiconductor film 171 is patterned to form island-like semiconductor films 172 as shown in FIG. 7A. FIG. 7B is a sectional view taken along the dashed line B–B' of FIG. 7A. FIG. 7C is a sectional view taken along the dashed line C–C' of FIG. 7A. The island-like semiconductor films 172 exhibit difference in thickness between the portion serving as the channel formation region and the portion serving as the source/drain region. Also, the portion serving as the source/drain region may be partially overlapped with the projective portion 101a.

As in this embodiment, the source region and the drain region are partially overlapped with the projective portions 101a, thereby ensuring the wide surface area of the source region and the drain region. Thus, the margin in the layout of the contact holes for wirings connected to the source/drain region can be set large.

Also, when the contact holes are formed in the insulating film formed on the semiconductor film on the level base film, if the mask for the contact holes is shifted, the base film formed below the semiconductor film is etched, which may involve the following. That is, the electrode formed in contact with the semiconductor film may be cut off in some cases. According to the present invention, in particular, the portions serving as the source region and the drain regions of the semiconductor film are formed in contact with the projective portions, so that the projective portions are partially etched instead of the base film arranged below the semiconductor film. Thus, the wirings connected to the source/drain region can be prevented from being cut off.

(Embodiment 2)

In this embodiment, a description will be made of a case in which in the embodiment mode, after the island-like semiconductor film is formed, the projective portion is removed.

First, the film is formed following the steps in the embodiment mode up to the state of FIGS. 35A and 35B. In this embodiment, however, it is important to form the base film having such a structure as to remove only the projective portion by etching or the like. The base film to be used in this embodiment consists of a first base film made of silicon nitride, a rectangular second base film made of silicon oxide, and a third base film made of silicon oxide. The second base film is formed on the first base film and the third base film is formed so as to cover the first and second base films. Note that the structure of the base film is not limited to this and any structure can be adopted provided that it enables the removal of the projective portions alone by etching or the like.

Figure 37A:
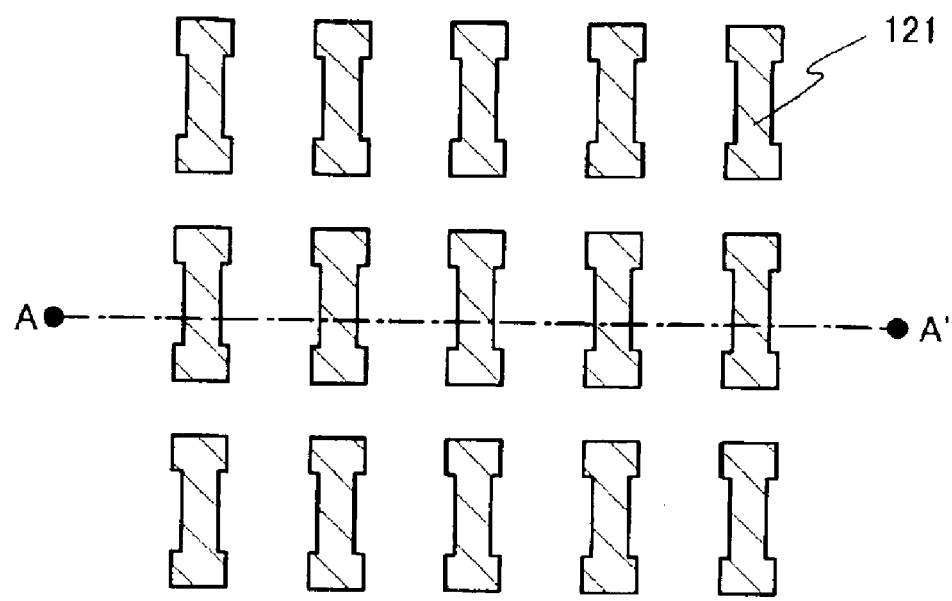
FIGS. 37A and 37B show a manufacturing process of a semiconductor device according to the present invention.
Figure 37B:
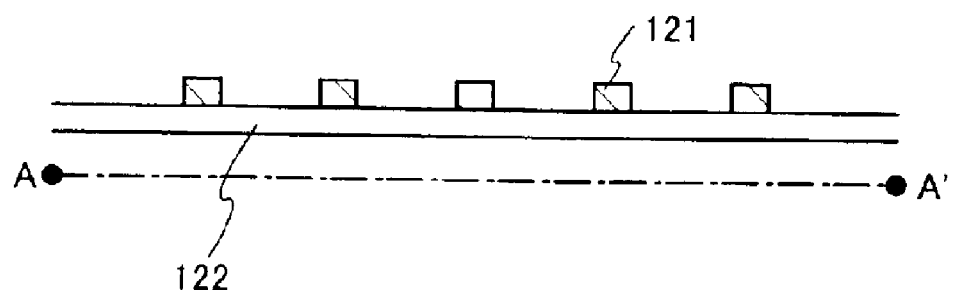

Also, after the film is formed up to the state of FIGS. 35A and 35B, the projective portions of the base film are removed partially or completely as shown in FIGS. 37A and 37B. FIG. 37A is a top view after the projective portions are completely removed and FIG. 37B is a sectional view taken along the line A–A' of FIG. 37A. The island-like semiconductor films 121 are formed on the base film 122 from which the projective portions are removed.

When the projective portions are removed as in this embodiment, the number of steps increases. However, if the projective portions are completely removed from the base film, the surface of the insulating film formed to cover the TFT and the base film can be leveled, so that the wirings formed on the insulating film can be prevented from being cut off.

The projective portions may be removed by dry or wet etching and other methods. In etching, there is a possibility that the island-like semiconductor films are partially removed.

Here, it is important that the base film and the island-like semiconductor film are made of materials capable of taking a selection ratio therebetween at the time of etching. For example, as in this embodiment, in the case where on the first base film made of silicon nitride, the rectangular second base film made of silicon oxide is formed and the third base film made of silicon oxide is formed so as to cover the first and second base films, dry etching using $CHF_3$ and $CF_3$ gases or wet etching using a hydrofluoric acid-based etchant is preferably used. In the case of using dry etching, the base film formed below the island-like semiconductor film is prevented from being etched due to wraparound and the side faces of the semiconductor film can be formed into a tapered shape. The side faces of the semiconductor film have the tapered shape, which prevents the insulating film and the film constituting the gate electrode formed in the subsequent steps from being cut off. Alternatively, in the case of using wet etching, the projective portion of the base film can be removed without etching the upper surface of the semiconductor film.

Further the projective portions are not completely removed in the height direction and may partially remain. Also, the mask or the like may be used to remove the projective portions only in a specific region. Also, in the base film, portions other than the projective portions may be somewhat etched as well in some cases.

(Embodiment 3)

On the base film in which the plural projective portions of a rectangular or stripe shape are arranged at substantially the same interval, the semiconductor film is formed and is irradiated with the laser light in the longitudinal direction of the projective portions. Then, the grain boundary may develop obliquely between the projective portion formed at the outermost position and the adjacent projective portion in some cases.

Figure 8:
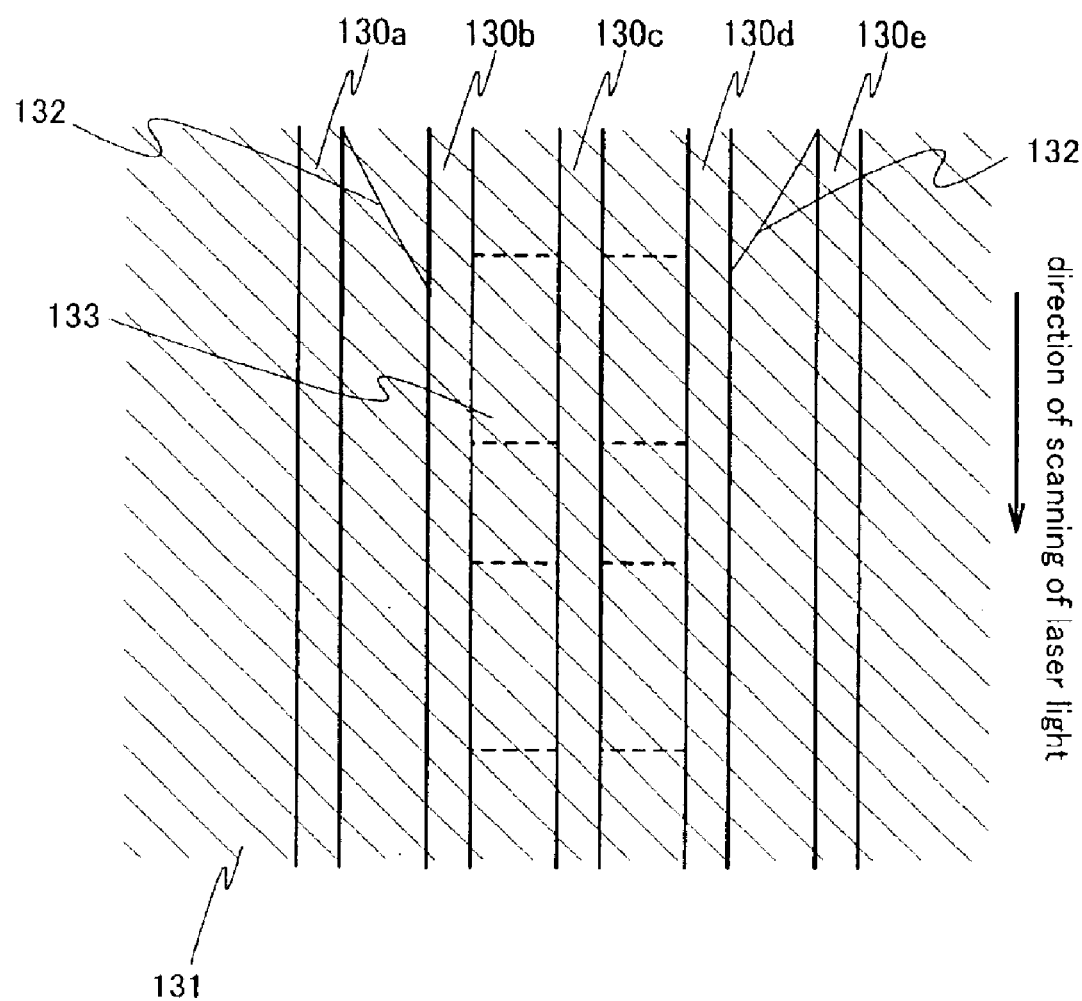
FIG. 8 shows a position of a grain boundary after laser light irradiation.
Figure 38:
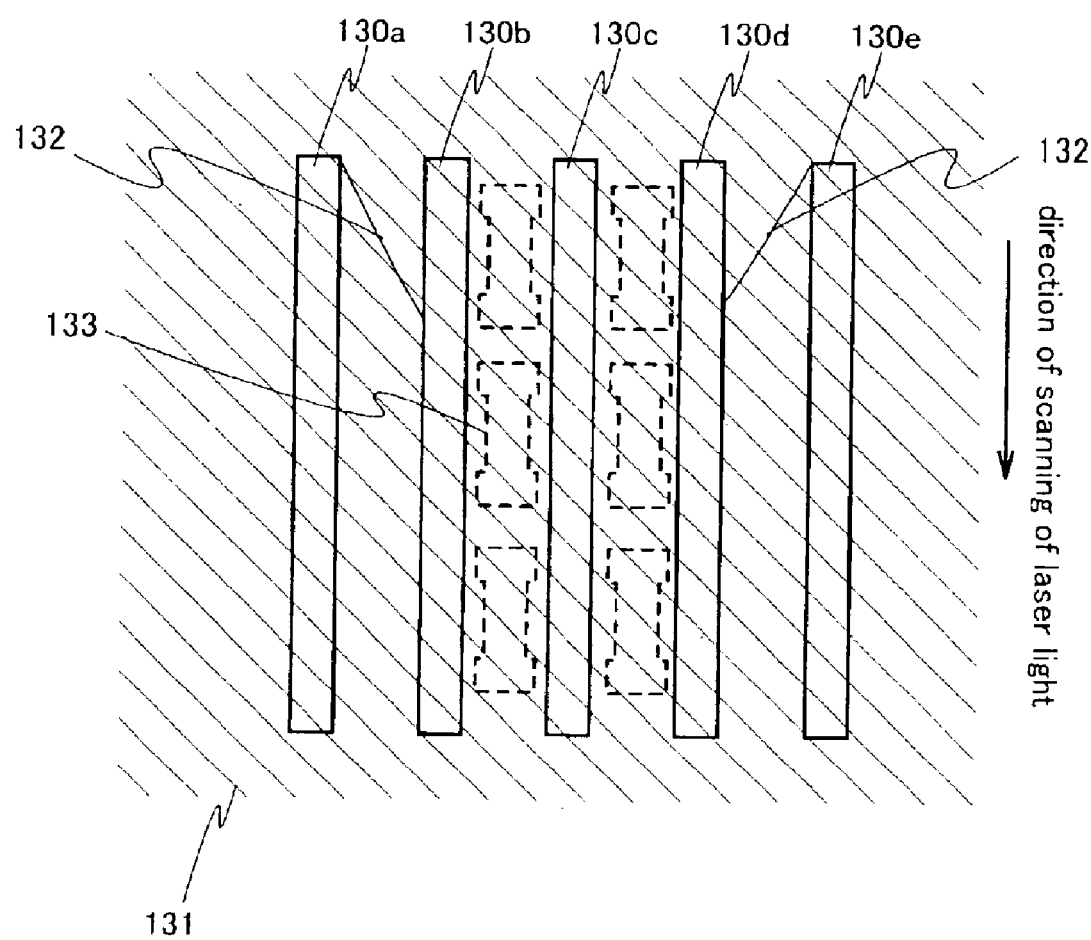
FIG. 38 shows a position of a grain boundary after laser light irradiation.

FIG. 8 or FIG. 38 is a top view of the semiconductor film when on the base film in which the plural projective portions of a rectangular or stripe shape are arranged in parallel at substantially the same interval, the semiconductor film is formed and is irradiated with the laser light in the longitudinal direction of the projective portions. In this embodiment, a case of using a base film in which five rectangular projective portions 130a to 130e are arranged in parallel is shown. The projective portions 130a to 130e are arranged in parallel in a direction vertical to the longitudinal direction thereof. After the semiconductor film is formed on the base film so as to cover the projective portions 130a to 130e, as indicated by the arrow, the laser light is scanned in the longitudinal direction of the projective portions 130a to 130e. The semiconductor film 131 after the laser light irradiation exhibits grain boundaries 132 obliquely between the projective portions 130a and 130e formed at the outermost positions and the projective portions 130b and 130d respectively adjacent thereto.

Therefore, in this embodiment, the semiconductor film located above the depressive portions formed between the projective portions 130a and 130e formed at the outermost positions and the projective portions 130b and 130d respectively adjacent thereto is not used as the active layer of the TFT. Alternatively, the semiconductor film on the depressive portions formed between the projective portions (projective portions 130b to 130d in this embodiment) sandwiched between other projective portions is used as the active layer of the TFT.

Portions indicated by dashed line 133 denote those serving as the island-like semiconductor films by the subsequent etching.

Note that in addition to the minimum number of required projective portions, dummy projective portions are willingly provided outside the above projective portions while taking into account the layout of the island-like semiconductor films. Thus, the crystallinity of the island-like semiconductor films formed later can be made more uniform.

This embodiment can be implemented in combination with Embodiment 1 or 2.

(Embodiment 4)

In this embodiment, a description will be made of a case in which the active layers and the gates are previously connected into one unit (basic cell) in some of the TFTs. The sources, the drains, and the gates of the TFTs of the basic cell are connected to one another through the wirings to form various logic elements using the basic cells. The desired circuit can be designed by combining the logic elements.

Figure 9A:
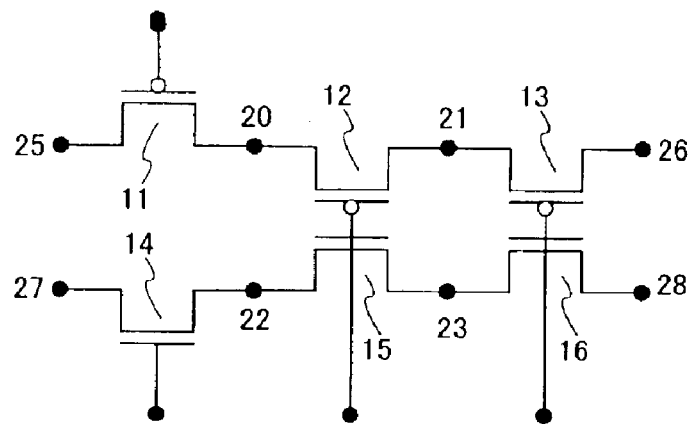
FIGS. 9A to 9C are circuit diagrams showing a basic cell formed by using a manufacturing method according to the present invention and D-flip-flop using the basic cell.

FIG. 9A shows an example of the basic cell formed by connecting the active layers and the gates of some of the TFTs. The basic cell shown in FIG. 9A includes three p-channel TFTs 11, 12, and 13 and three n-channel TFTs 14, 15, and 16.

The three p-channel TFTs 11, 12, and 13 are connected in series, that is, one of the source and the drain of the p-channel TFT 12 is connected to one of the source and the drain of the p-channel TFT 11 and the other thereof is connected to one of the source and the drain of the p-channel TFT 13.

Also, the three n-channel TFTs 14, 15, and 16 are connected in series, that is, one of the source and the drain of the n-channel TFT 15 is connected to one of the source and the drain of the n-channel TFT 14 and the other thereof is connected to one of the source and the drain of the n-channel TFT 16.

Further, the gates of the p-channel TFT 12 and the n-channel TFT 15 are connected to each other. Also, the gates of the p-channel TFT 13 and the n-channel TFT 16 are connected to each other.

Note that hereinafter, for simplicity in description, in FIG. 9A, a node at which the p-channel TFTs 11 and 12 are connected and a node at which the p-channel TFTs 12 and 13 are connected are denoted by reference numerals 20 and 21, respectively. Also, a node at which the n-channel TFTs 14 and 15 are connected and a node at which the n-channel TFTs 15 and 16 are connected are denoted by reference numerals 22 and 23, respectively.

Also, one of the source and the drain of the p-channel TFT 11, which is not connected to the node 20 is denoted by reference numeral 25. One of the source and the drain of the p-channel TFT 13, which is not connected to the node 21 is denoted by reference numeral 26. One of the source and the drain or the n-channel TFT 14, which is not connected to the node 22 is denoted by reference numeral 27. One of the source and the drain of the n-channel TFT 16, which is not connected to the node 23 is denoted by reference numeral 28.

Figure 10A:
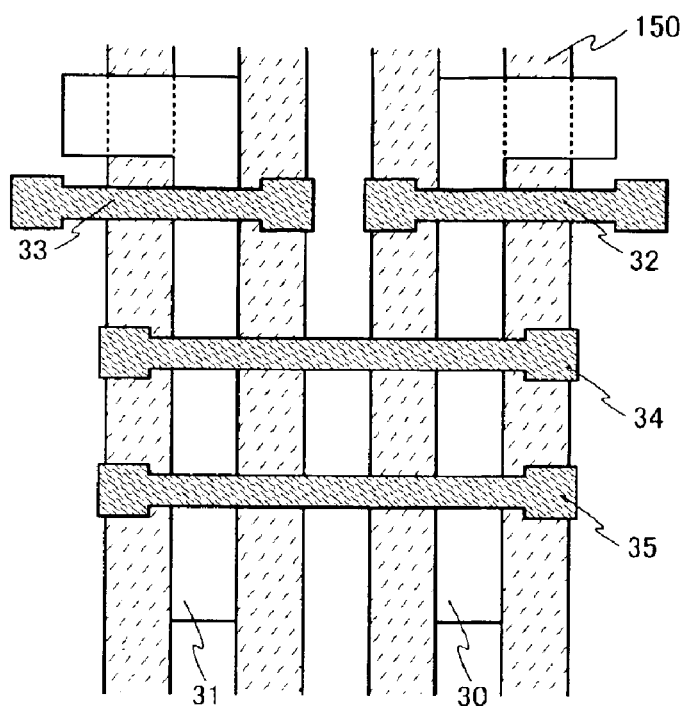
FIGS. 10A and 10B are top views showing a basic cell formed by using a manufacturing method according to the present invention and D-flip-flop using the basic cell, respectively.
Figure 39A:
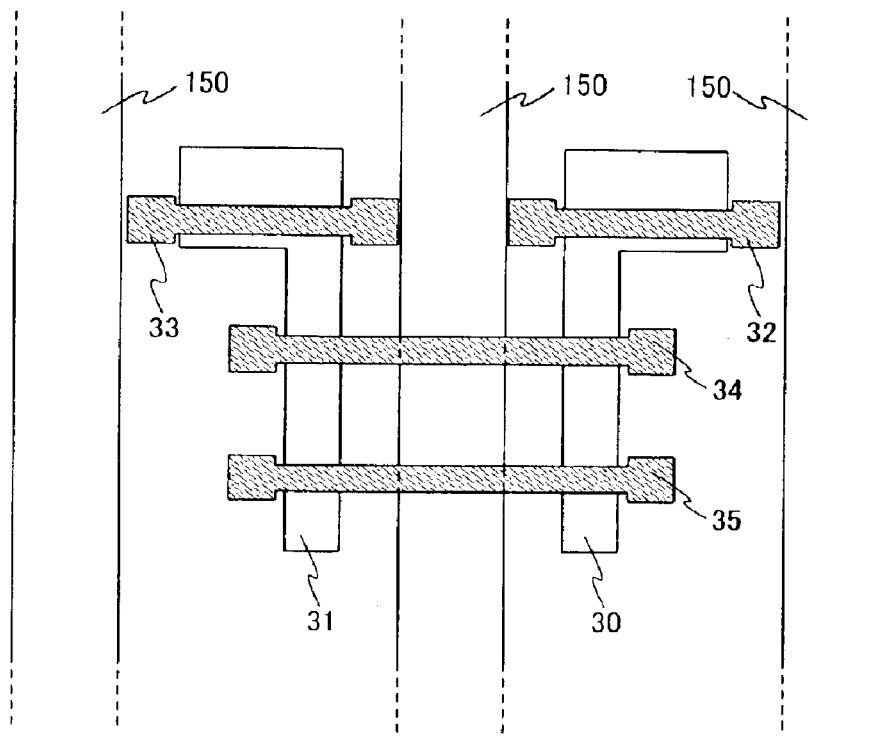
FIGS. 39A and 39B are top views showing a basic cell formed by using a manufacturing method according to the present invention and D-flip-flop using the basic cell, respectively.

FIG. 10A or FIG. 39A is a top view of the basic cell of FIG. 9A. The p-channel TFTs 11, 12 and 13 have an active layer 30 in common. The n-channel TFTs 14, 15, and 16 have an active layer 31 in common. The active layers 30 and 31 are both formed between projective portions 150 of the base film.

Wirings 32, 34, and 35 overlap the active layer 30 with a gate insulating film (not shown) interposed therebetween, the gate insulating film being in contact with the active layer 30. Also, wirings 33, 34, and 35 overlap the active layer 31 with a gate insulating film (not shown) interposed therebetween, the gate insulating film being in contact with the active layer 31. Here, the wirings 32 to 35 serve as gates in a portion where they overlap the active layer 30 or 31. Hereinafter, the wirings 32 to 35 which partially serve as gates of the TFTs are each referred to as a gate wiring in order to distinguish them from the wirings for forming the logic elements described below.

Portions overlapping the active layer 30 of the gate wirings 32, 34, and 35 serve as gates of the p-channel TFTs 11, 12, and 13, respectively.

Portions overlapping the active layer 31 of the gate wirings 33, 34, and 35 serve as gates of the n-channel TFTs 14, 15, and 16, respectively.

Next, a description will be made of an example in which a D-flip-flop circuit is configured by using the above-mentioned basic cells. The terminals and the nodes of the basic cells shown in FIGS. 9A, 10A and 39A are appropriately connected through the wirings formed in a layer different from a layer where the active layers and the gates are formed, thereby attaining the D flip flop.

Figure 9B:
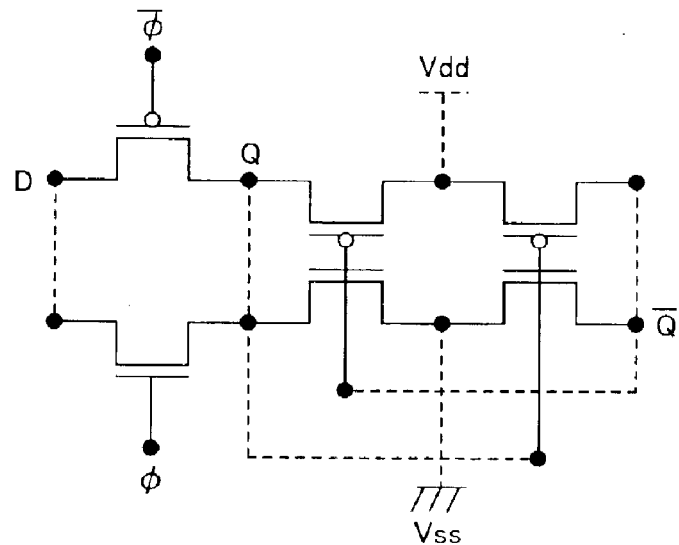

FIG. 9B is a circuit diagram showing the D flip flop configured based on the basic cells of FIG. 9A. In FIG. 9B, the terminals 25 and 27 are connected to each other in the basic cells of FIG. 9A. Further, the nodes 20 and 22 are connected to the gates of the p-channel TFT 13 and the n-channel TFT 16, respectively. The terminals 26 and 28 are connected to the gates of the p-channel TFT 12 and the n-channel TFT 15, respectively. A voltage Vdd is applied to the node 21, whereas a voltage Vss is applied to the node 23. Here, Vdd>Vss.

Figure 9C:
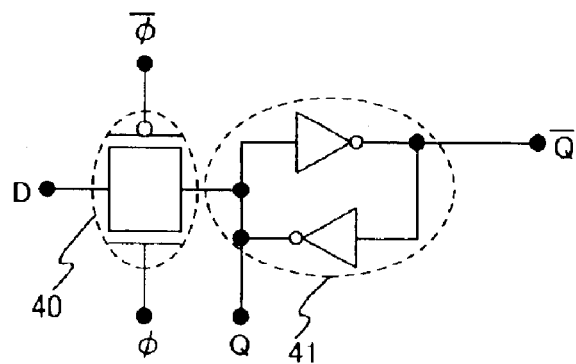

FIG. 9C is an equivalent circuit diagram of FIG. 9B. As seen from FIG. 9C, a transmission gate 40 and a flip-flop circuit 41 are provided.

Figure 10B:
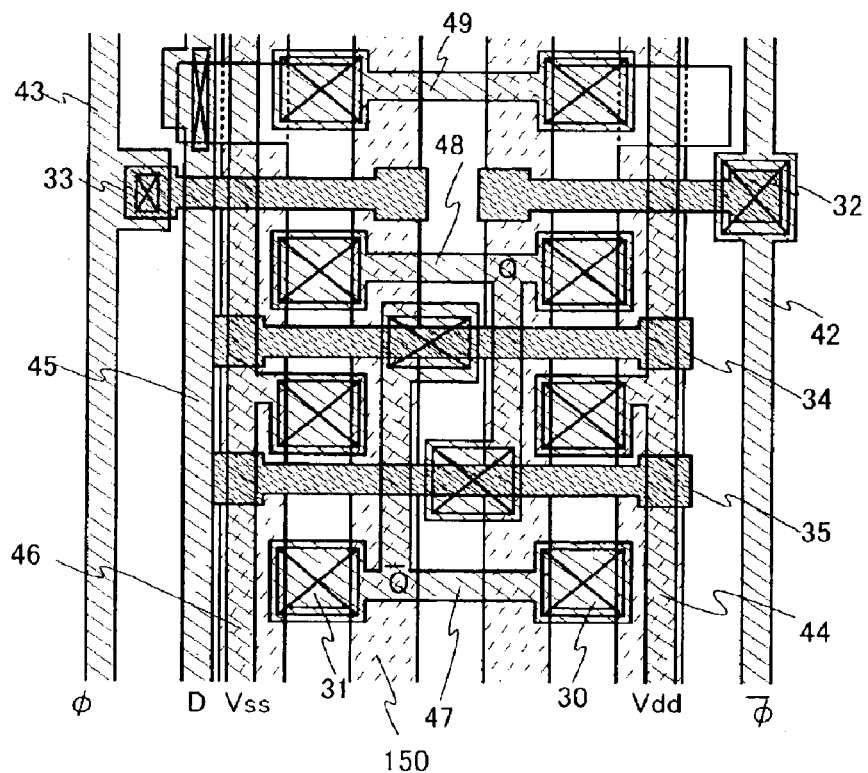
Figure 39B:
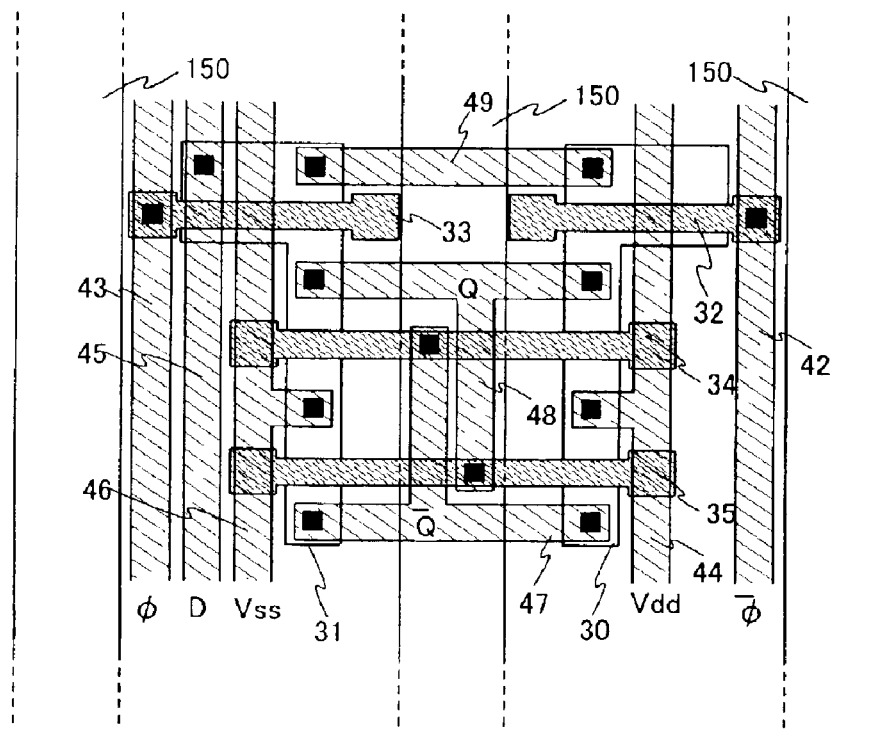

FIG. 10B is a top view of the D flip flop of FIG. 9B in the case of using the basic cells of FIG. 10A. Also, FIG. 39B is a top view of the D flip flop of FIG. 9B in the case of using the basic cells of FIG. 39A. An interlayer insulating film (not shown) is formed so as to cover the active layers 30, 31, the gate wirings 32 to 35, and the gate insulating film (not shown). Then, on the interlayer insulating film, wirings 42 to 49 are formed in contact with the active layers 30, 31 and the gate wirings 32 to 35 through contact holes formed in the interlayer insulating film and the gate insulating film.

Specifically, the wiring 42 is in contact with the gate wiring 32 and the wiring 43 is in contact with the gate wiring 33.

The wiring 44 is in contact with the active layer 30 in a region between a portion where the active layer 30 overlaps the gate wiring 34 and a portion where the active layer 30 overlaps the gate wiring 35. Also, the wiring 46 is in contact with the active layer 31 in a region between a portion where the active layer 31 overlaps the gate wiring 34 and a portion where the active layer 31 overlaps the gate wiring 35.

The wiring 49 is in contact with the active layer 30 in one region that is not overlapped with the other gate wirings when the active layer 30 is divided into two regions across the portion where the active layer 30 overlaps the gate wiring 32. Further, the wiring 49 is in contact with the active layer 31 in one region that is not overlapped with the other gate wirings when the active layer 31 is divided into two regions across the portion where the active layer 31 overlaps the gate wiring 33.

The wiring 47 is in contact with the active layer 30 in one region that is not overlapped with the other gate wirings when the active layer 30 is divided into two regions across the portion where the active layer 30 overlaps the gate wiring 35. Further, the wiring 47 is in contact with the active layer 31 in one region that is not overlapped with the other gate wirings when the active layer 31 is divided into two regions across the portion where the active layer 31 overlaps the gate wiring 35. Furthermore, the wiring 47 is in contact with the gate wiring 34.

The wiring 48 is in contact with the gate wiring 35. Further, the wiring 48 is in contact with the active layer 30 in a region between a portion where the active layer 30 overlaps the gate wiring 32 and a portion where the active layer 30 overlaps the gate wiring 34. Furthermore, the wiring 48 is in contact with the active layer 31 in a region between a portion where the active layer 31 overlaps the gate wiring 33 and a portion where the active layer 31 overlaps the gate wiring 34.

Also, the wiring 45 is in contact with the active layer 31 in one region that is not overlapped with the other gate wirings when the active layer 31 is divided into two regions across the portion where the active layer 31 overlaps the gate wiring 33.

In this way, according to the circuit diagram of FIG. 9B, the wirings 42 to 49 are manufactured to thereby attain the D-flip-flop circuit as shown in FIG. 10B or FIG. 39B.

Note that in this embodiment, an example has been described in which the D-flip-flop circuit is configured by using the basic cells of FIGS. 9A, 10A and 39A, but the present invention is not limited to this circuit configuration. The configuration of the basic cell is not limited to those shown in FIGS. 9A, 10A and 39A, but may be appropriately designed by a designer. Further, the circuit or logic element formed based on the basic cells is not limited to the D-flip-flop circuit, and another circuit or logic element can be also manufactured. At this time, it is not required to use all the TFTs in the basic cells for designing the circuit or logic element and thus only a part of the TFTs in the basic cells may be used for forming the circuit or logic element. Moreover, the basic cells with the configurations as shown in FIGS. 9A, 10A and 39A and various basic cells with other configurations are formed on the substrate in advance and the basic cells with the various configurations may be used to form the logic element or circuit.

With the above-mentioned configuration, in the present invention, when the specification of the circuit is changed, it is sufficient to change only the design of wirings connecting the TFTs or logic elements prepared in advance and the circuit design. Therefore, only the change of two masks suffices therefor. Accordingly, it is possible to reduce the cost involved in the design change of the circuit and also to manufacture the circuit of the various specifications.

This embodiment can be implemented freely in combination with Embodiment 1 or 2.

(Embodiment 5)

In this embodiment, a description will be given of an example in which the terminals and the nodes of the basic cells shown in FIG. 9A, 10A, and 39A are connected appropriately through the wirings formed in a layer different from a layer where the active layers and the gates are formed to thereby attain NAND.

Figure 11A:
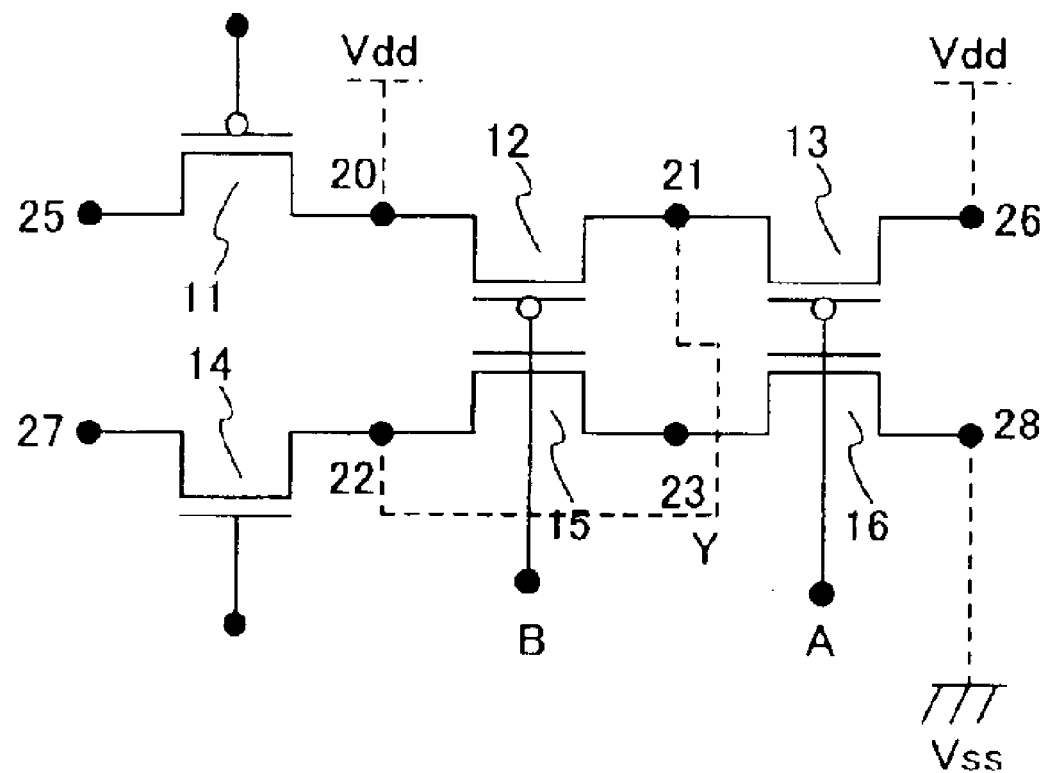
FIGS. 11A and 11B are circuit diagrams showing an NAND circuit formed by using the basic cell of FIGS. 9A to 9C.

FIG. 11A is a circuit diagram showing a NAND circuit formed based on the basic cells of FIG. 9A. In FIG. 11A, the nodes 21 and 22 in the basic cells of FIG. 9A are connected to each other. Also, the voltage Vdd is applied to the node 20 and the terminal 26, whereas the voltage Vss is applied to the terminal 28. Here, Vdd>Vss.

Figure 11B:
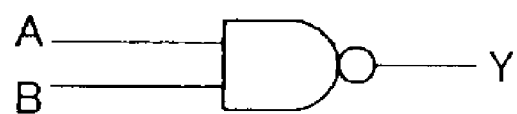

FIG. 11B is an equivalent circuit diagram of FIG. 11A.

Figure 12:
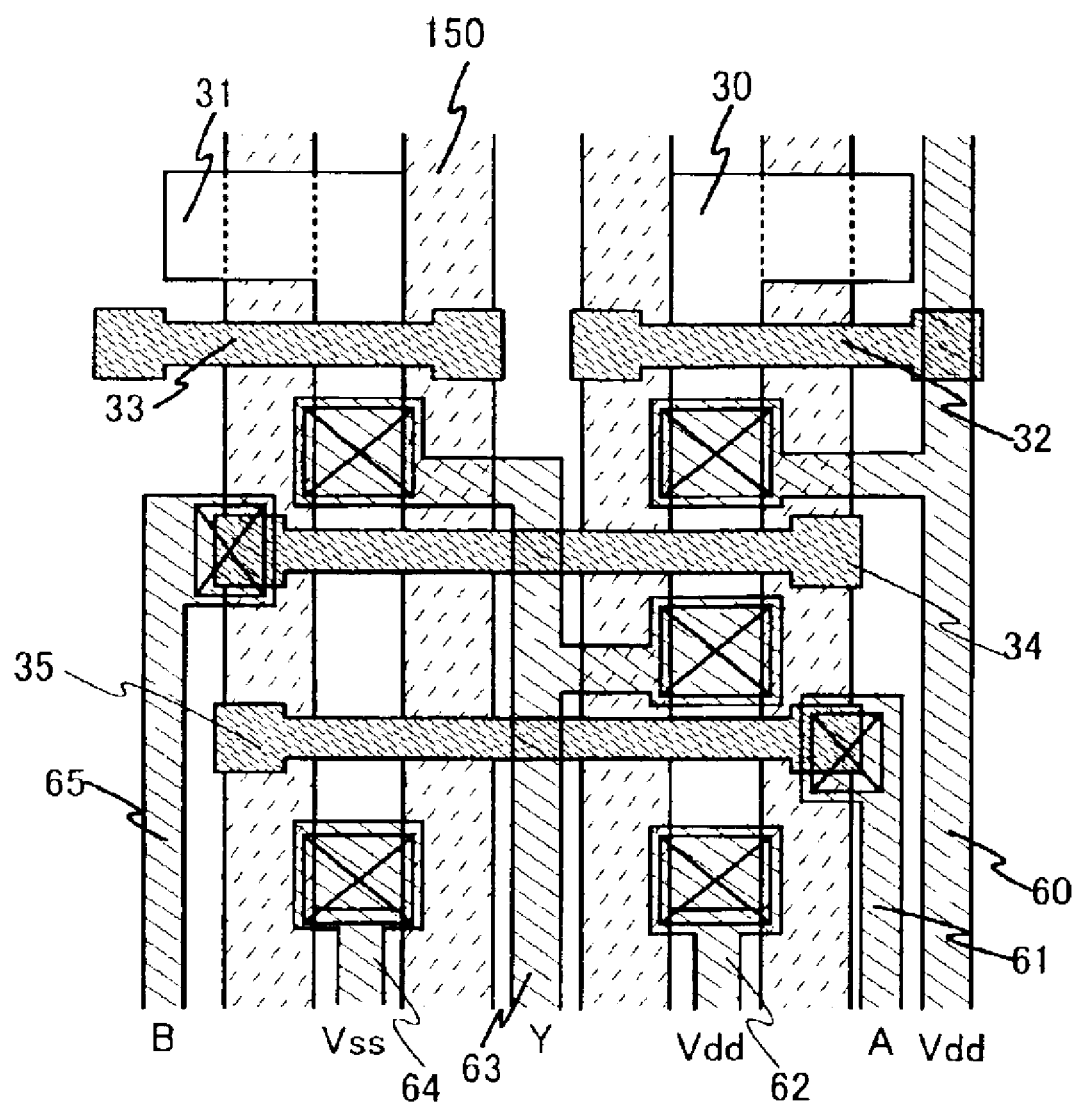
FIG. 12 is a top view showing an NAND circuit formed by using the basic cell of FIGS. 10A and 10B.
Figure 40:
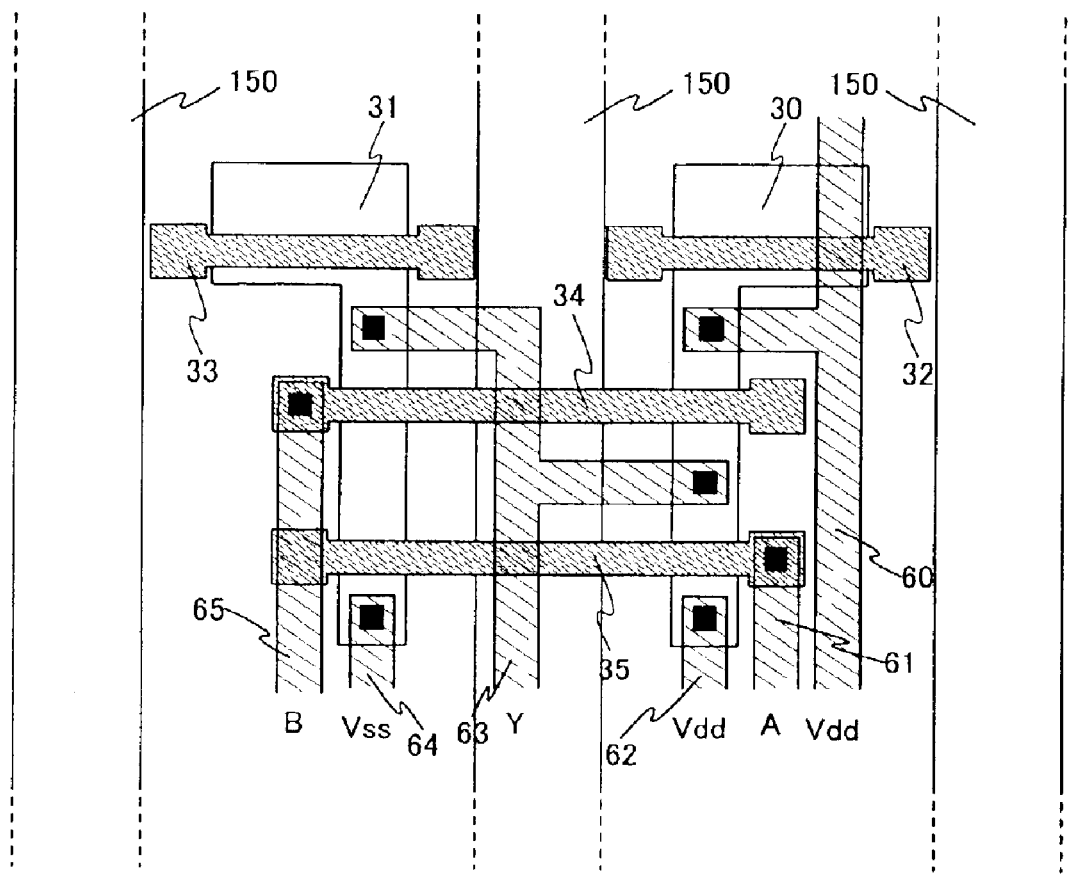
FIG. 40 is a top view showing a NAND circuit formed by using the basic cell of FIG. 8.

FIG. 12 is a top view of the NAND circuit formed based on the basic cells of FIG. 10A. FIG. 40 is a top view of the NAND circuit formed based on the basic cells of FIG. 39A. An interlayer insulating film (not shown) is formed so as to cover the active layers 30, 31, the gate wirings 32 to 35, and the gate insulating film (not shown). The active layers 30 and 31 are both formed between the projective portions 150 of the base film. Then, on the interlayer insulating film, wirings 60 to 65 are formed in contact with any of the active layers 30, 31 and the gate wirings 32 to 35 through contact holes formed in the interlayer insulating film and the gate insulating film.

Specifically, the wiring 60 overlaps the active layer 30 in one region that is not overlapped with the gate wiring 35 when the active layer 30 is divided into two regions across a portion where the active layer 30 overlaps the gate wiring 34.

The wiring 61 is in contact with the gate wiring 35.

The wiring 62 overlaps the active layer 30 in one region that is not overlapped with the gate wiring 34 when the active layer 30 is divided into two regions across a portion where the active layer 30 overlaps the gate wiring 35.

The wiring 63 is in contact with the active layer 30 in a region between a portion where the active layer 30 overlaps the gate wiring 34 and a portion where the active layer 30 overlaps the gate wiring 35. Further, the wiring 63 is in contact with the active layer 31 in one region that is not overlapped with the gate wiring 35 when the active layer 31 is divided into two regions across a portion where the active layer 31 overlaps the gate wiring 34.

The wiring 64 overlaps the active layer 31 in one region that is not overlapped with the gate wiring 34 when the active layer 31 is divided into two regions across a portion where the active layer 31 overlaps the gate wiring 35.

The wiring 65 is in contact with the gate wiring 34.

In this way, according to the design of FIG. 12, the wirings 60 to 65 are manufactured to thereby manufacture the NAND circuit as shown in FIGS. 11A and 11B.

Note that in this embodiment, an example has been described in which the NAND circuit is configured by using the basic cells of FIGS. 9A, 10A, and 39A, but the present invention is not limited to this circuit configuration. The configuration of basic cell is not limited to those shown in FIGS. 9A, 10A, and 39A but may be appropriately designed by a designer. Further, the circuit or logic element formed based on the basic cells is not limited to the NAND circuit, and another circuit or logic element can be also manufactured. At this time, it is not required to use all the TFTs in the basic cells for designing a circuit or logic element and thus only a part of the TFTs in the basic cells may be used for forming the circuit or logic element. For example, in this embodiment, the p-channel TFT 11 and the n-channel TFT 14 are not used. Further, the basic cells with the configuration shown in FIGS. 9A, 10A, and 39A and various basic cells with other configurations may be formed on the substrate in advance to thereby form the logic element or circuit using the basic cells with various configurations.

This embodiment can be implemented freely in combination with Embodiments 1 to 4.

(Embodiment 6)

In this embodiment, a description will be given of an example in which the terminals and the nodes of the basic cells shown in FIGS. 9A, 10A, and 39A are connected appropriately through the wirings formed in a layer different from a layer where the active layer and the gate are formed to thereby attain NOR.

Figure 13A:
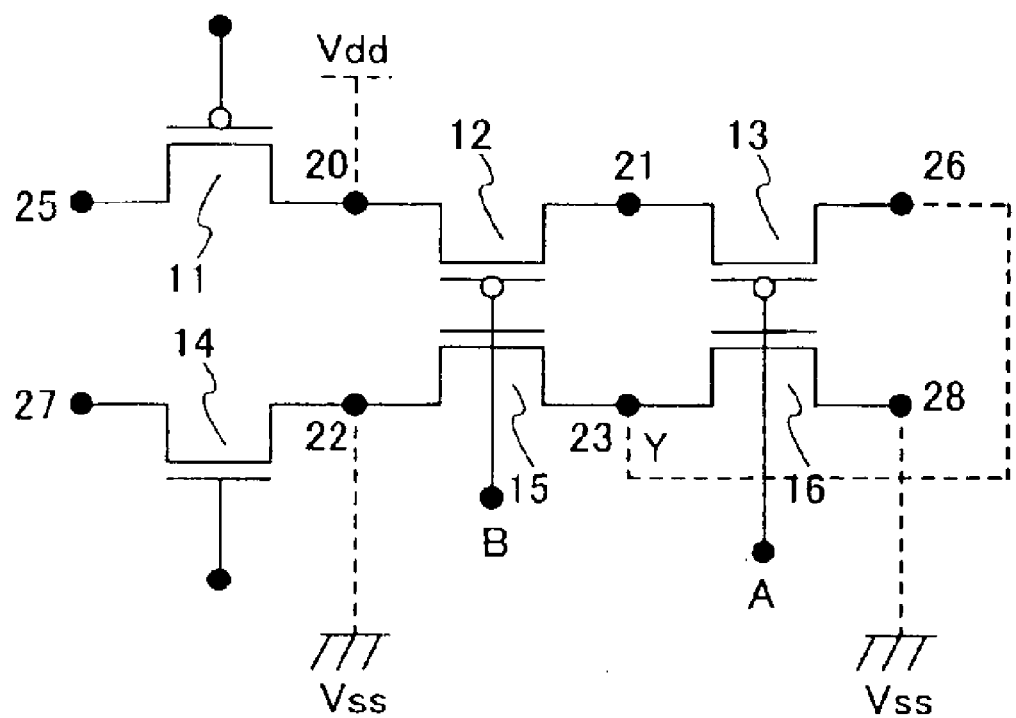
FIGS. 13A and 13B are circuit diagrams showing a NOR circuit formed by using the basic cell of FIGS. 9A to 9C.

FIG. 13A is a circuit diagram showing a NOR circuit formed based on the basic cells of FIG. 9A. In FIG. 13A, the node 23 and the terminal 26 in the basic cells of FIG. 9A are connected to each other. Also, the voltage Vdd is applied to the node 20, whereas the voltage Vss is applied to the node 22 and the terminal 28. Here, Vdd>Vss.

Figure 13B:
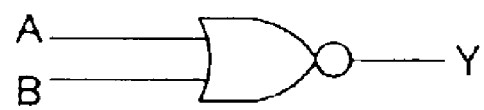

FIG. 13B is an equivalent circuit diagram of FIG. 13A.

Figure 14:
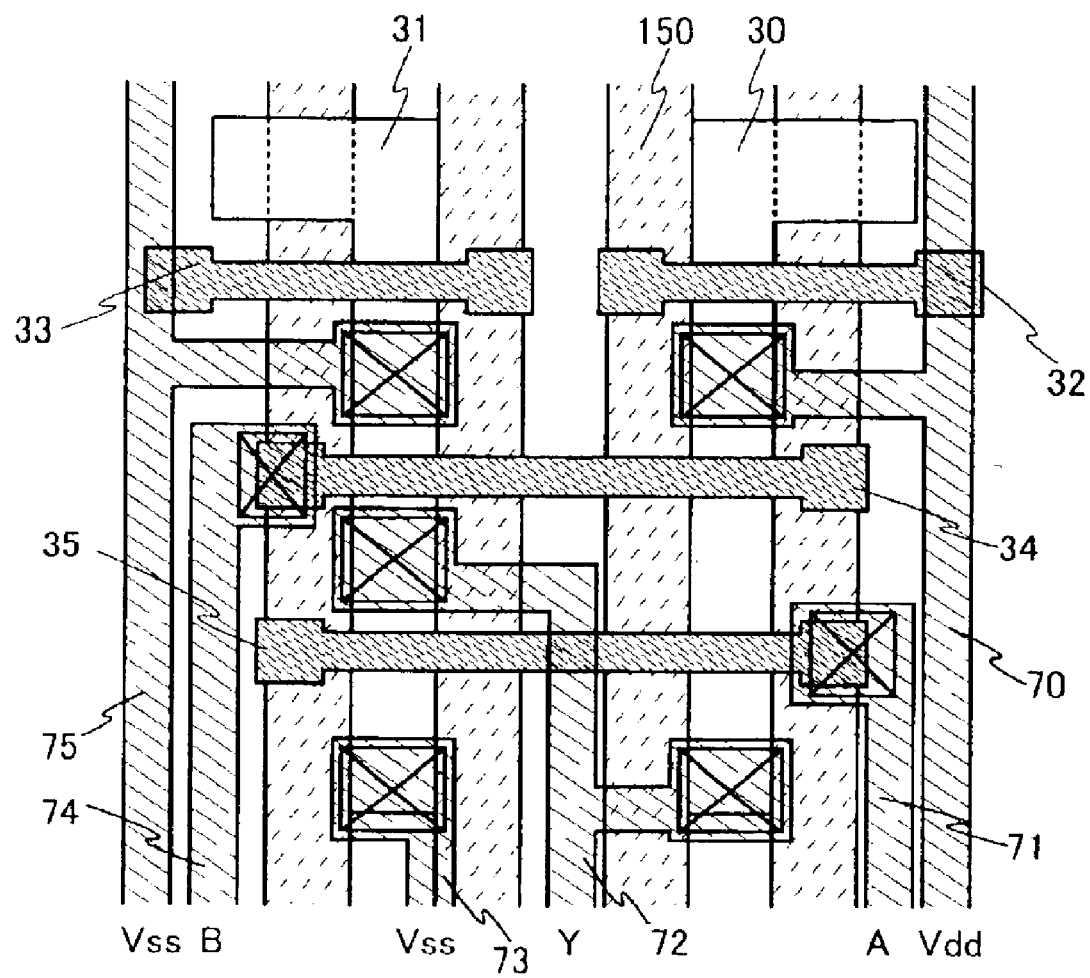
FIG. 14 is a top view of a NOR circuit formed by using the basic cell of FIGS. 10A and 10B.
Figure 41:
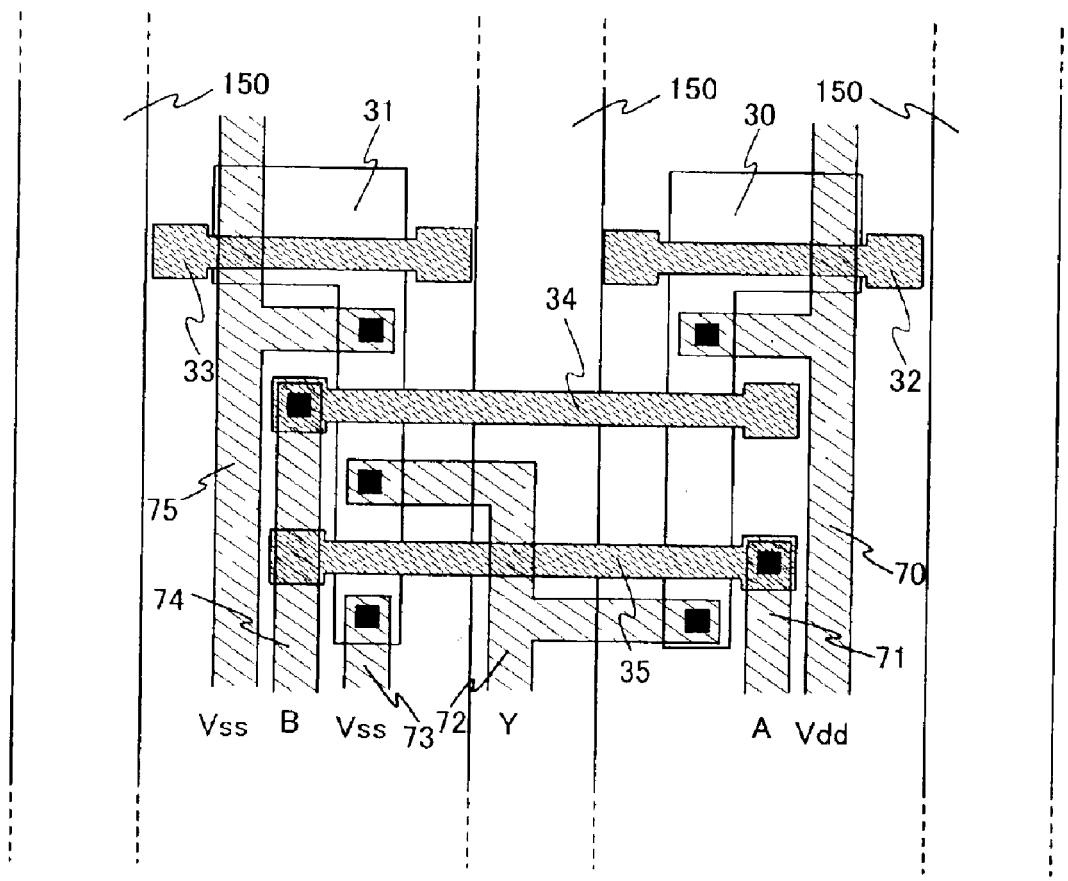
FIG. 41 is a top view showing a NOR circuit formed by using the basic cell of FIG. 8.
Figure 42A:
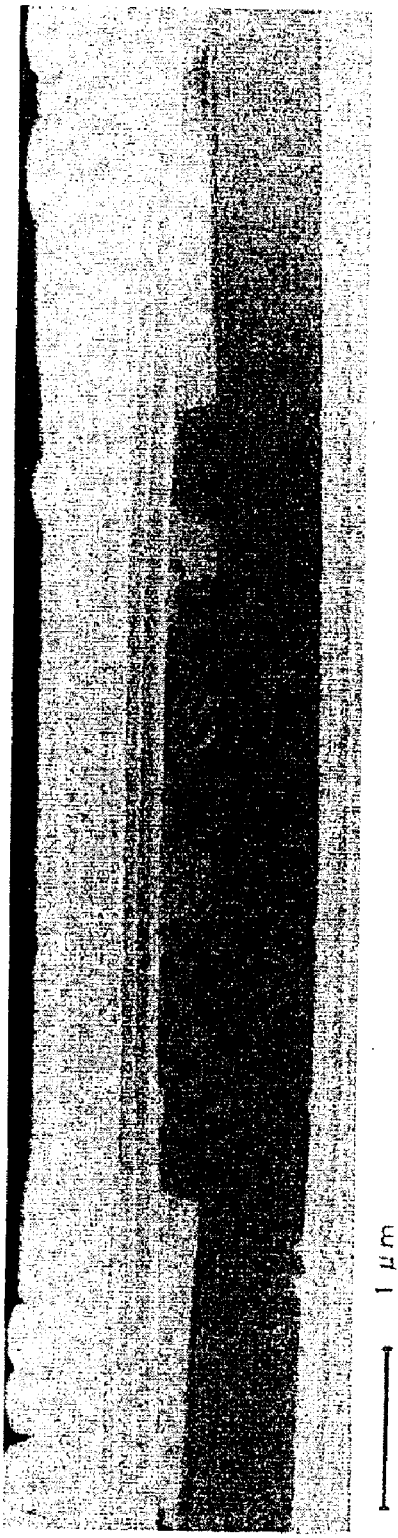
FIGS. 42A and 42B show a TEM sectional image of a semiconductor film formed on a base film having a projective portion after crystallization through laser light irradiation and a schematic diagram thereof, respectively.
Figure 42B:
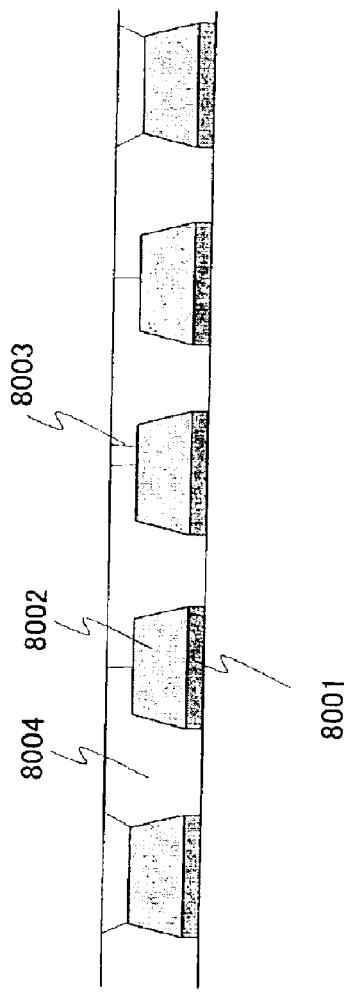

FIG. 14 or FIG. 41 is a top view of the NOR circuit of FIG. 13A. FIG. 14 is a top view of the NOR circuit formed based on the basic cells of FIG. 10A. FIG. 41 is a top view of the NOR circuit formed based on the basic cells of FIG. 39A. An interlayer insulating film (not shown) is formed so as to cover the active layers 30,31, the gate wirings 32 to 35, and the gate insulating film (not shown). The active layers 30 and 31 are both formed between the projective portions 150 of the base film. Then, on the interlayer insulating film, wirings 70 to 75 are formed in contact with any of the active layers 30 and 31 and gate wirings 32 to 35 through contact holes formed in the interlayer insulating film and the gate insulating film.

Specifically, the wiring 70 is in contact with the active layer 30 in one region that is not overlapped with the gate wiring 35 when the active layer 30 is divided into two regions across a portion where the active layer 30 overlaps the gate wiring 34.

The wiring 71 is in contact with the gate wiring 35.

The wiring 72 is in contact with the active layer 30 in one region that is not overlapped with the gate wiring 34 when the active layer 30 is divided into two regions across a portion where the active layer 30 overlaps the gate wiring 35. Further, the wiring 72 is in contact with the active layer 31 in a region between a portion where the active layer 31 overlaps the gate wiring 34 and a portion where the active layer 31 overlaps the gate wiring 35.

The wiring 73 is in contact with the active layer 31 in one region that is not overlapped with the gate wiring 34 when the active layer 31 is divided into two regions across a portion where the active layer 31 overlaps the gate wiring 35.

The wiring 74 is in contact with the gate wiring 34.

The wiring 75 is in contact with the active layer 31 in one region that is not overlapped with the gate wiring 35when the active layer 31 is divided into two regions across a portion where the active layer 31 overlaps the gate wiring 34.

In this way, according to the circuit diagram of FIG. 14, the wirings 70 to 75 are manufactured to thereby manufacture the NOR circuit as shown in FIG. 14 and FIG. 41.

Note that in this embodiment, an example has been described in which the NOR circuit is configured by using the basic cells of FIGS. 9A, 10A, and 39A, but the present invention is not limited to this circuit configuration. The configuration of basic cell is not limited to those shown in FIGS. 9A, 10A, and 39A but may be appropriately designed by a designer. Further, the circuit or logic element formed based on the basic cells is not limited to the NOR circuit, and another circuit or logic element can be manufactured. At this time, it is not required to use all the TFTs in the basic cells for designing a circuit or logic element and thus only a part of the TFTs in the basic cells may be used for forming the circuit or logic element. For example, in this embodiment, the p-channel TFT 11 and the n-channel TFT 14 are not used. Further, the basic cells with the configurations shown in FIGS. 9A, 10A, and 39A and various basic cells with other configurations may be formed on the substrate in advance to thereby form the logic element or circuit using the basic cells with various configurations as well.

This embodiment can be implemented in combination with Embodiments 1 to 5.

(Embodiment 7)

In this embodiment, a description will be made of a position of a marker formed simultaneously with the island-like semiconductor film.

Figure 15:
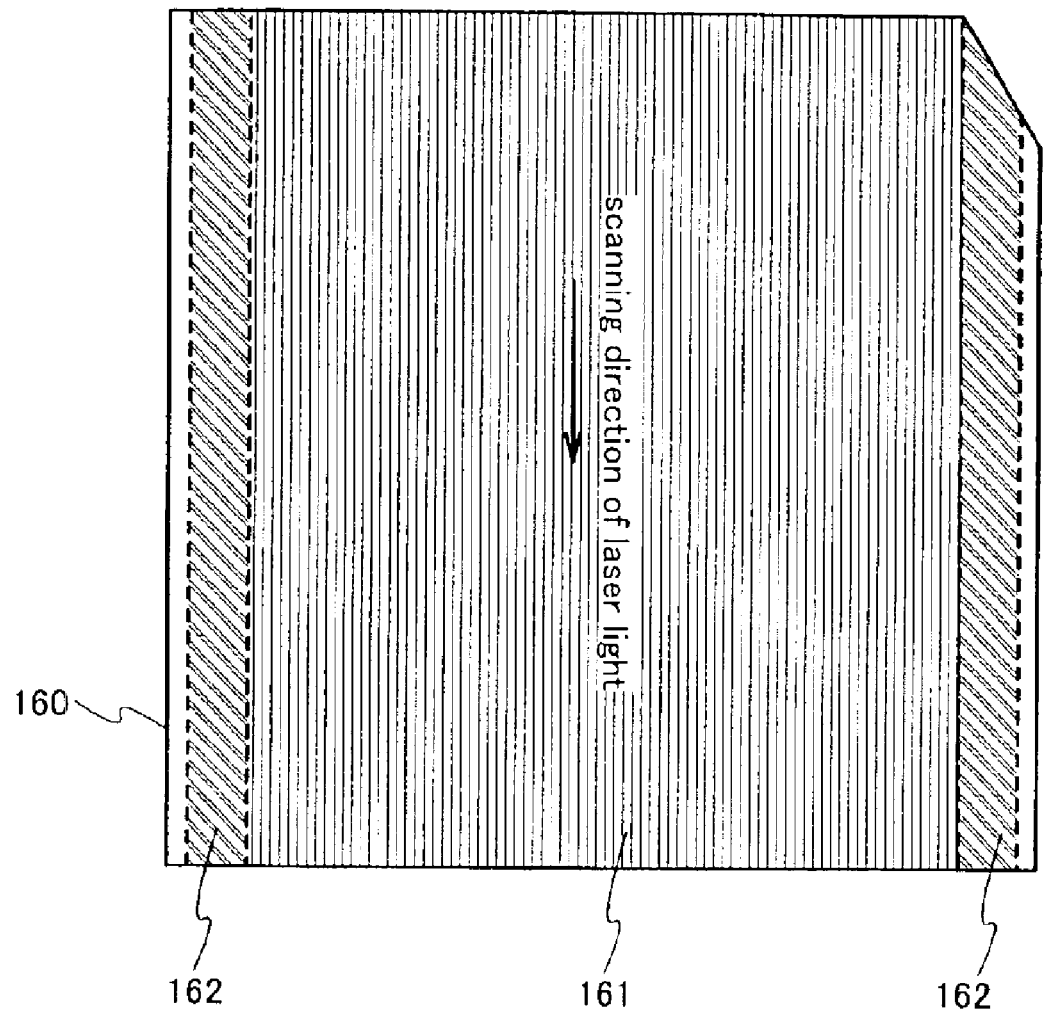
FIG. 15 shows a position of a marker formation region on a substrate.

The marker formed simultaneously with the island-like semiconductor film is used as a reference for alignment of masks for the gate electrode formed later. FIG. 15 is a top view of a substrate 160 on which the semiconductor film is formed. In the figure, indicated by the arrow is a scanning direction of the laser light. Reference numeral 161 denotes a region to which laser light is irradiated (laser light irradiation region)

In this embodiment, regions (marker formation regions) 162 where the markers are formed are formed on both sides of the laser light irradiation region 161 and used for preventing the laser light irradiation to the markers.

When the makers are formed by using the semiconductor film for alignment of the masks, if the marker is irradiated with the laser light, the maker may change its shape in the vicinity of edge portions as compared with the shape before the laser light irradiation. Thus, by preventing the laser light irradiation to the markers, the change in shape of the marker can be avoided and the alignment thereof can be performed in the subsequent steps with precision.

This embodiment can be implemented in combination with Embodiments 1 to 6.

(Embodiment 8)

In this embodiment, a description will be made of a structure of a controller of a semiconductor display device formed according to the manufacturing method of the present invention. Note that in this embodiment, a structure of the controller of a light emitting device using an OLED (organic light emitting device) will be described. However, the present invention is not limited to this but may adopt a controller of the liquid crystal display device and those of other semiconductor display devices. Also, it may be a drive circuit other than the controller and a semiconductor device other than the display device is also possible.

Figure 16:
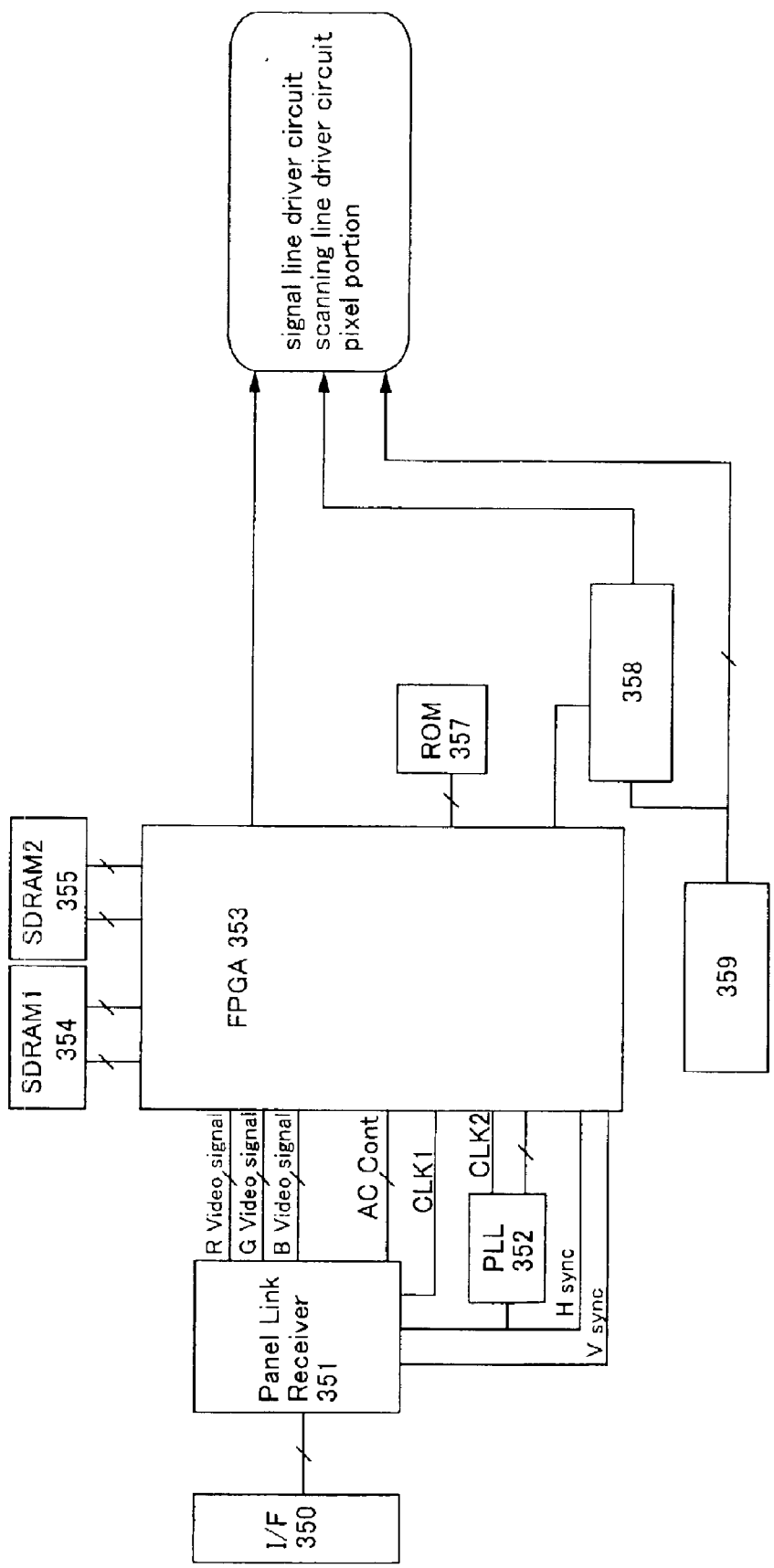
FIG. 16 is a block diagram showing a structure of a controller of a light emitting device as an example of a semiconductor device according to the present invention.

FIG. 16 shows the structure of the controller of this embodiment. The controller includes an interface (I/F) 350, a panel link receiver 351, a phase locked loop (PLL) 352, a signal converting portion (FPGA: field programmable logic device) 353, SDRAMs (synchronous dynamic random access memories) 354 and 355, a ROM (read only memory) 357, a voltage adjusting circuit 358, and a power supply 359. Note that in this embodiment, the SDRAM is used, but a DRAM (dynamic random access memory) or an SRAM (static random access memory) can be also used instead of the SDRAM provided that high-speed data writing and reading are possible.

Digital video signals inputted in the semiconductor display device through the interface 350 are subjected to parallel/serial conversion at the panel link receiver 351 into digital video signals corresponding to the respective colors of R, G, and B, which are inputted into the signal converting portion 353.

Also, based on the various signals inputted to the semiconductor display device through the interface 350, an Hsync signal, a Vsync signal, a clock signal CLK, and an alternating voltage are generated at the panel link receiver 351 and inputted to the signal converting portion 353.

The phase locked loop 352 has a function of making in-phase the frequencies of various signals inputted to the semiconductor display device and the operating frequency of the signal converting portion 353. The operating frequency of the signal converting portion 353 does not always conform with the frequencies of the various signals inputted to the semiconductor display device. The phase locked loop 352 adjusts the operating frequency of the signal converting portion 353 in synchronism with the frequencies of the various signals.

The ROM 357 stores a program for controlling the operation of the signal converting portion 353 and the signal converting portion 353 operates according to the program.

The digital video signals inputted to the signal converting portion 353 are temporarily written into the SDRAMs 354 and 355 and held. The signal converting portion 353 reads the digital video signals corresponding to all the pixels on a bit basis among the digital video signals of all bits held in the SDRAM 354. The read signals are inputted to the signal line drive circuit.

The signal converting portion 353 inputs information on the length of the light emission period of the OLED corresponding to each bit into the scanning line drive circuit.

The voltage adjusting circuit 358 adjusts the voltage applied between the anode and the cathode of the OLED of each pixel in synchronism with the signal inputted from the signal converting portion 353. The power supply 359 supplies the voltage at a given level to the voltage adjusting circuit 358, the signal line drive circuit, the scanning line drive circuit, and the pixel portion.

Among the various circuits in the controller, any circuit, if obtained by using the TFTs, can be formed according to the manufacturing method of the present invention.

The drive circuit and the controller used in the present invention are not limited to the structures described in this embodiment. This embodiment can be implemented freely in combination with Embodiments 1 to 7.

(Embodiment 9)

A method of forming a base film having unevenness is explained in Embodiment 9. Incidentally, the base film described in this embodiment is only one example and the base film used in the present invention is not limited to this.

Figure 17A:
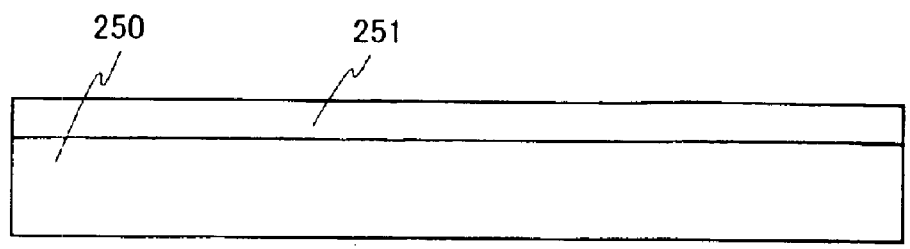
FIGS. 17A to 17D show a manufacturing method for a base film having a projective portion.

A first base film 251 made form an insulating film is first formed on a substrate 250 as shown in FIG. 17A. The first base film 251 uses silicon oxynitride in this embodiment but is not limited to this material, and insulating films having a large selectivity in etching with a second base film may be used. The first base film 251 is formed by a CVD apparatus using $SiH_4$ and $N_2O$ so that its thickness is from 50 to 200 nm. Note that the first base film may be a single layer, and may also be a laminate structure of a plurality of insulating films.

Figure 17B:
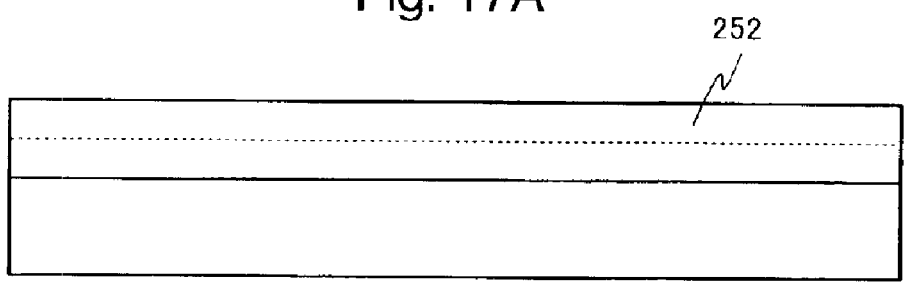

A second base film 252 is formed next from an insulating material that contacts the first base film 251, as shown in FIG. 17B. It is necessary that the film thickness of the second base film 252 be of an order such that unevenness appears in the surface of a semiconductor film formed subsequently when patterning is performed in a later step, forming unevenness. A 30 nm to 300 nm silicon oxide film is formed as the second base film 252 by using plasma CVD in this embodiment.

Figure 17C:
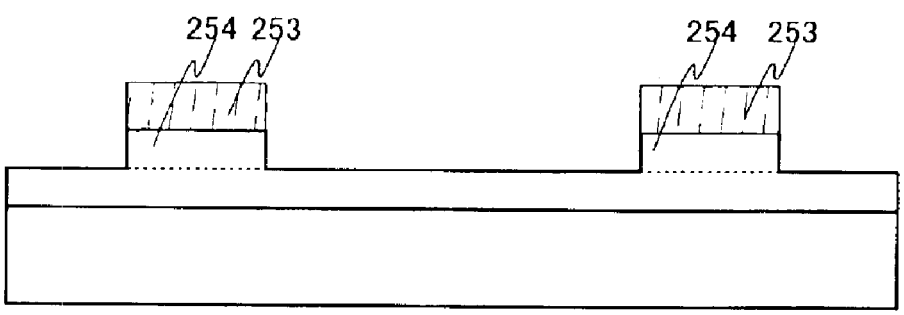
Figure 17D:
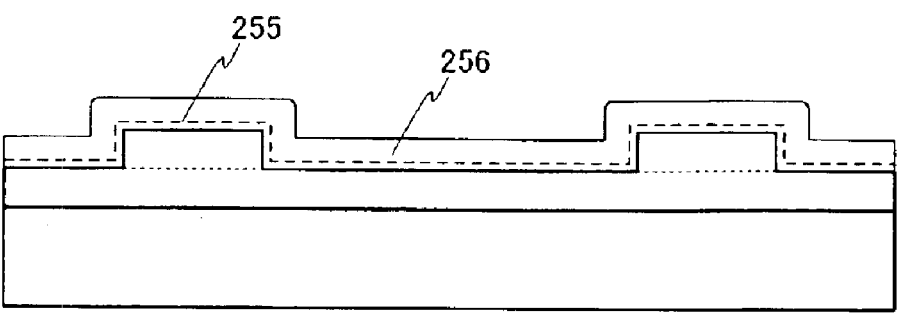

A mask 253 is formed next as shown in FIG. 17C, and the second base film 252 is etched. Note that wet etching is performed at 20° C. in this embodiment, using a mixed solution containing 7.13% ammonium hydrogen fluoride ($NH_4HF_2$) and 15.4% ammonium fluoride ($NH_4F$) (Stella Chemifa Corporation, product name LAL500) as an etchant. Rectangular shape projective portions 254 are formed by this etching. The first base film 251 and the projective portions 253 are taken as one base film in this specification.

Note that it is preferable to pattern the second base film 252 by using RF sputtering in the case where aluminum nitride, aluminum oxynitride, or silicon nitride is used as the first base film 251 and a silicon oxide film is used as the second base film 252. The thermal conductivity of aluminum nitride, aluminum oxynitride, and silicon nitride is high as the first base film 251, and therefore generated heat can quickly diffuse, and TFT deterioration can be prevented.

A semiconductor film is formed next so as to cover the first base film 251 and the projective portions 253. The thickness of the projective portions is from 30 nm to 300 nm in this embodiment, and therefore it is preferable to set the film thickness of the semiconductor film from 50 to 200 nm, and it is set to 60 nm here. Note that adverse influences are imparted to the semiconductor film crystallinity if impurities mix in between the semiconductor film and the base film. There is a possibility that dispersions in the characteristics of the manufactured TFTs, and that variations in the threshold values may increase, and therefore it is preferable to form the base film and the semiconductor film in succession. A silicon oxide film 255 forms thinly on the base film in Embodiment 9 after forming the first base film 251 and the projective portions 253, and the semiconductor film 256 is then formed without exposure to the outside atmosphere. The thickness of the silicon oxide film can be suitably set by a designer, and is set on the order of 5 nm to 30 nm in Embodiment 9.

Figure 18A:
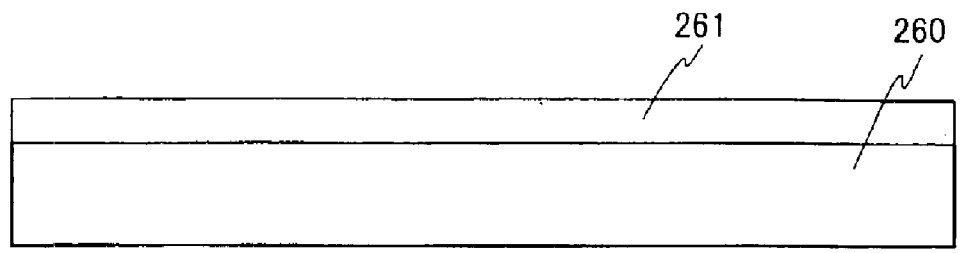
FIGS. 18A to 18C show a manufacturing method for a base film having a projective portion.

A method of forming a base film that differs from that of FIG. 17 is explained next. A first insulating film 261 made from an insulating film is first formed on a substrate 260 as shown in FIG. 18A. The first base film 261 is formed by a silicon oxide film, a silicon nitride film, a silicon oxynitride film, or the like.

If a silicon oxide film is used, it can be formed by plasma CVD by mixing tetraethyl orthosilicate (TEOS) and $O_2$, at a reaction pressure of 40 Pa, at a substrate temperature of 300 to 400° C., and by discharging at a high frequency (13.56 MHz) electric power density of 0.5 to 0.8 W/cm$^2$. If a silicon oxynitride film is used, it may be formed by a silicon oxynitride film manufactured by plasma CVD from $SiH_4$, $N_2O$, and $NH_3$, or by a silicon oxynitride film manufactured by plasma CVD from $SiH_4$ and $N_2O$. The manufacturing conditions in this case are that formation can occur at a reaction pressure of 20 to 200 Pa, a substrate temperature of 300 to 400° C., and a high frequency (60 MHz) electric power density of 0.1 to 1.0 W/cm$^2$. Further, a hydrogen silicon oxynitride film manufactured from $SiH_4$, $N_2O$, and $H_2$ may also be applied. It is possible to manufacture silicon nitride films similarly by plasma CVD using $SiH_4$ and $NH_3$.

Figure 18B:
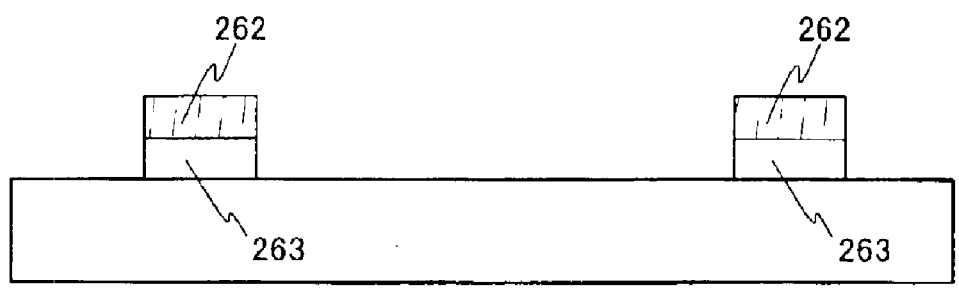
Figure 18C:
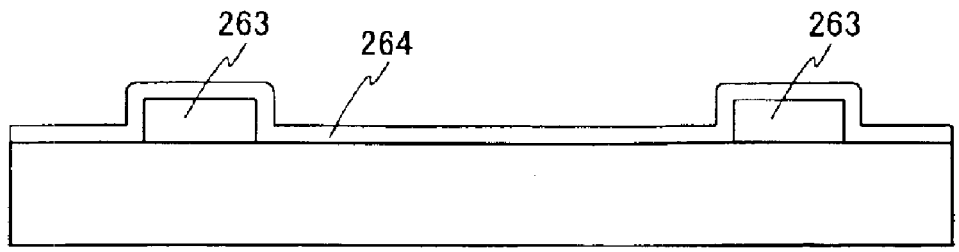

After forming the first base film over the entire substrate to have a thickness of 20 to 200 nm (preferably between 30 and 60 nm), a mask 262 is then formed as shown in FIG. 18B by using a photolithography technique. Unnecessary portions are then removed by etching, thus forming rectangular shape projective portions 263. A dry etching method that uses a fluoride gas with respect to the first base film 261 may be used, and a wet etching method that uses an aqueous solution of a fluoride may be used. In the case where the latter method is selected, etching may be performed by a mixed solution (Stella Chemifa Corporation, product name LAL500) containing 7.13% ammonium hydrogen fluoride ($NH_4HF_2$) and 15.4% ammonium fluoride ($NH_4F$).

A second base film 264 made from an insulating film is formed next so as to cover the projective portions 262 and the substrate 260. This film is formed by using a silicon oxide film, a silicon nitride film, a silicon oxynitride film, or the like at a thickness from 50 to 300 nm (preferably from 100 to 200 nm), similar to the first base film 261.

A base film composed of the projective portions 262 and the second base film 264 is formed in accordance with the above manufacturing processes. Note that impurities can be prevented from mixing in between the semiconductor film and the base film by forming the semiconductor film in succession, without exposure to the atmosphere, after forming the second base film 264.

It is possible to implement Embodiment 9 by being freely combined with Embodiments 1 to 8.

(Embodiment 10)

Figure 19:
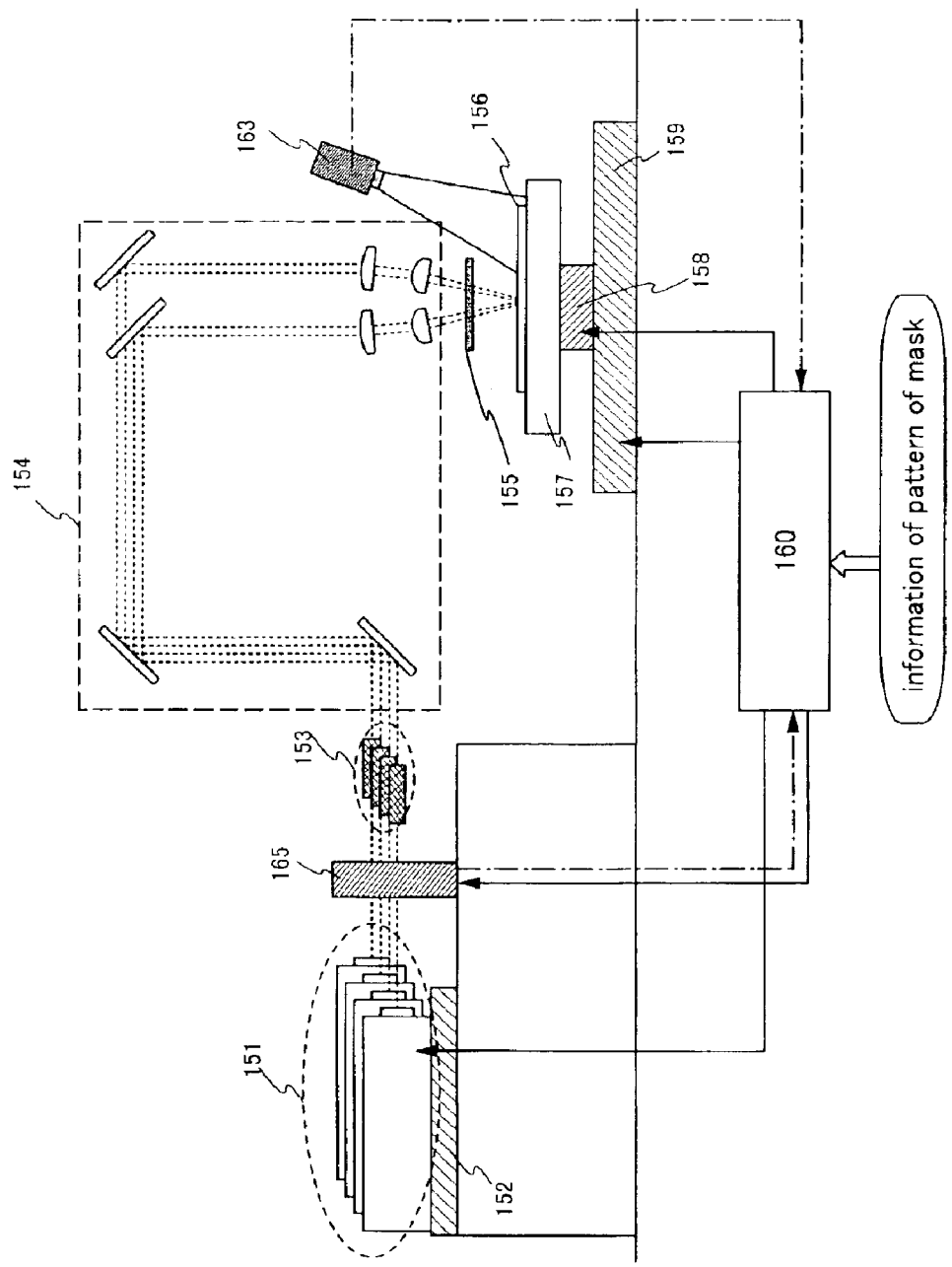
FIG. 19 shows a laser irradiation apparatus.

Next, a description is given with reference to FIG. 19 on the structure of laser irradiation apparatus used in the present invention. Reference symbol 151 denotes laser oscillators. Four laser oscillators are used in FIG. 19 but the number of laser oscillators in the laser irradiation apparatus is not limited thereto.

A chiller 152 may be used to keep the temperature of the laser oscillators 151 constant. Although the chiller 152 is not always necessary, fluctuation in energy of laser light outputted due to a temperature change can be avoided by keeping the temperature of the laser oscillators 151 constant.

Denoted by 154 is an optical system, which changes the path of light emitted from the laser oscillators 151 or manipulates the shape of the laser beam thereof to collect laser light. In the laser irradiation apparatus of FIG. 19, the optical system 154 can also synthesize laser beams of laser light outputted from the plural laser oscillators 151 by partially overlapping the laser beams.

An AO modulator 153 capable of changing the travel direction of laser light in a very short time may be provided in the light path between a substrate 156 that is a processing object and the laser oscillators 151. Instead of the AO modulator, an attenuator (light amount adjusting filter) may be provided to adjust the energy density of laser light.

Alternatively, energy density measuring means 165, namely, means for measuring the energy density of laser light outputted from the laser oscillators 151 may be provided in the light path between the substrate 156 that is a processing object and the laser oscillators 151. Changes with time of measured energy density may be monitored by a computer 160. In this case, output from the laser oscillators 151 may be increased to compensate attenuation in energy density of the laser light.

A synthesized laser beam irradiates through a slit 155 the substrate 156 that is a processing object. The slit 155 is desirably formed of a material that can block laser light and is not deformed or damaged by laser light. The width of the slit 155 is variable and a laser beam can be changed in width by changing the width of the slit.

When laser light emitted from the laser oscillators 151 does not pass through the slit 155, the shape of the laser beam on the substrate 156 is varied depending on the laser type and may be shaped by an optical system.

The substrate 156 is set on a stage 157. In FIG. 19, position controlling means 158 and 159 correspond to means for controlling the position of a laser beam on a processing object. The position of the stage 157 is controlled by the position controlling means 158 and 159.

In FIG. 19, the position controlling means 158 controls the position of the stage 157 in the direction X and the position controlling means 159 controls the position of the stage 157 in the direction Y.

The laser irradiation apparatus of FIG. 19 has the computer 160, which is a central processing unit and at the same time storing means such as a memory. The computer 160 controls oscillation of the laser oscillators 151, determines the laser light scanning path, and controls the position controlling means 158 and 159 to move the substrate to a given position so that a laser beam runs along the scanning path determined.

In FIG. 19, the laser beam position is controlled by moving the substrate. Alternatively, the laser beam position may be moved by an optical system such as a Galvano mirror. The laser beam position may also be controlled by moving both the substrate and the laser beam.

In FIG. 19, the computer 160 controls the width of the slit 155 so that the laser beam spot width can be changed in accordance with mask pattern information. The slit is not always necessary.

The laser irradiation apparatus may also have means for adjusting the temperature of a processing object. A damper may also be provided to prevent reflected light from irradiating a portion that should avoid laser irradiation since laser light is highly directional and has high energy density. Desirably, the damper is absorptive of reflected light. Cooling water may be circulated inside the damper to avoid a temperature rise of the partition wall due to absorption of reflected light. The stage 157 may be provided with means for heating a substrate (substrate heating means).

If a laser is used to form a marker, a laser oscillator for a marker may be provided. In this case, oscillation of the laser oscillator for a marker may be controlled by the computer 160. Another optical system is needed when the laser oscillator for a marker is provided in order to collect laser light outputted from the laser oscillator for a marker. The laser used to form a marker is typically a YAG laser, a $CO_2$ laser etc., but it is needless to say that other lasers may be employed instead.

One, or more if it is necessary, CCD camera(s) 163 may be provided for positioning that uses a marker. A CCD camera refers to a camera using a CCD (charge-coupled device) as an image pickup device.

Instead of forming a marker, the CCD camera(s) 163 may be used to recognize the pattern of the insulating film or semiconductor film for positioning of the substrate. In this case, insulating film or semiconductor film pattern information by a mask which is inputted to the computer 160 and the actual insulating film or semiconductor film pattern information collected by the CCD camera(s) 163 are checked against each other to grasp the substrate position information. In this case, a marker may not be provided separately. Alternatively, the shape of the marker is not always grasped by using the CCD. For instance, the shape of the marker may be grasped by irradiating the laser light emitted from a laser diode to the insulating film or the semiconductor film and monitoring the reflected light.

Part of laser light entering the substrate is reflected by the surface of the substrate and travels back the same light path it has taken upon entering. This is called return light and has adverse effects such as changing the output and frequency of the laser and damaging the rod. In order to remove such return light and stabilize laser oscillation, an isolator may be provided.

Figure 20:
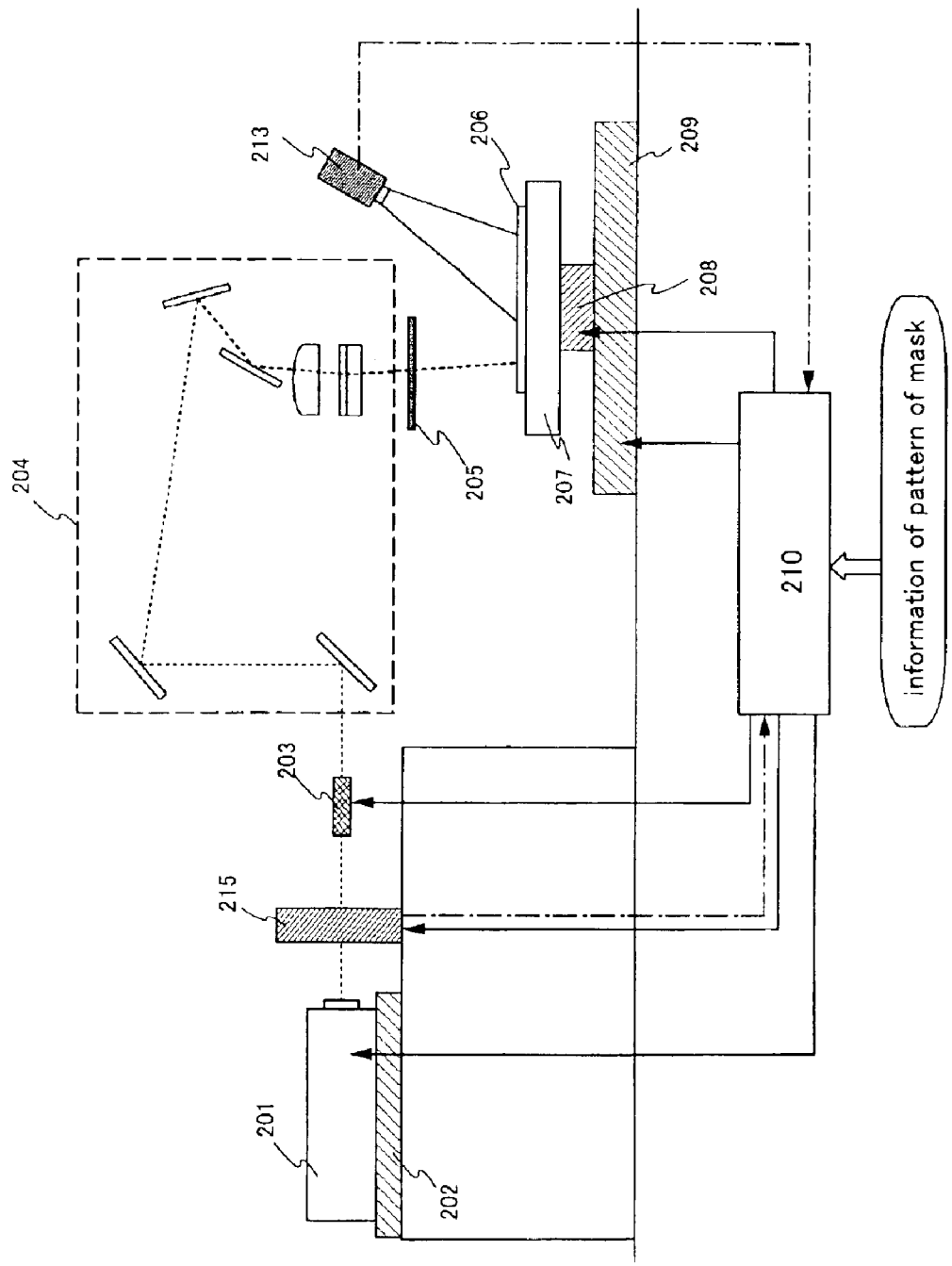
FIG. 20 shows a laser irradiation apparatus.

Although FIG. 19 shows a laser irradiation apparatus structure which has plural laser oscillators, only one laser oscillator may be provided. FIG. 20 shows a laser irradiation apparatus structure which has one laser oscillator. In FIG. 20, 201 denotes a laser oscillator and 202 denotes a chiller. Denoted by 215 is an energy density measuring device, 203, an AO modulator, 204, an optical system, 205, a slit, and 213, a CCD camera. A substrate 206 is set on a stage 207. The position of the stage 207 is controlled by X-direction position controlling means 208 and Y-direction position controlling means 209. Similar to the apparatus shown in FIG. 20, a computer 210 controls operations of the means of this laser irradiation apparatus. The major difference between FIG. 19 and FIG. 20 is that there is one laser oscillator in FIG. 20. Unlike FIG. 20, the optical system 204 only has to have a function of collecting one laser beam.

The present invention runs laser light so as to obtain at least the minimum degree of crystallization of a portion that has to be crystallized, instead of irradiating the entire semiconductor film with laser light. As a result, time for laser irradiation of portions that are removed by patterning after crystallization of the semiconductor film can be saved to greatly shorten the processing time per substrate.

The present embodiment can be implemented by combining with Embodiments 1 to 9.

(Embodiment 11)

This embodiment explains the form of a laser beam combined by superposing together a plurality of laser beams.

Figure 21A:
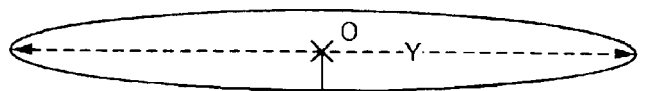
FIGS. 21A to 21D show energy density distribution of a laser beam.

FIG. 21A shows an example of a laser beam form on a subject to be processed in the case that laser light is oscillated from a plurality of laser oscillators without a slit. The laser beam shown in FIG. 21A is elliptic in form. Incidentally, in the invention, the laser beam form of laser light oscillated from the laser oscillator is not limited to the elliptic. The laser beam form is different depending on a laser kind and can be formed by an optical system. For example, the laser light emitted from an XeCl excimer laser (wavelength 308 nm, pulse width 30 ns) L3308 by Lambda is rectangular in form having 10 mm×30 mm (each, width at half maximum in beam profile). The laser light emitted from a YAG laser is circular in form if a rod is cylindrical and rectangular in form if it is a slab type. By further forming such laser light by an optical system, a desired size of laser light can be formed.

Figure 21B:
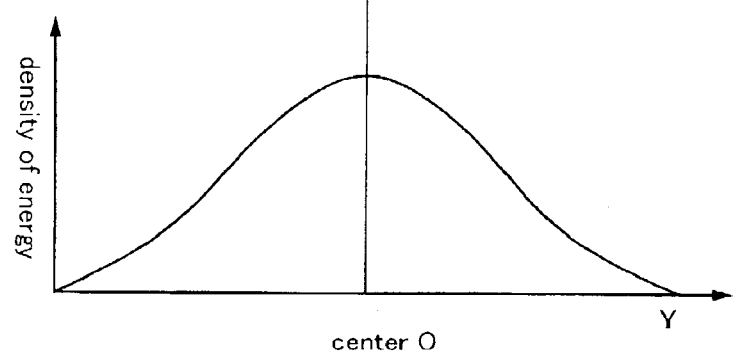

FIG. 21B shows an energy density distribution of a laser beam in a major-axis L-direction shown in FIG. 21A. The laser beam shown in FIG. 21A corresponds to a region satisfying $1/e^2$ of the energy density of a peak value in FIG. 21B. The laser light, which is elliptical in form, has an energy density distribution increasing toward an elliptic center O. In this manner, the laser beam has an energy density in a center axis direction following the Gaussian distribution, wherein the region is narrow where energy density is to be determined uniform.

Figure 21C:
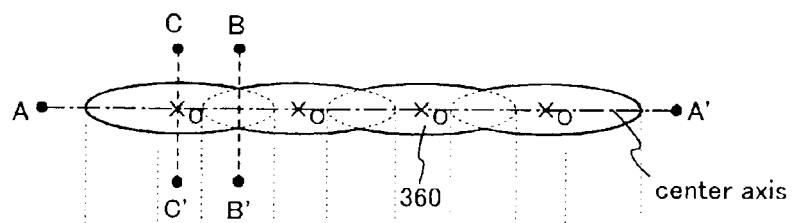

FIG. 21C shows a laser beam form when the laser light having a laser beam of FIG. 21A is combined together. Although FIG. 21C shows the case that four laser-light laser beams are superposed together to form one linear laser beam, the number of laser beams superposed is not limited to that.

As shown in FIG. 21C, the laser beams of laser light are combined together by partly superposed one over another with their major axes placed in coincidence, thereby being formed into one laser beam 360. Note that, hereinafter, a straight line obtained by connecting the ellipse centers o is assumed to be a center axis of the laser beam 360.

Figure 21D:
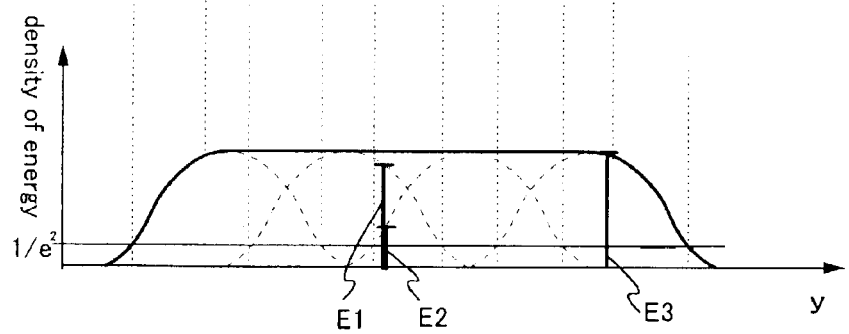

FIG. 21D shows the laser-light energy density distribution in a center-axis y-direction of a combined laser beam. Incidentally, the laser beam shown in FIG. 21C corresponds to a region satisfying $1/e^2$ of energy density of a peak value in FIG. 21B. Energy density is added on in the overlapped areas of the uncombined laser beams. For example, adding the energy densities E1 and E2 together of the overlapped beams as shown in the figure, it becomes nearly equal to a peak value E3 of beam energy density. Thus, energy density is flattened between the elliptic centers o.

Incidentally, the addition of E1 and E2 together, ideally, equals to E3, practically an equal value is not necessarily obtainable. It is possible for the designer to appropriately set an allowable range of deviation between the added value of E1 and E2 and the value of E3.

With the use of a single laser beam, the energy density distribution follows the Gaussian distribution. Accordingly, it is difficult to irradiate an even energy density of laser light to the entire of a semiconductor film contacting with the flat region of insulating film or a part to be made into an island. However, as can be seen from FIG. 21D, by superposing together a plurality of laser light to mutually compensate for the regions low in energy density, the region having a uniform energy density is broadened rather than the single use thereof without superposing a plurality of laser light. This can efficiently enhance the crystallinity of a semiconductor film.

Although the energy density distribution on B–B' is somewhat smaller than the one on C–C', these can be considered to be substantially the same in magnitude. The combined laser beam, in a region satisfying an energy density of $1/e^2$ of a peak value of an uncombined laser beam, can be considered as linear in form.

Figure 22:
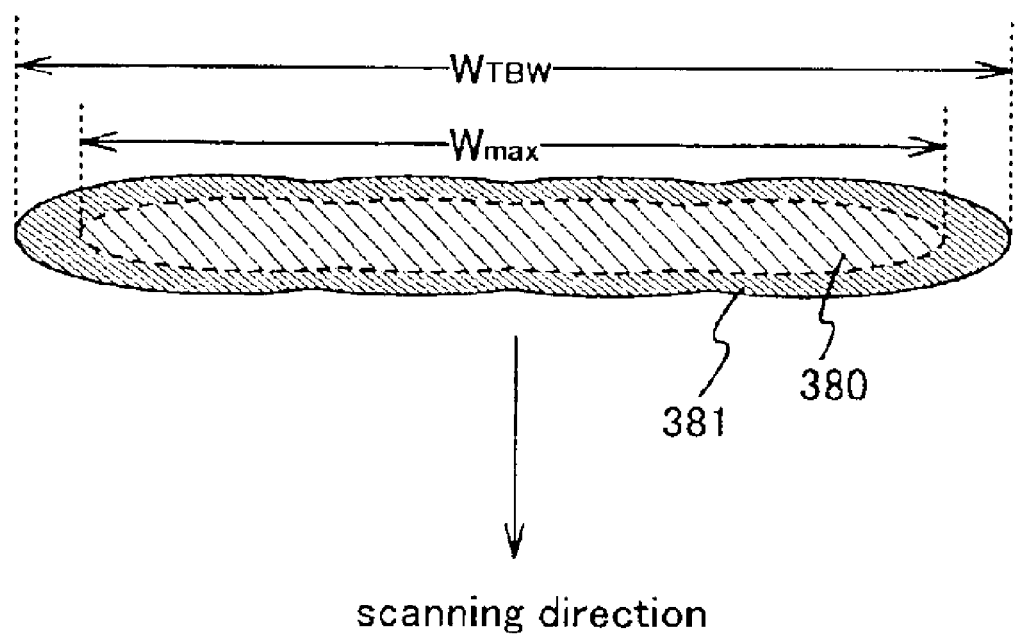
FIG. 22 shows show energy density distribution of a laser beam.

FIG. 22 shows an energy distribution of a combined laser beam. The region denoted by 380 is a region where energy density is to be determined uniform while the region shown at 381 is a region having a low energy density. In FIG. 22, it is assumed that the laser beam has a length in a center axis direction of $W_{TBW}$ while the region 380 having a uniform energy density has a length in a center axis direction of $W_{max}$. As $W_{TBW}$ increases greater as compared to $W_{max}$, the ratio of the region 381 uneven in energy density not to be used in crystallizing a semiconductor film increases relatively to the region 380 uniform in energy density to be used in crystallization. The semiconductor film irradiated only by the region 381 uneven in energy density has fine crystals, thus being not well in crystallinity. Consequently, there arises a necessity to define a layout of scanning route and insulating film depression-projection such that the region of semiconductor film to be made into an island is not superposed with only the region 381. This restriction increases furthermore as the ratio of region 381 to region 380 increases. Accordingly, it is effective to use a slit to prevent only the region 381 uneven in energy density from being irradiated to the semiconductor film formed on the insulating film depression part or projection part, in respect of decreasing the restriction occurring upon providing a layout of scanning route and insulating film depression-projection.

This embodiment can be implemented by combining with Embodiments 1 to 10.

(Embodiment 12)

In this embodiment, optical systems of the laser irradiation apparatus used in the present invention and a positional relationship between each optical system and slits will be described.

The laser light having an elliptical laser beam exhibits the energy density distribution in the direction vertical to the scanning direction according to Gaussian distribution, so that the ratio of the region where the energy density is low in the entire region is higher than that of the laser light having a rectangular or linear beam. Thus, in the present invention, it is desirable that the laser beam of the laser light has a rectangular or linear shape by which the energy density exhibits the relatively uniform distribution.

Figure 23:
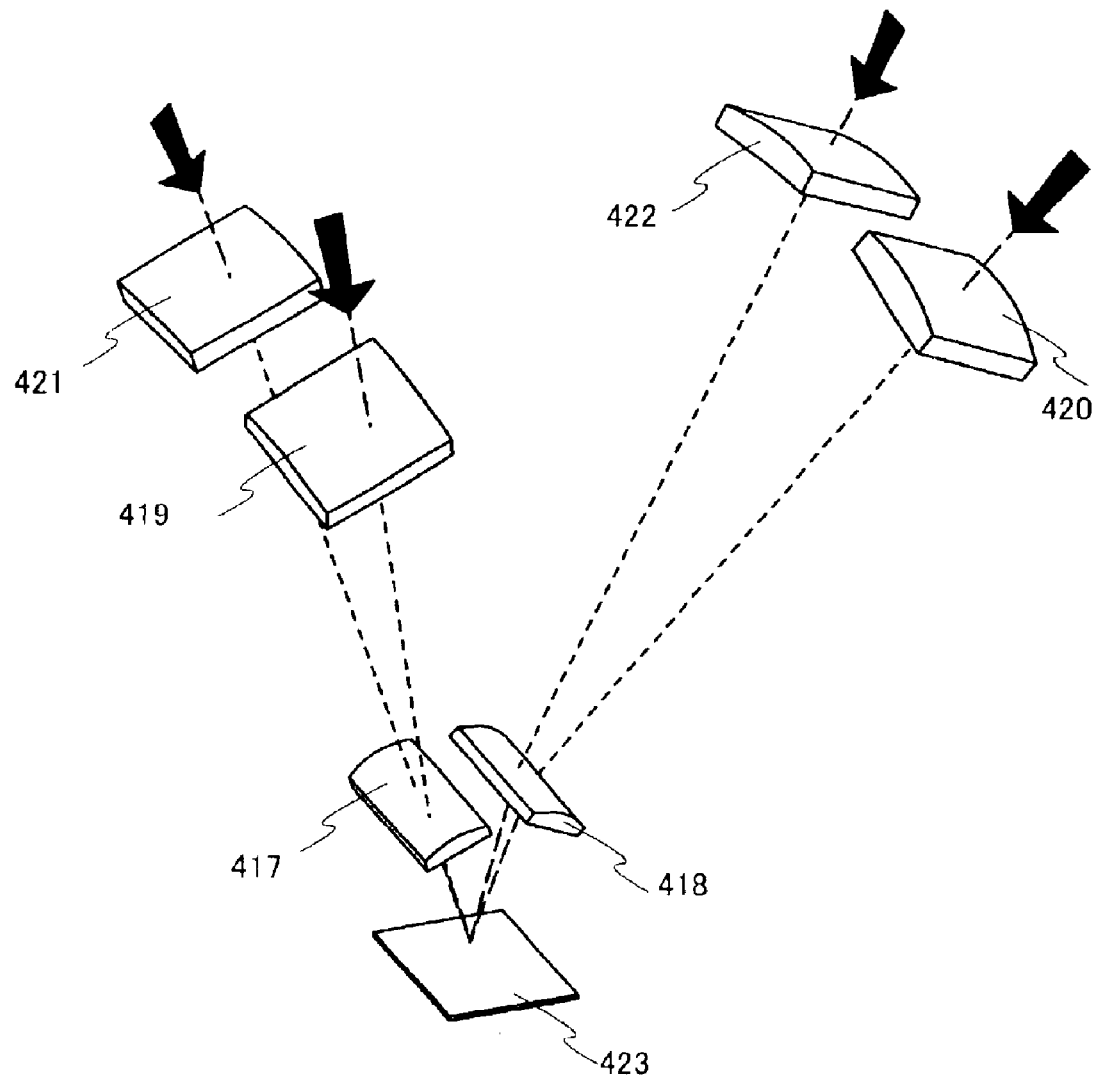
FIG. 23 shows an optical system.

FIG. 23 shows an optical system when the four laser beams are synthesized into one laser beam. The optical system of FIG. 23 has six cylindrical lenses 417 to 422. The four laser lights incident from the direction of the arrow enter each of the four cylindrical lenses 419 to 422. The two laser lights shaped in the cylindrical lenses 419 and 421 are subjected to laser beam shaping again in the cylindrical lens 417 and irradiated onto an object to be processed 423. On the other hand, the two laser lights shaped in the cylindrical lenses 420 and 422 are subjected to laser beam shaping again in the cylindrical lens 418 and irradiated onto the object to be processed 423.

The laser beams of laser lights at the object to be processed 423 are synthesized into one laser beam while partially overlapped with each other.

The focal distance and the incident angle of each lens can be set by the designer as appropriate, but the focal distances of the cylindrical lenses 417 and 418 closest to the object to be processed 423 should be set smaller than those of the cylindrical lenses 419 to 422. For example, the focal distances of the cylindrical lenses 417 and 418 closest to the object to be processed 423 are each set to 20 mm and those of the cylindrical lenses 419 to 422 are each set to 150 mm. The incident angle of the laser light from the cylindrical lenses 417 and 418 to the object to be processed 423 is set to 25° in this embodiment. Further, each lens is arranged such that the incident angle of the laser light from the cylindrical lenses 419 to 422 to the cylindrical lenses 417 and 418 is set to 10°. Also, in order to avoid a return light as well as to perform uniform irradiation, it is desirable that the incident angle of the laser light to the substrate is kept larger than 0°, desirably kept at 5° to 30°.

FIG. 23 shows an example in which the four laser beams are synthesized and in this case, there are provided four cylindrical lenses each corresponding to four laser oscillating apparatuses and two cylindrical lenses corresponding to the four cylindrical lenses. The number of laser beams to be synthesized is not limited to this, but may be 2 or more and 8 or less. In the case of synthesizing n laser beams (n=2, 4, 6, and 8), there are provided n cylindrical lenses each corresponding to n laser oscillating apparatuses and n/2 cylindrical lenses corresponding to the n cylindrical lenses. In the case of synthesizing n laser beams (n=3, 5, and 7), there are provided n cylindrical lenses each corresponding to n laser oscillating apparatuses and (n+1)/2 cylindrical lenses corresponding to the n cylindrical lenses.

When the five or more laser beams are overlapped, considering the arrangement position of the optical systems, interference thereof, etc., the fifth laser light and the subsequent laser lights are desirably irradiated from the opposite side of the substrate. In this case, the slit should be provided also on the opposite side of the substrate. Also, it is necessary that the substrate has a transmission property.

Note that, in order to prevent the return light from backtracking along the optical path, the incident angle with respect to the substrate is desirably kept at 0° or more and 90° or less.

Further, for the purpose of realizing the uniform laser light irradiation, the following is conceivable. That is, it is assumed that one of the surface including shorter side of the shape of each laser beam before synthesization regarded as rectangle and the surface including the longer side thereof is defined as the incident surface, the surface constituting a plane vertical to the irradiation surface. Then, the incident angle $\phi$ of the laser light desirably meets $\phi$ arctan (W/2d) provided that W represents a length of the shorter or longer side included in the incident surface and d represents a thickness of the substrate placed on the above irradiation surface with the transmission property with respect to the laser light. The equation discussed above should be established for individual laser lights before synthesization. Note that when the laser light trajectory is not observed on the incident surface, the trajectory is projected onto the incident surface and the incident angle thereof is assumed as $\phi$. If the laser light is incident thereon at this incident angle $\phi$, the interference of the reflected light on the substrate surface with the reflected light from the rear side of the substrate does not occur. Thus, the uniform laser light irradiation can be performed. The above has been discussed on the assumption that the index of refraction of the substrate is 1. Actually, the substrate shows the index of refraction of around 1.5 in many cases. If this numerical value is taken into account, the calculated value larger than the angle calculated as discussed above can be obtained. However, the energy attenuation occurs at both ends in the longitudinal direction of beam spot, so that influence of the interference is small in this portion and the above calculated value is enough to obtain the effect of attenuating the interference. The above inequality regarding $\phi$ is not applicable to the substrates other than those having the transmission property with respect to the laser light.

Note that the optical systems included in the laser irradiation apparatus used in the present invention are not limited to the structures described in this embodiment.

Also, instead of combining the plural laser beams, a gas laser, typically, an excimer laser can be used to obtain the rectangular or linear laser beam as well as solid laser, typically, a slab laser. In the present invention, these lasers may be used. Additionally, an optical fiber can be used to form the linear or rectangular laser beam exhibiting the uniform energy density.

This embodiment can be implemented in combination with Embodiments 1 to 11.

(Embodiment 13)

The semiconductor device equipped with the TFT formed by the present invention can be applied to various electronic apparatuses. Examples of the electronic apparatuses are portable information terminals (electronic books, mobile computers, cellular phones, or the like), video cameras, digital cameras, personal computers, TV receivers, cellular phones, projection display apparatuses, or the like. Specific examples of these electronic apparatuses are shown in FIGS. 24A to 24H.

Figure 24A:
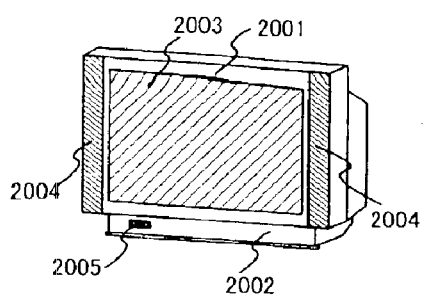
FIGS. 24A to 24H show electronic devices using a semiconductor device according to the present invention.

FIG. 24A shows a display apparatus, which is composed of a case 2001, a support base 2002, a display unit 2003, speaker units 2004, a video input terminal 2005, etc. The display apparatus of the present invention is completed by using the semiconductor device of the present invention to the display unit 2003. Since the light emitting device having the light emitting element is self-luminous, the device does not need back light and can make a thinner display unit than liquid crystal display devices. The display device refers to all display devices for displaying information, including ones for personal computers, for TV broadcasting reception, and for advertisement.

Figure 24B:
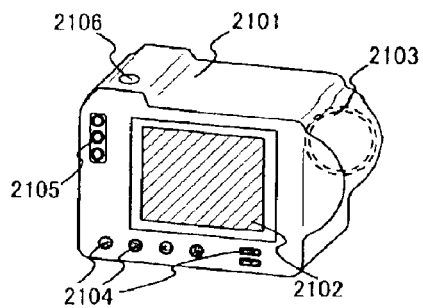

FIG. 24B shows a digital still camera, which is composed of a main body 2101, a display unit 2102, an image receiving unit 2103, operation keys 2104, an external connection port 2105, a shutter 2106, etc. The digital still camera of the present invention is completed by using the semiconductor device of the present invention to the display unit 2102.

Figure 24C:
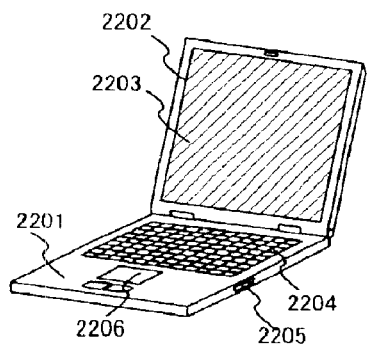

FIG. 24C shows a notebook personal computer, which is composed of a main body 2201, a case 2202, a display unit 2203, a keyboard 2204, an external connection port 2205, a pointing mouse 2206, etc. The notebook personal computer of the present invention is completed by using the semiconductor device of the present invention to the display unit 2203.

Figure 24D:
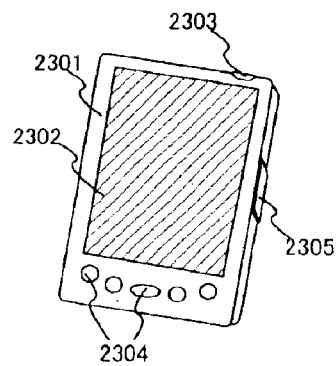

FIG. 24D shows a mobile computer, which is composed of a main body 2301, a display unit 2302, a switch 2303, operation keys 2304, an infrared port 2305, etc. The mobile computer of the present invention is completed by using the semiconductor device of the present invention to the display unit 2302.

Figure 24E:
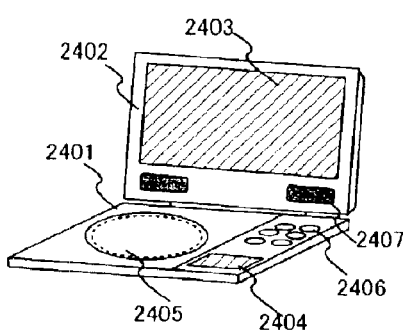

FIG. 24E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. Note that the image reproducing device equipped with a recording medium includes a domestic game machine. The portable image reproducing device of the present invention is completed by using the semiconductor device of the present invention to the display units A 2403 and B 2404.

Figure 24F:
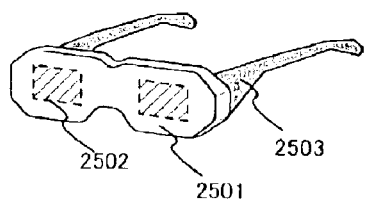

FIG. 24F shows a goggle type display (head mounted display), which is composed of a main body 2501, display units 2502, and arm units 2503. The goggle type display of the present invention is completed by using the semiconductor device of the present invention to the display units 2502.

Figure 24G:
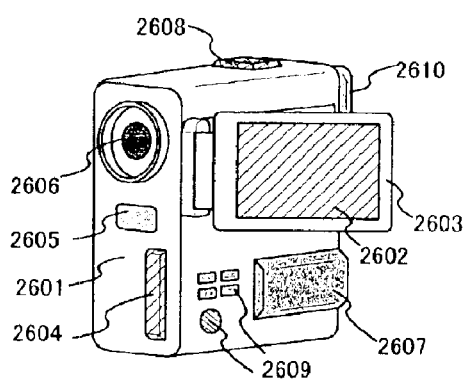

FIG. 24G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The video camera of the present invention is completed by using the semiconductor device of the present invention to the display unit 2602.

Figure 24H:
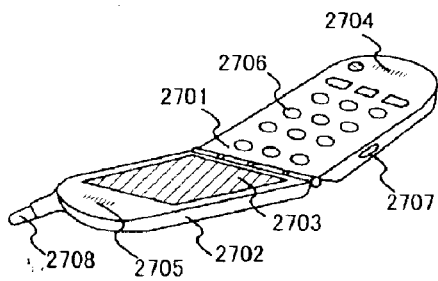

FIG. 24H shows a cellular phone, which is composed of a main body 2701, a case 2702, a display unit 2703, an audio input unit 2704, an audio output unit 2705, operation keys 2706, an external connection port 2707, an antenna 2708, etc. If the display unit 2703 displays white letters on black background, the cellular phone consumes less power. The cellular phone of the present invention is completed by using the semiconductor device of the present invention to the display unit 2703.

As described above, the application range of the present invention is so wide that it is applicable to electric apparatuses of any field. This embodiment can be implemented by combining with any structure of Embodiments 1 to 12.

(Embodiment 14)

In this embodiment, a description will be given of an embodiment of connection between the semiconductor film formed between the projective portions and wirings connected with impurity regions of the semiconductor film.

Figure 25A:
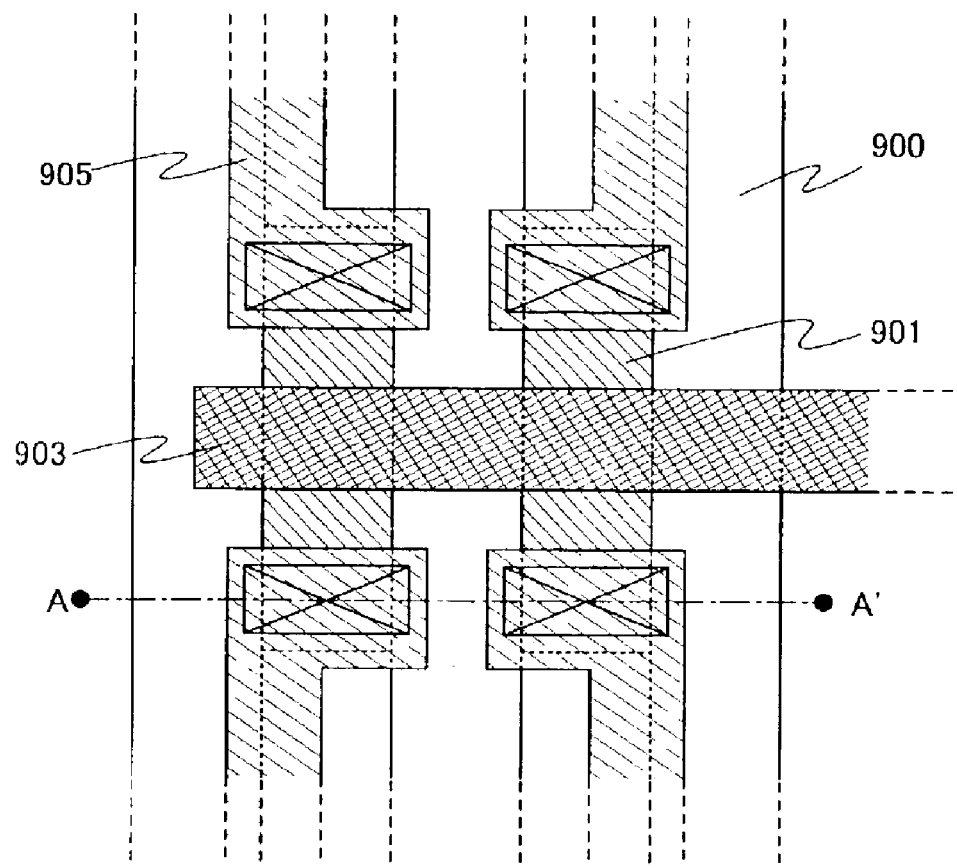
FIGS. 25A and 25B are a top view and a sectional view for showing a plurality of TFTs formed on a base film, respectively.
Figure 25B:
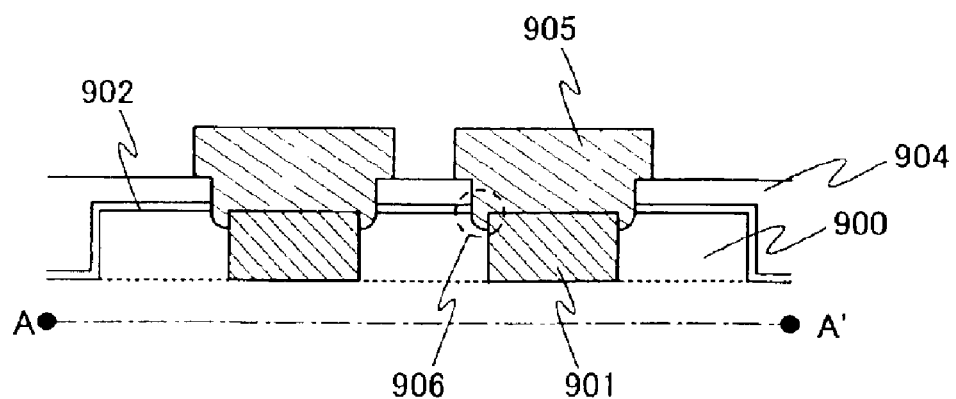
Figure 26:
FIG. 26 shows a TEM image of a semiconductor film formed on a base film having a projective portion after crystallization through laser light irradiation as viewed from above.
Figure 27:
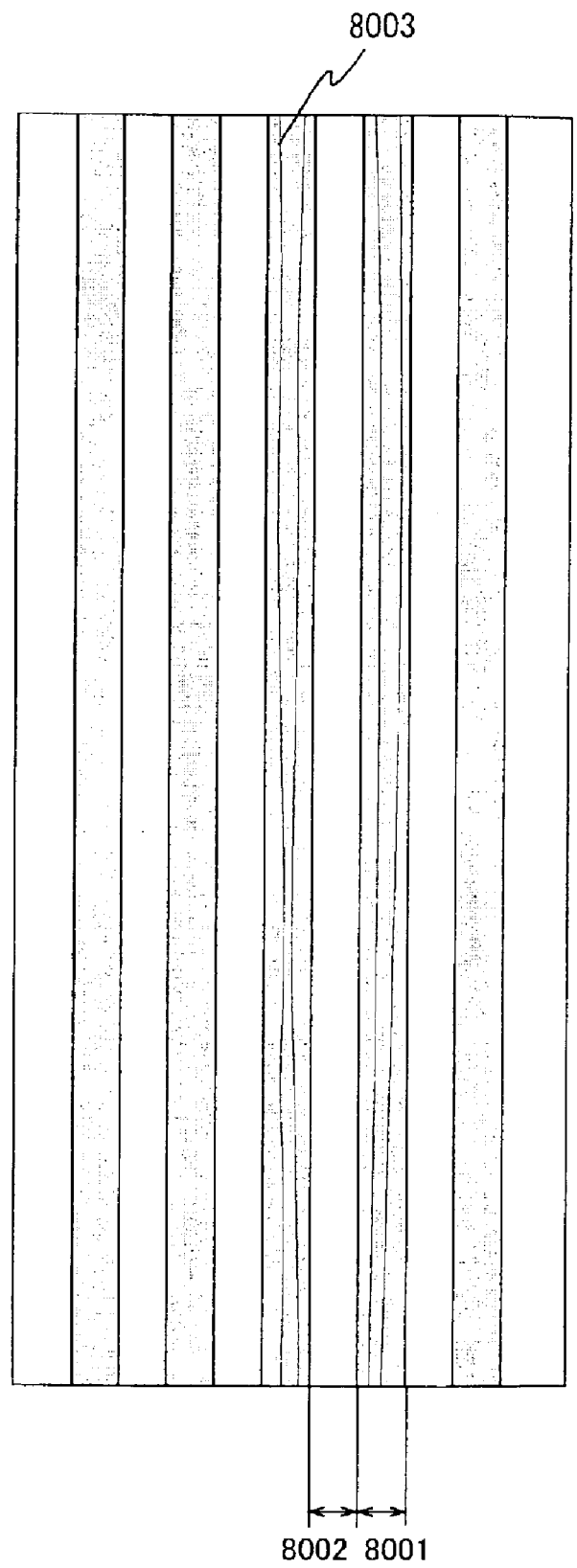
FIG. 27 is a schematic diagram showing the TEM image of FIG. 26.
Figure 28:
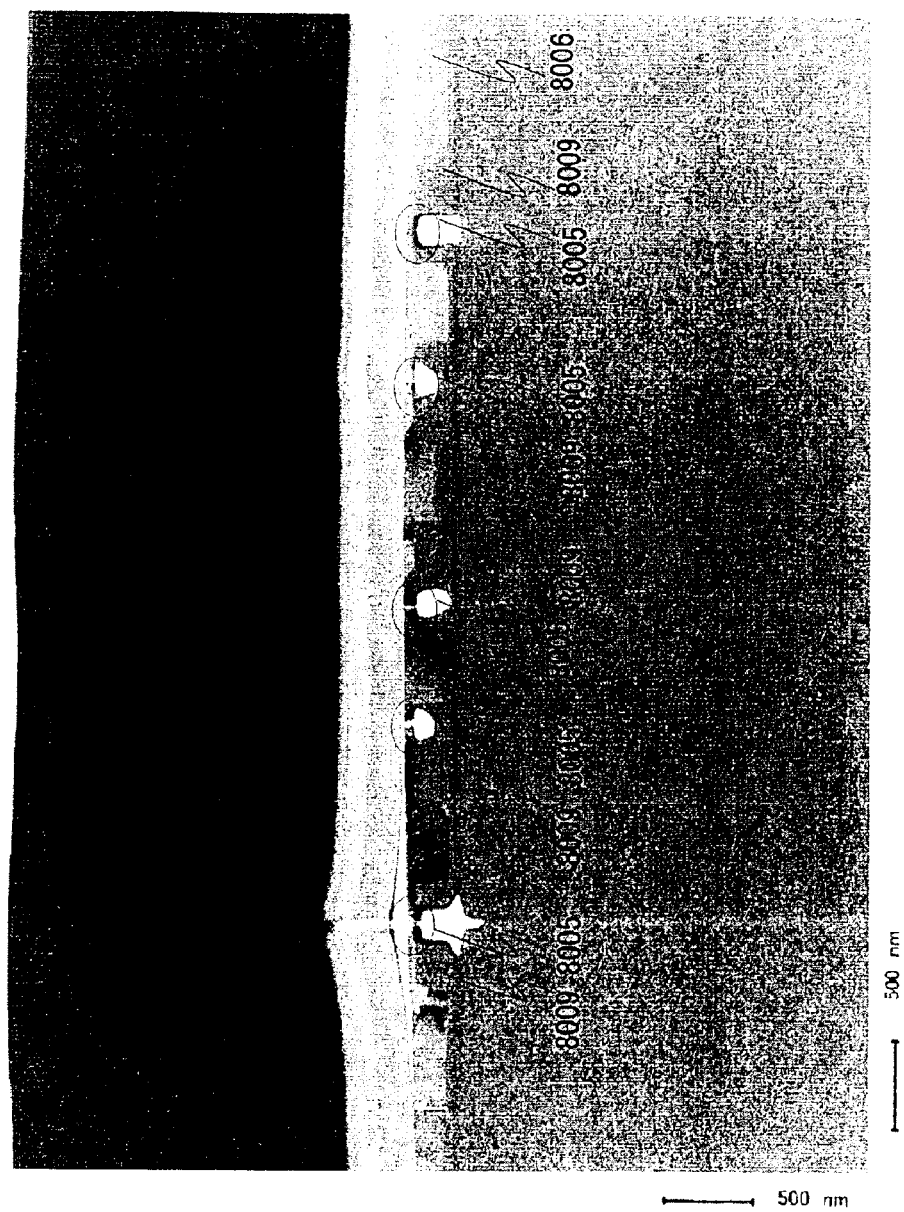
FIG. 28 is a TEM image of a semiconductor film in section, which is formed on a base film having a projective portion after crystallization through laser light irradiation and Secco etching.
Figure 29A:
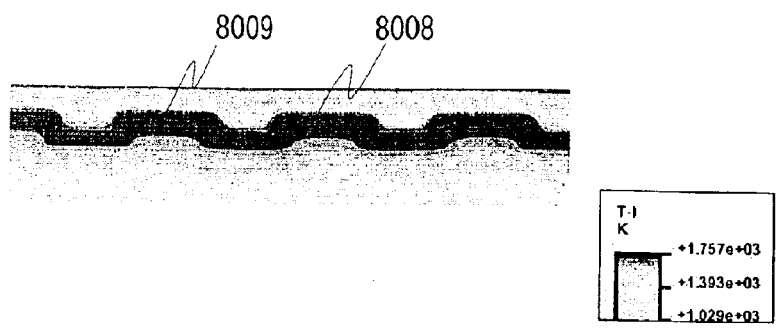
FIGS. 29A to 29F show a temperature distribution change with time when a silicon film formed on a base film having unevennesses is irradiated with a laser light.
Figure 29B:
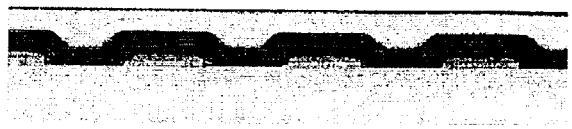
Figure 29C:
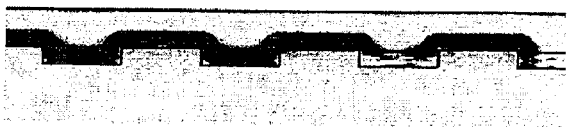
Figure 29D:
Figure 29E:
Figure 29F:
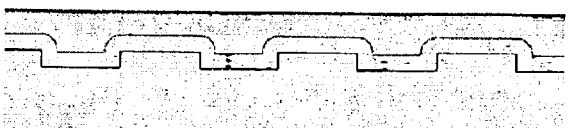
Figure 30:
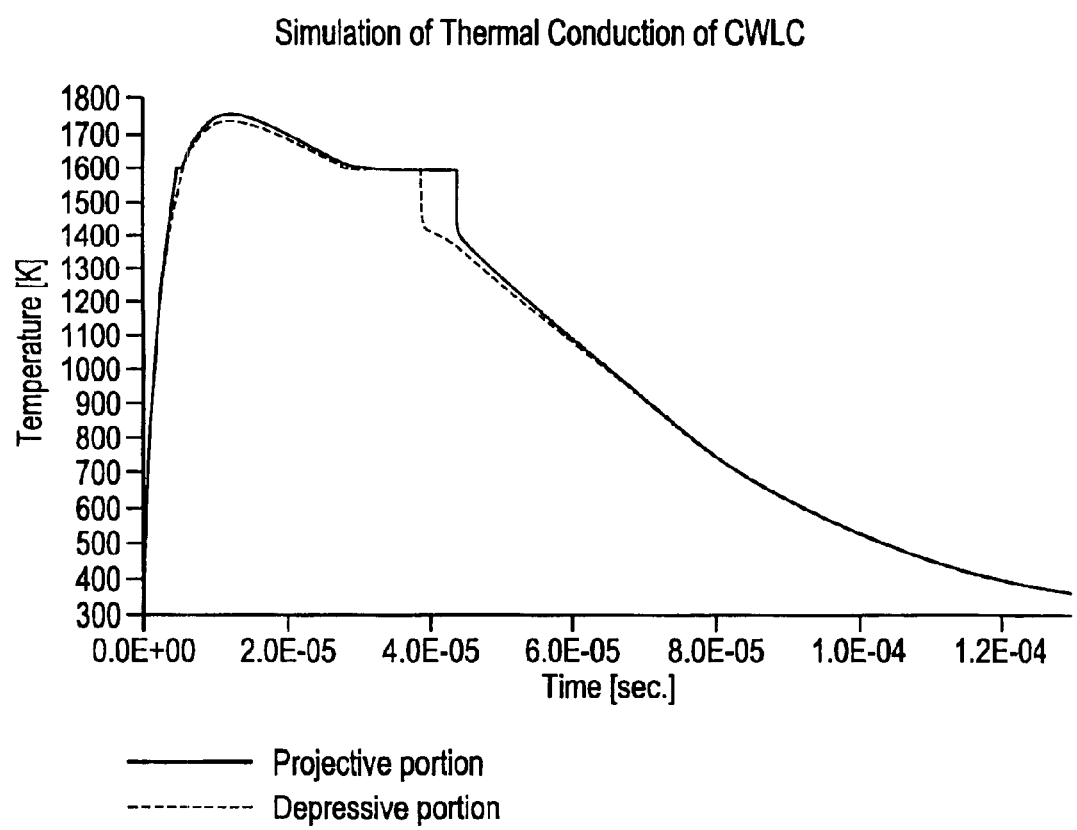
FIG. 30 shows a temperature change with time when a silicon film formed on a base film having unevennesses is irradiated with a laser light.

FIG. 25A is a top view showing a TFT formed on the base film having the projective portions 900. Also, FIG. 25B is a sectional view taken along the line A–A' of FIG. 25A. On a semiconductor film 901 formed between the projective portions 900, a gate insulating film 902 is formed and a gate electrode 903 is formed on the gate insulating film 902. Also, an interlayer insulating film 904 is formed so as to cover the gate electrode 903 and the gate insulating film 902.

Through contact holes formed in the gate insulating film 902 and the interlayer insulating film 904, wirings 905 formed on the interlayer insulating film 904 and the impurity regions of the semiconductor film 901 come into contact with each other.

In this embodiment, when opening the contact holes to the gate insulating film 902 and the interlayer insulating film 904, the contact holes are widely opened to such an extent as to expose a part of the projective portion 900. In the present invention, the portion serving as the source/drain region in the semiconductor film on the depressive portion is in contact with the projective portion. As shown in a region surrounded by dashed line 906, even if the projective portion 900 is partially etched somewhat, differing from the case of forming on the level base film, etching does not proceed up to the base film formed below the semiconductor film. Thus, the breakage of the wirings hardly occurs. If the contact hole can be opened widely to such an extent as to expose a part of the projective portion 900, the design rule is relaxed upon the formation of wirings. Further, this makes it possible to reduce the resistance of the connection portion of the semiconductor film 901 and the wiring 905 as well.

This embodiment can be implemented freely in combination with Embodiments 1 to 13.

(Embodiment 15)

In this embodiment, the semiconductor display device of the present invention for which a flexible substrate is used will be described. The semiconductor display device using the flexible substrate is small in thickness and lightweight. In addition, it can be used for curved display and show window, and the like. Thus, the application thereof is not limited to the portable device and the application range is considerably wide.

In the case of the non-planer substrate, what is aimed at solving relates to a level to which the curvature can be increased. As the curvature of the substrate increases, the stress develops in the insulating film formed on the substrate, which causes the problem in that the semiconductor device formed on the insulating film cannot obtain the desired characteristics. In particular, the larger the insulating film thickness is, the more remarkable the tendency is.

Figure 31:
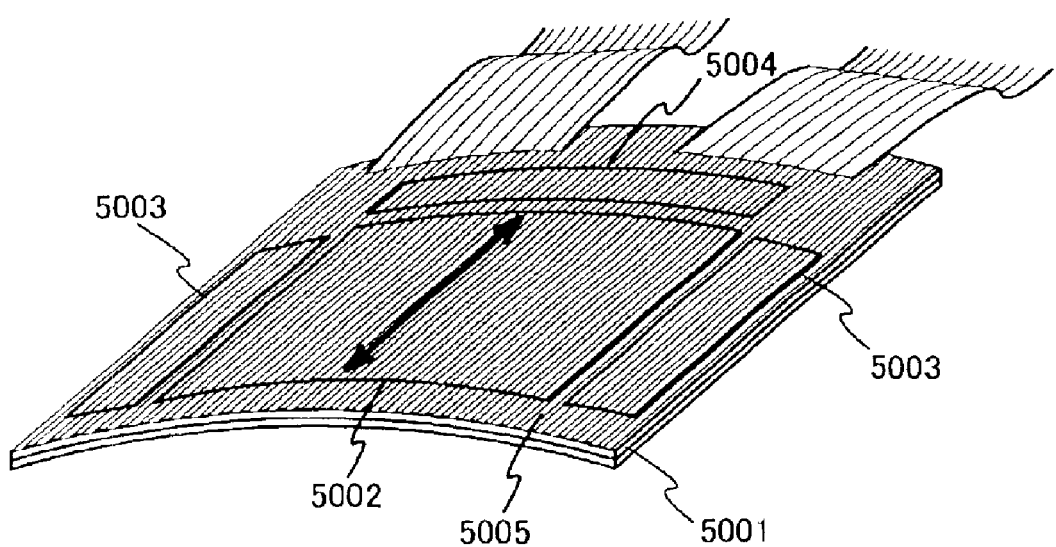
FIG. 31 shows a semiconductor display device formed by using a flexible substrate.

Accordingly, in this embodiment, the longitudinal direction of the projective portion of the base film formed of the insulating film and a bus direction of the substrate are maintained so as to extend in the same direction. FIG. 31 shows a state in which the semiconductor display device formed by using the flexible substrate is curved. On a substrate 5001, a pixel portion 5002, a scanning line drive circuit 5003, and a signal line drive circuit 5004 are formed. The substrate 5001 is made of materials resistant to the processing temperature in the subsequent steps.

The island-like semiconductor film formed on a base film 5005 having the projective portions is used for forming the TFTs. The longitudinal direction of the projective portion of the base film 5005 is identical to the bus direction of the substrate 5001 as indicated by the solid line arrow. In this way, the longitudinal direction of the projective portion of the base film is identical to the bus direction of the substrate and thus, the stress developing in the base film can be dispersed.

This embodiment can be implemented freely in combination with Embodiments 1 to 14.

According to the present invention, the semiconductor film formed above the depressive portion is actively used as the active layer of the TFTs, whereby the grain boundary can be prevented from being formed in the channel formation region of the TFT. Also, it is possible to prevent the grain boundary from causing the significant reduction in the mobility of the TFT, the decrease in the ON current, and the increase in the OFF current. Further, the variation of the characteristics of the TFT can be suppressed.

Also, when the specification of the circuit is changed, only the design for the wirings for connecting the TFTs or logic elements prepared in advance may be changed, whereby at least two masks including the mask for patterning the wirings and the mask for the contact holes of the wirings may only be changed. Accordingly, the cost involved in the design change of the circuit can be suppressed and the circuits of various specifications can be manufactured as well.

Further, according to the present invention, in particular, the portions serving as the source region and drain region of the semiconductor film come into contact with the projective portion and thus, the base film formed below the semiconductor film is not etched and the projective portion is partially etched, whereby the wirings contacting the source/drain region can be prevented from being cut off.

What is claimed is:

1. A manufacturing method for a semiconductor device, comprising:
   forming a base film including a plurality of projective portions, each projective portion having a rectangular shape or a stripe shape;
   crystallizing a semiconductor film by a laser light;
   forming a plurality of island-like semiconductor films by etching the crystallized semiconductor film, each island-like semiconductor film formed between each of the plurality of projective portions;
   forming a plurality of thin film transistors, each thin film transistor comprising one of the plurality of island-like semiconductor films;
   forming a wiring over a layer different from a layer which the plurality of thin film transistors are formed over, and
   forming a logic element by electrically connecting the plurality of thin film transistors through the wiring.
   wherein the plurality of island-like semiconductor films are brought into contact with the projective portions.

2. A manufacturing method for a semiconductor device according to claim 1, wherein the plurality of projective portions each has a height of 0.01 $\mu$m to 3 $\mu$m.

3. A manufacturing method for a semiconductor device according to claim 1, wherein a width between the plurality of projective portions is 0.01 $\mu$m to 2 $\mu$m.

4. A manufacturing method for a semiconductor device according to claim 1, wherein the laser light is outputted by using one or a plurality of kinds of lasers selected from the group consisting of a YAG laser, a $YVO_4$ laser, a YLF laser, a $YAlO_3$ laser, a glass laser, a ruby laser, an alexandrite laser, a Ti:sapphire laser, a $Y_2O_3$ laser, and an $Nd:YVO_4$ laser.

5. A manufacturing method for a semiconductor device according to claim 1, wherein the laser light is outputted by using a slab laser.

6. A manufacturing method for a semiconductor device according to claim 1, wherein the laser light comprises a continuous wave laser light.

7. A manufacturing method for a semiconductor device according to claim 1, wherein the laser light comprises a second harmonic.

8. A manufacturing method for a semiconductor device, comprising:
   forming a base film including a plurality of projective portions, each projective portion having a rectangular shape or a stripe shape;
   forming a semiconductor film over the base film covering the plurality of projective portions;
   crystallizing the semiconductor films by a laser light;
   etching a surface of the crystallized semiconductor film to expose a part of the plurality of projective portions;
   patterning the crystallized semiconductor, film to form a plurality of island-like semiconductor films, each island-like semiconductor film formed between each of the plurality of projective portions;
   forming a plurality of thin film transistors, each thin film transistor comprising one of the plurality of island-like semiconductor films;
   forming a wiring over a layer different from a layer which the plurality of thin film transistors are formed over, and forming a logic element by electrically connecting the plurality of thin film transistors through the wiring.

wherein the plurality of island-like semiconductor films are brought into contact with the projective portions.

9. A manufacturing method for a semiconductor device according to claim 8, wherein the plurality of projective portions each has a height of 0.01 μm to 3 μm.

10. A manufacturing method for a semiconductor device according to claim 8, wherein a width between the plurality of projective portions is 0.01 μm to 2 μm.

11. A manufacturing method for a semiconductor device according to claim 8, wherein the laser light is outputted by using one or a plurality of kinds of lasers selected from the group consisting of a YAG laser, a $YVO_4$ laser, a YLF laser, a $YAlO_3$ laser, a glass laser, a ruby laser, an alexandrite laser, a Ti:sapphire laser, a $Y_2O_3$ laser, and an $Nd:YVO_4$ laser.

12. A manufacturing method for a semiconductor device according to claim 8, wherein the laser light is outputted by using a slab laser.

13. A manufacturing method for a semiconductor device according to claim 8, wherein the laser light comprises a continuous wave laser light.

14. A manufacturing method for a semiconductor device according to claim 8, wherein the laser light comprises a second harmonic.

15. A manufacturing method for a semiconductor device, comprising:

forming a semiconductor film on an insulating film including a plurality of projective portions having a rectangular or stripe shape covering the plurality of projective portions;

irradiating a laser light to the semiconductor film to enhance a crystallinity of the semiconductor film;

etching an upper surface of the semiconductor film with the enhanced crystallinity so as to expose a part of the plurality of projective portions;

patterning the etched semiconductor film to form a plurality of island-like semiconductor films which are separated from one another;

forming a plurality of thin film transistors using each of the plurality of island-like semiconductor films;

forming an interlayer insulating film covering the plurality of thin film transistors; and forming a contact hole in the interlayer insulating film and forming a wiring for electrically connecting the thin film transistors selected from the plurality of thin film transistor, wherein the plurality of island-like semiconductor films are brought into contact with the projective portions.

16. A manufacturing method for a semiconductor device according to claim 15, wherein the plurality of projective portions each has a height of 0.01 μm to 3 μm.

17. A manufacturing method for a semiconductor device according to claim 15, wherein a width between the plurality of projective portions is 0.01 μm to 2 μm.

18. A manufacturing method for a semiconductor device according to claim 15, wherein the laser light is outputted by using one or a plurality of kinds of lasers selected from the group consisting of a YAG laser, a $YVO_4$ laser, a YLF laser, a $YAlO_3$ laser, a glass laser, a ruby laser, an alexandrite laser, a Ti:sapphire laser, a $Y_2O_3$ laser, and an $Nd:YVO_4$ laser.

19. A manufacturing method for a semiconductor device according to claim 15, wherein the laser light is outputted by using a slab laser.

20. A manufacturing method for a semiconductor device according to claim 15, wherein the laser light comprises a continuous wave laser light.

21. A manufacturing method for a semiconductor device according to claim 15, wherein the laser light comprises a second harmonic.

22. A manufacturing method for a semiconductor device, comprising:

forming a semiconductor film on an insulating film including a plurality of projective portions having a rectangular or stripe shape covering the plurality of projective portions;

irradiating a laser light to the semiconductor film to enhance a crystallinity of the semiconductor film;

etching an upper surface of the semiconductor film with the enhanced crystallinity so as to expose a part of the plurality of projective portions;

patterning the etched semiconductor film to form a plurality of island-like semiconductor films which are separated from one another;

removing an entire portion or a part of each of the plurality of projective portions;

forming a plurality of thin film transistors using each of the plurality of island-like semiconductor films;

forming an interlayer insulating film covering the plurality of thin film transistors; and forming a contact hole in the interlayer insulating film and forming a wiring for electrically connecting the thin film transistors selected from the plurality of thin film transistors, wherein the plurality of island-like semiconductor films are brought into contact with the projective portions.

23. A manufacturing method for a semiconductor device according to claim 22, wherein the plurality of projective portions each has a height of 0.01 μm to 3 μm.

24. A manufacturing method for a semiconductor device according to claim 22, wherein a width between the plurality of projective portions is 0.01 μm to 2 μm.

25. A manufacturing method for a semiconductor device according to claim 22, wherein the laser light is outputted by using one or a plurality of kinds of lasers selected from the group consisting of a YAG laser, a $YVO_4$ laser, a YLF laser, a $YAlO_3$ laser, a glass laser, a ruby laser, an alexandrite laser, a Ti:shapphire laser, a $Y_2O_3$ laser, and an $Nd:YVO_4$ laser.

26. A manufacturing method for a semiconductor device according to claim 22, wherein the laser light is outputted by using a slab laser.

27. A manufacturing method for a semiconductor device according to claim 22, wherein the light comprises a continuous wave laser light.

28. A manufacturing method for a semiconductor device according to claim 22, wherein the laser light comprises a second harmonic.

* * * * *